United States Patent
Gray et al.

(10) Patent No.: US 12,007,421 B2
(45) Date of Patent: Jun. 11, 2024

(54) LOAD SENSING CIRCUIT EMPLOYING SINK AND SENSE CONFIGURATION

(71) Applicant: SigmaSense, LLC., Wilmington, DE (US)

(72) Inventors: Patrick Troy Gray, Cedar Park, TX (US); Michael Shawn Gray, Dripping Springs, TX (US); Daniel Keith Van Ostrand, Leander, TX (US); Richard Stuart Seger, Jr., Belton, TX (US); Timothy W. Markison, Mesa, AZ (US)

(73) Assignee: SigmaSense, LLC., Austin, TX (US)

( * ) Notice: Subject to any disclaimer, the term of this patent is extended or adjusted under 35 U.S.C. 154(b) by 0 days.

(21) Appl. No.: 17/718,459

(22) Filed: Apr. 12, 2022

(65) Prior Publication Data

US 2022/0236307 A1    Jul. 28, 2022

Related U.S. Application Data

(63) Continuation-in-part of application No. 17/301,346, filed on Mar. 31, 2021, now Pat. No. 11,513,543,
(Continued)

(51) Int. Cl.
*G01R 19/257* (2006.01)
*H03K 5/24* (2006.01)

(52) U.S. Cl.
CPC ............ *G01R 19/257* (2013.01); *H03K 5/24* (2013.01)

(58) Field of Classification Search
CPC ... G01R 19/257; G05F 1/575; G06F 3/04166; G06F 3/0446; H03K 5/24
(Continued)

(56) References Cited

U.S. PATENT DOCUMENTS

| 5,437,178 A | 8/1995 | Esin et al. |
| 6,218,972 B1 | 4/2001 | Groshong |

(Continued)

FOREIGN PATENT DOCUMENTS

| CN | 103995626 A | 8/2014 |
| CN | 104182105 A | 12/2014 |

(Continued)

OTHER PUBLICATIONS

Baker; How delta-sigma ADCs work, Part 1; Analog Applications Journal; Oct. 1, 2011; 6 pgs.
(Continued)

*Primary Examiner* — Daniel C Puentes
(74) *Attorney, Agent, or Firm* — GARLICK & MARKISON; Harry S. Tyson, Jr.

(57) ABSTRACT

A load sensing circuit includes a load coupled to a load source having a load voltage that causes a load signal to flow through the load. A regulated sink circuit is coupled in series to a sink source and the load, and provides a sink voltage. A comparison circuit a reference signal that establishes a reference value of a second electrical characteristic at a reference input; a sense input is coupled to the load and to the regulated sink circuit. The regulated sink circuit regulates the first electrical characteristic of the load signal, based on a regulation signal, so that a sense value of the second electrical characteristic present at the sense input matches the reference value of the second electrical characteristic. A comparison signal is generated at an output of the comparison circuit, and indicates a difference between the sense value of the second electrical characteristic and the reference value of the second electrical characteristic. A feedback circuit coupled to the comparison output and to the regulated sink circuit, generates the regulation signal based on the comparison signal.

20 Claims, 31 Drawing Sheets

Related U.S. Application Data which is a continuation-in-part of application No. 16/113,379, filed on Aug. 27, 2018, now Pat. No. 11,099,032.

(58) Field of Classification Search
USPC .......................................................... 327/109
See application file for complete search history.

(56) References Cited

U.S. PATENT DOCUMENTS

| | | |
|---|---|---|
| 6,665,013 B1 | 12/2003 | Fossum et al. |
| 7,476,233 B1 | 1/2009 | Wiener et al. |
| 7,528,755 B2 | 5/2009 | Hammerschmidt |
| 8,031,094 B2 | 10/2011 | Hotelling |
| 8,089,289 B1 | 1/2012 | Kremin et al. |
| 8,279,180 B2 | 10/2012 | Hotelling et al. |
| 8,537,110 B2 | 9/2013 | Kruglick |
| 8,547,114 B2 | 10/2013 | Kremin |
| 8,587,535 B2 | 11/2013 | Oda et al. |
| 8,625,726 B2 | 1/2014 | Kuan |
| 8,657,681 B2 | 2/2014 | Kim |
| 8,966,400 B2 | 2/2015 | Yeap |
| 8,982,097 B1 | 3/2015 | Kuzo et al. |
| 9,081,437 B2 | 7/2015 | Oda |
| 9,201,547 B2 | 12/2015 | Elias |
| 10,007,335 B2 | 6/2018 | Lee |
| 2003/0052657 A1 | 3/2003 | Koernle et al. |
| 2005/0235758 A1 | 10/2005 | Kowal et al. |
| 2010/0079088 A1* | 4/2010 | Lipcsei .................. H05B 45/20 315/297 |
| 2011/0063154 A1 | 3/2011 | Hotelling et al. |
| 2011/0298745 A1 | 12/2011 | Souchkov |
| 2012/0278031 A1 | 11/2012 | Oda |
| 2013/0278447 A1 | 10/2013 | Kremin |
| 2013/0307616 A1 | 11/2013 | Berchtold |
| 2014/0210545 A1 | 7/2014 | Leibowitz |
| 2014/0292220 A1* | 10/2014 | Trattler .................. H05B 45/46 323/283 |
| 2014/0327644 A1 | 11/2014 | Mohindra |
| 2015/0091847 A1 | 4/2015 | Chang |
| 2015/0346889 A1 | 12/2015 | Chen |
| 2016/0162002 A1 | 6/2016 | Liang |
| 2016/0188049 A1 | 6/2016 | Yang et al. |
| 2016/0202715 A1 | 7/2016 | Petrov |
| 2017/0331375 A1 | 11/2017 | Chen |
| 2018/0157354 A1 | 6/2018 | Blondin et al. |
| 2018/0275824 A1 | 9/2018 | Li |
| 2019/0102037 A1 | 4/2019 | Krah |

FOREIGN PATENT DOCUMENTS

| | | |
|---|---|---|
| CN | 104536627 A | 4/2015 |
| CN | 107771273 A | 3/2018 |
| EP | 2284637 A1 | 2/2011 |
| JP | 59135685 A | 8/1984 |
| KR | 102015002202 A | 1/2015 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

International Search Authority; International Search Report and Written Opinion; Application No. PCT/US2019/048081; dated Dec. 12, 2019; 8 pgs.

European Patent Office; Extended European Search Report; Application No. 19853507.2; dated Jun. 13, 2023; 7 pgs.

* cited by examiner communication system 10 computing device 12 computing device 14 computing device 18

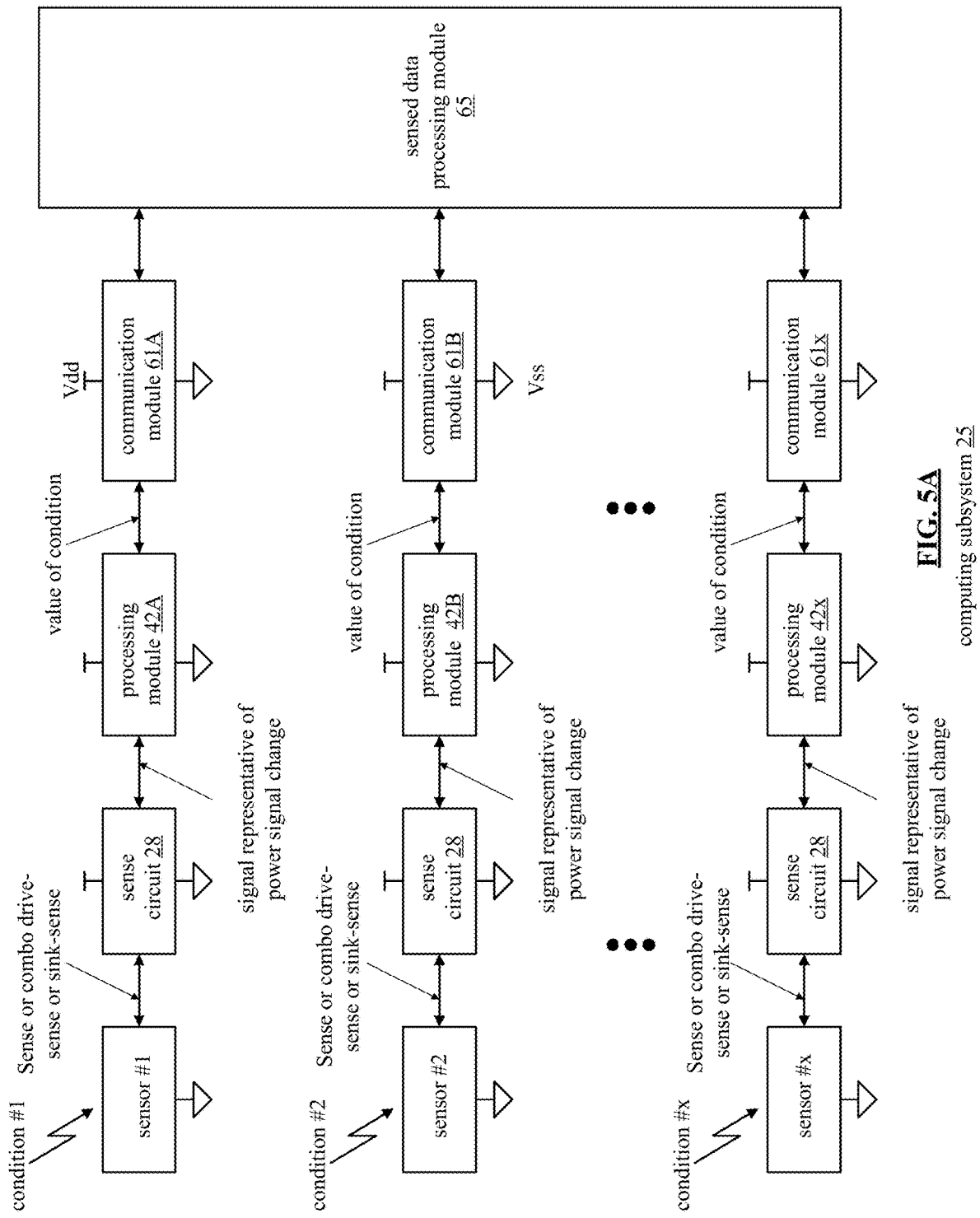

computing subsystem 25

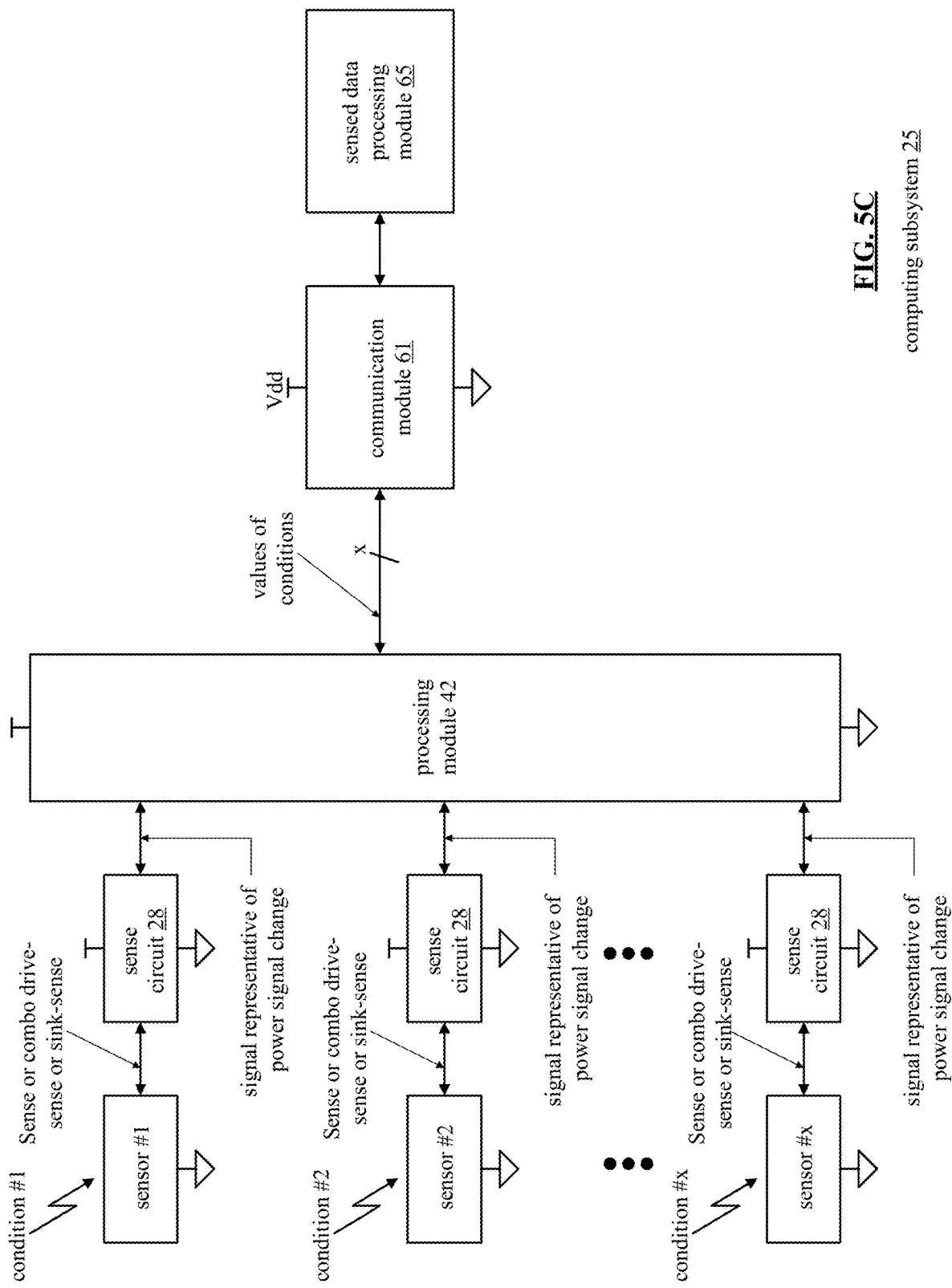

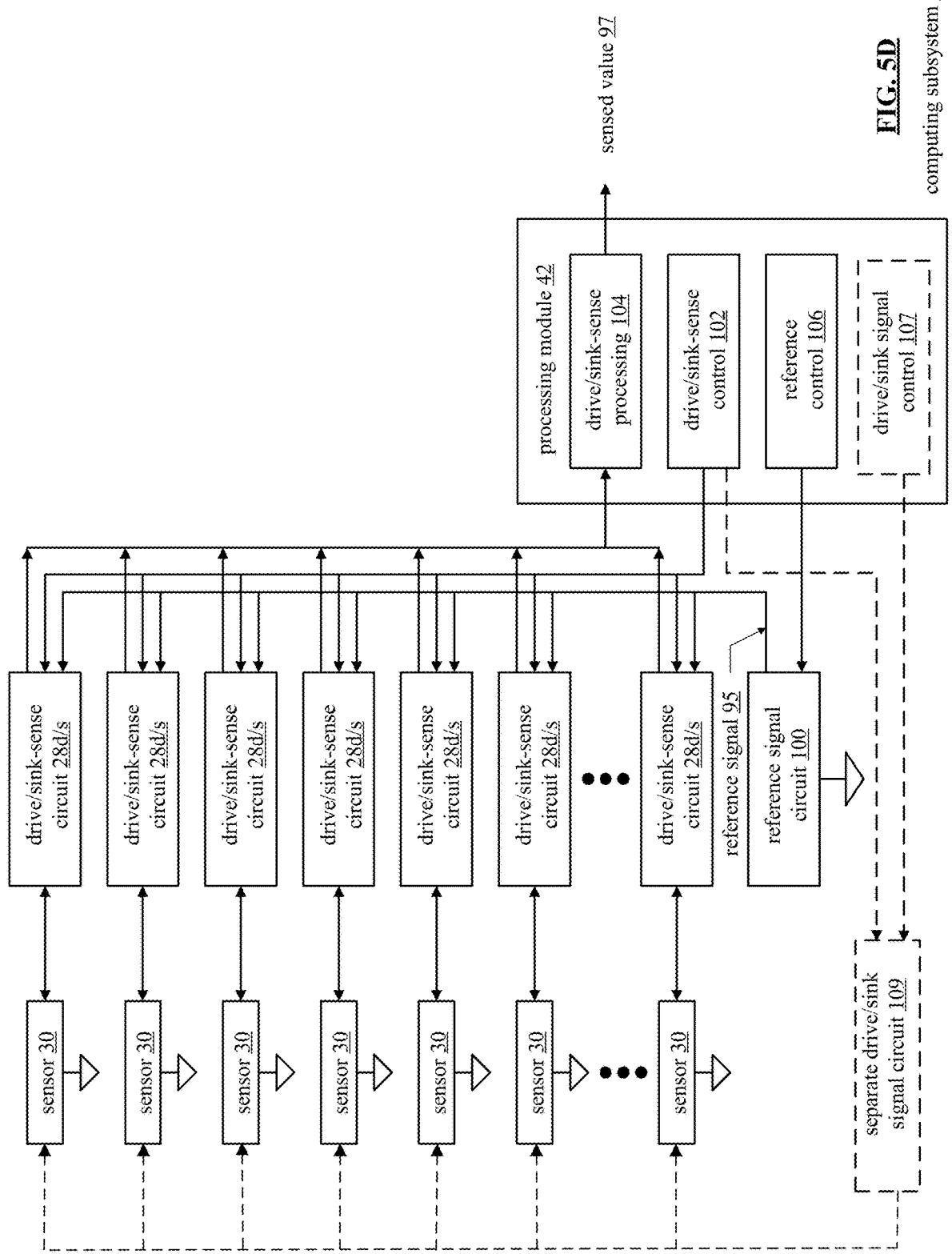

computing subsystem 25 sensor graph power signal graph power signal graph power signal graph power signal graph power signal graph sink & sense circuit 28-s1 sink & sense circuit 28-s2

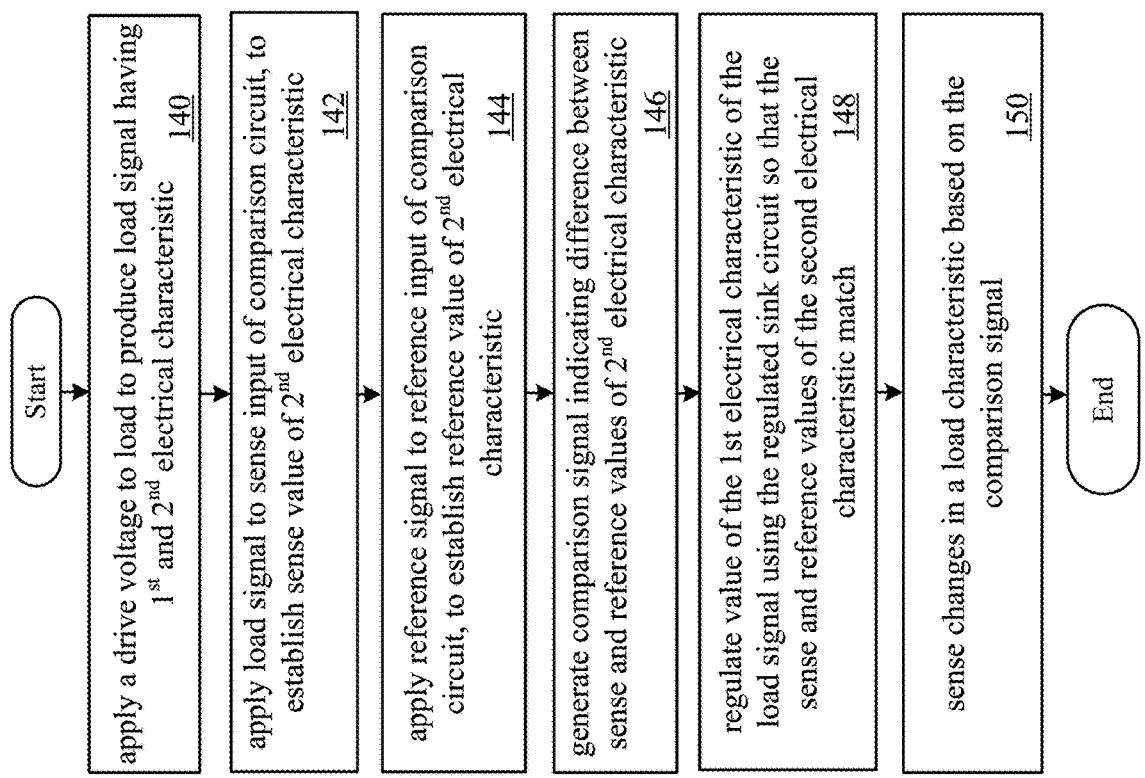

drive & sense 28-d3 sink & sense 28-s3 sink & sense circuit 28-s4 touch sensing circuit 180 touch sensing circuit 180 filter circuit 207 row filter circuit 210 column filter circuit 212 row electrode capacitances 290 column electrode capacitances 280 for grounded touch
self cap goes up with touch
mutual cap does down with touch
(shown with no touch)
for ungrounded touch
self cap doesn't change
mutual cap does down with touch
(shown with no touch)

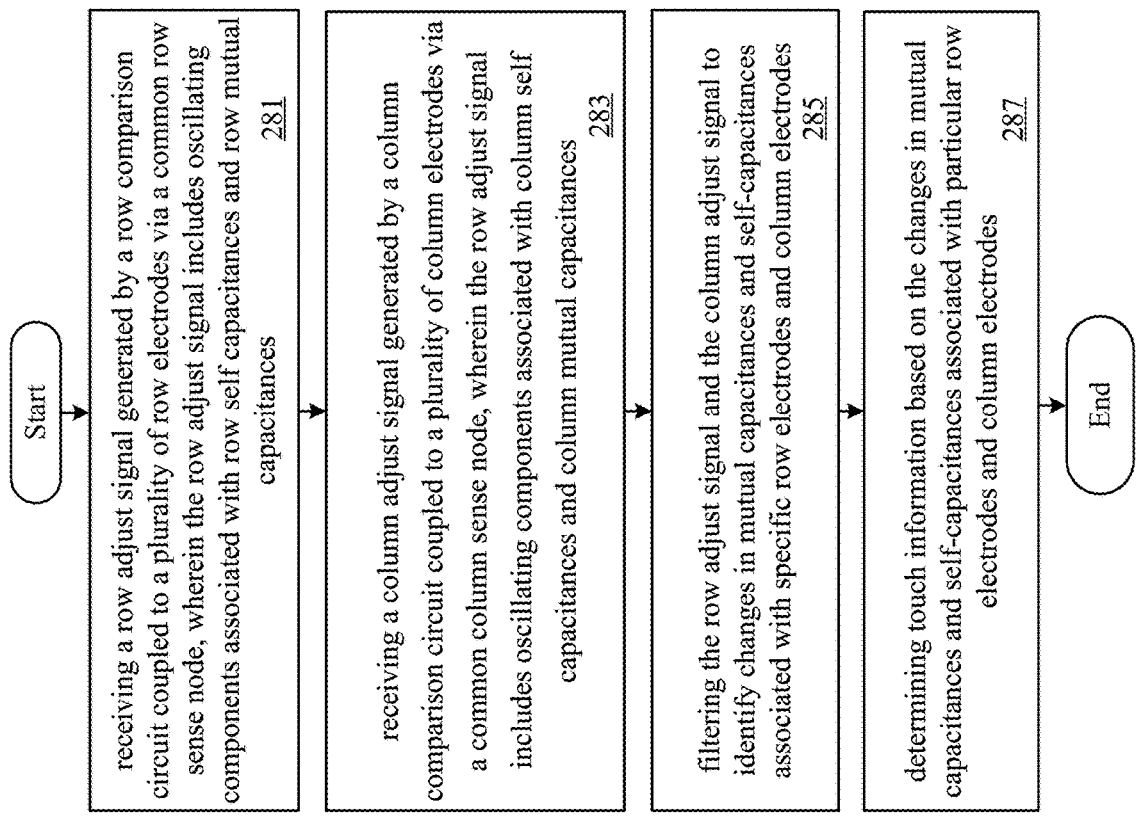

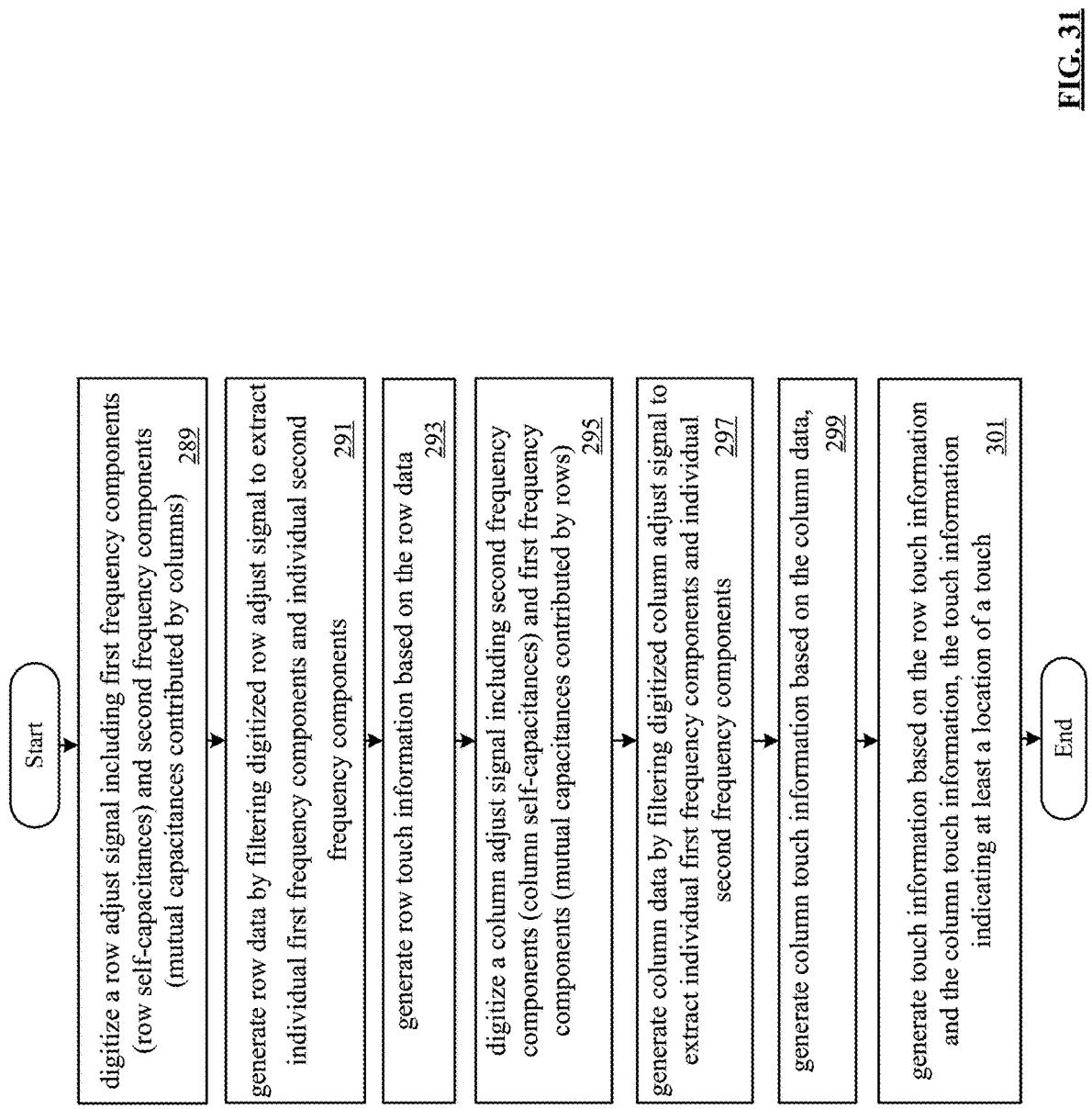

LOAD SENSING CIRCUIT EMPLOYING SINK AND SENSE CONFIGURATION

CROSS-REFERENCE TO RELATED APPLICATIONS

The present U.S. Utility Patent Applications claims priority pursuant to 35 U.S.C. § 120 as a continuation-in-part of U.S. Utility application Ser. No. 17/301,346, entitled "IMPEDANCE DETECT DRIVE-SENSE CIRCUIT," filed Mar. 31, 2021, which is a continuation-in-part of U.S. Utility application Ser. No. 16/113,379, entitled "DRIVE SENSE CIRCUIT WITH DRIVE-SENSE LINE," filed Aug. 27, 2018, now issued as U.S. Pat. No. 11,099,032 on Aug. 24, 2021, all of which are hereby incorporated herein by reference in their entirety and made part of the present U.S. Utility Patent Applications for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touchscreens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a workstation, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5A is a schematic plot diagram of a computing subsystem in accordance with the present invention;

FIG. 5C is a schematic block diagram of another embodiment of a computing subsystem in accordance with the present invention;

FIG. 5D is a schematic block diagram of another embodiment of a computing subsystem in accordance with the present invention;

FIG. 14 is a flow chart illustrating a method of using a sink power signal to sense changes in a load characteristic, in accordance with various embodiments of the present invention;

FIG. 30 is a flow diagram illustrating a method of processing adjust signals to determine touch information, in accordance with various embodiments of the present invention; and FIG. 31 is a flow diagram illustrating a method of processing adjust signals by filtering different frequency components contributed by self and mutual capacitances of row and column electrodes, in accordance with various embodiments of the present invention.

DETAILED DESCRIPTION OF THE INVENTION

Figure 1:
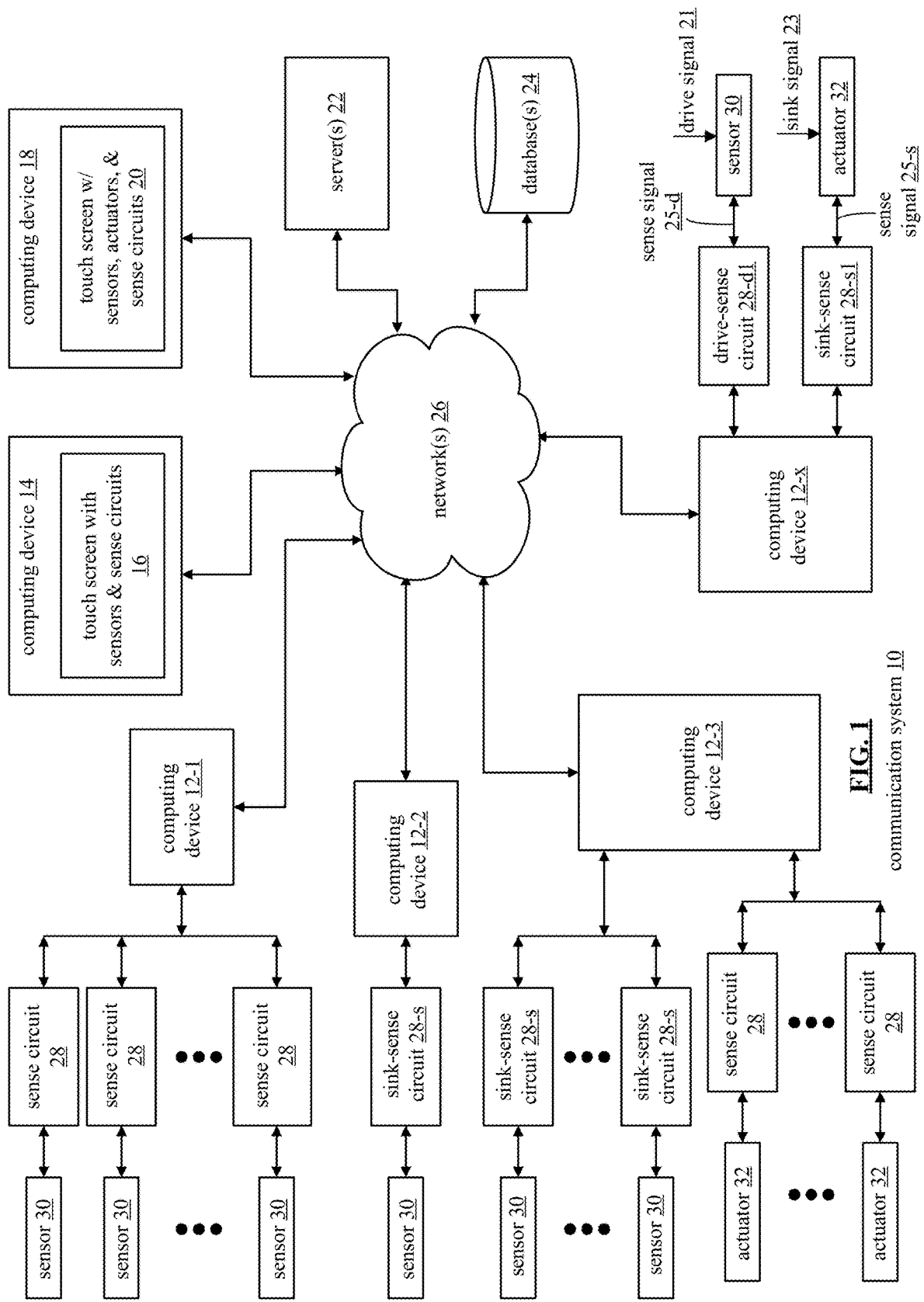
FIG. 1 is a schematic block diagram of an embodiment of a communication system in accordance with the present invention.

FIG. 1 is a schematic block diagram of an embodiment of a communication system 10 that includes a plurality of computing devices 12-10, one or more servers 22, one or more databases 24, one or more networks 26, a plurality of sense circuits 28 (e.g., sink-sense circuits 28-s and drive-sense circuits 28-d), a plurality of sensors 30, and a plurality of actuators 32. Unless otherwise specified or required by context, a "sense circuit" includes any of the various embodiments of sink-sense circuits or drive-sense circuits disclosed herein, or their equivalents. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, electric field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an electric signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of sense circuits 28, which, in turn, communicate with a plurality of sensors 30. The sensors 30 and/or the sense circuits 28 are within the computing device 12-1 and/or external to it. For example, the sensors 30 may be external to the computing device 12-1 and the sense circuits are within the computing device 12-1. As another example, both the sensors 30 and the sense circuits 28 are external to the computing device 12-1. When sense circuits 28 are external to computing device 12-1, they are coupled to the computing device 12-1 via wired and/or wireless communication links as will be discussed in greater detail with reference to one or more of FIGS. 5A-5C.

The computing device 12-1 communicates with the sense circuits 28 to; (a) turn them on, (b) obtain data from the sensors (individually and/or collectively), (c) instruct the drive-sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The sense circuits 28 have their own power source (e.g., battery, power supply, etc.) and are proximally located to their respective sensors 30. At desired time intervals (milliseconds, seconds, minutes, hours, etc.), the sense circuits 28 provide regulated source signal or a power signal (e.g., a sink signal or a drive signal) to the sensors 30. An electrical characteristic of the sensor 30 affects the regulated source signal or power signal, which is reflective of the condition (e.g., the flow rate and/or the pressure) sensor 30 is sensing.

The sense circuits 28 detect the effects on the regulated source signal or power signals as a result of the electrical characteristics of the sensors. The sense circuits 28 then generate signals representative of change to the regulated source signal or power signal based on the detected effects on the power signals. The changes to the regulated source signals or power signals are representative of the conditions being sensed by the sensors 30.

The sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a sink-sense circuit 28-$s$, which is, in turn, coupled to a sensor 30. The sensor 30 and/or the sink-sense circuit 28-$s$ may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the sink-sense circuit 28-$s$ provides the regulated source signal (e.g., a regulated sink signal) or power signal to the sensor 30 and detects an effect to the regulated source signal or power signal based on an electrical characteristic of the sensor. The sink-sense circuit generates a representative signal of the effect and sends it to the computing device 12-2.

In another example of operation, computing device 12-3 is coupled to a plurality of sink-sense circuits 28 that are coupled to a plurality of sensors 30 and is coupled to a plurality of sense circuits 28 that are coupled to a plurality of actuators 32. The general functionality of the sink-sense circuits 28-$s$ coupled to the sensors 30 is in accordance with the above description.

Since an actuator 32 is essentially an inverse of a sensor, in that an actuator converts an electrical signal into a physical condition while a sensor converts a physical condition into an electrical signal, the sense circuits 28 can be used to power actuators 32. Thus, in this example, the computing device 12-3 provides actuation signals to the sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-$x$ is coupled to a drive-sense circuit 28-$d1$ that is coupled to a sensor 30, and to a sink-sense circuit 28-$s1$ that is coupled to an actuator 32. In this example, a drive signal 21 is applied to a first node of sensor 30, while changes in the sensor characteristics are sensed using a sense signal 25-$d$ at a second node of sensor 30. This is in contrast to some other embodiments disclosed herein, which use the same sensor node to provide a drive signal and to sense changes in electrical characteristics of sensor 30. Continuing with the same example, computing device 12-$x$ is also coupled to a sink-sense circuit 28-$s1$ that is coupled to an actuator 32. In this example, a sink signal 23 is applied to a first node of sensor 30, while changes in the actuator characteristics are sensed using a sense signal 25-$s$ at a second node of actuator 32. This is in contrast to some other embodiments, disclosed herein, which use the same actuator node to provide a sink signal and to sense changes in characteristics of actuator 32. In this example, the sensor 30 and the actuator 32 are for use by the computing device 12-$x$. For example, the sensor 30 may be a piezoelectric microphone and the actuator 32 may be a piezoelectric speaker.

Figure 2:
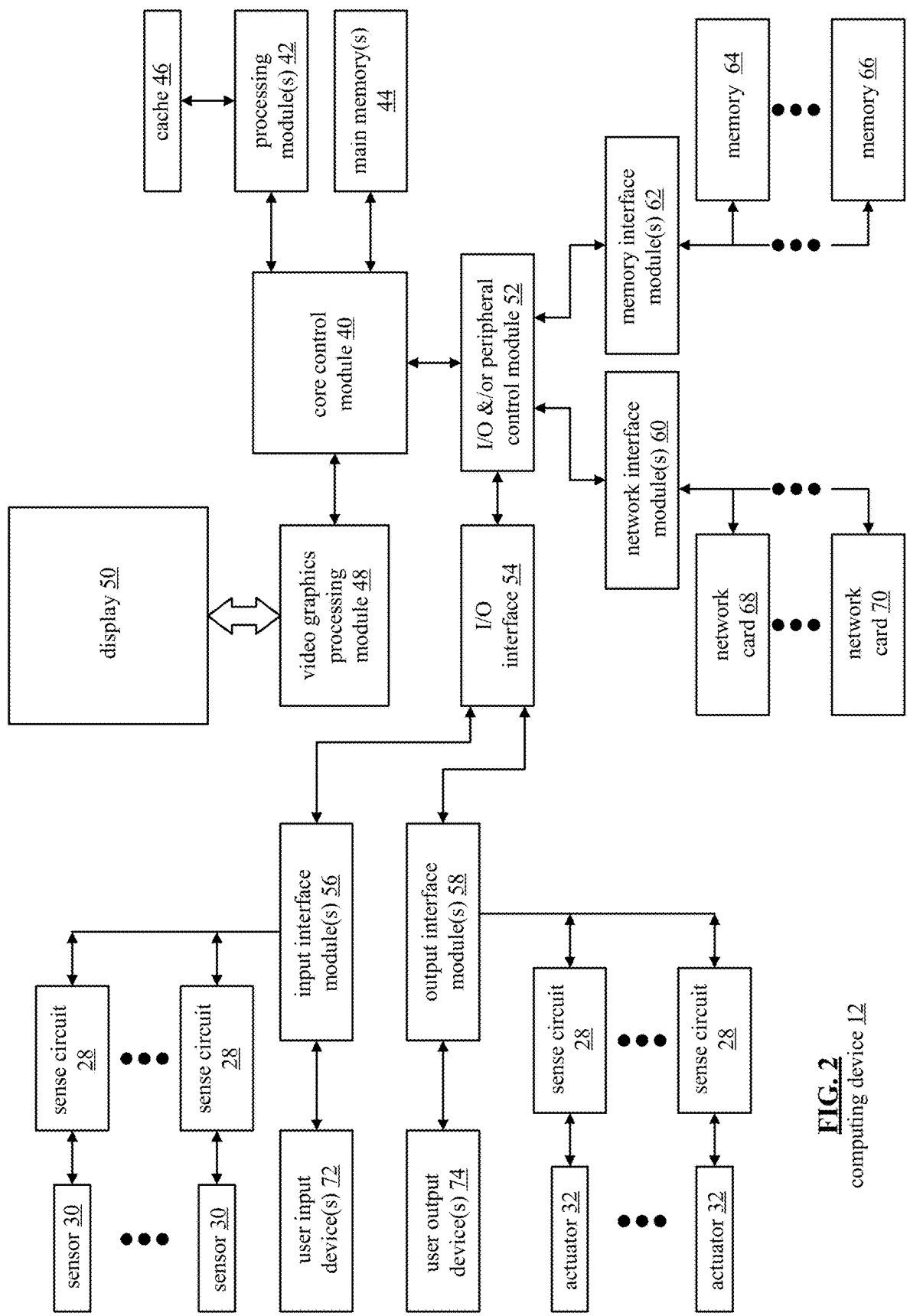
FIG. 2 is a schematic block diagram of an embodiment of a computing device in accordance with the present invention.

FIG. 2 is a schematic block diagram of an embodiment of a computing device 12 (e.g., any one of 12-1 through 12-$x$). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to sense circuits 28, which are coupled to the input interface module 56 (e.g., USB port). Alternatively, one or more of the sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
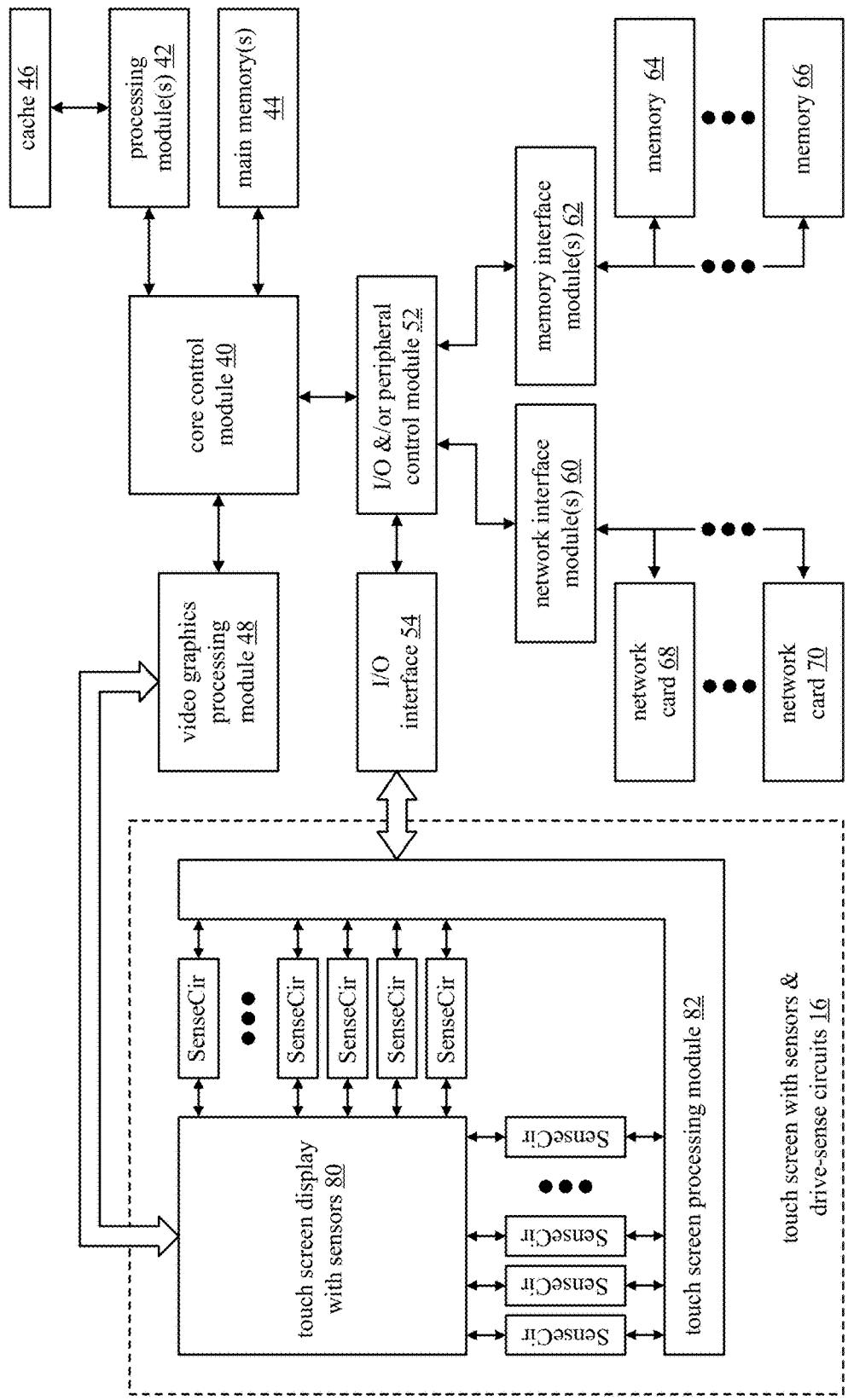
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of sense circuits (e.g., sink-sense circuits or drive-sense circuits), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The sense circuits coupled to the affected sensors detect the change and provide a representation of the change to the touch screen processing module 82, which may be a separate processing module or integrated into the processing module 42.

The touch screen processing module 82 processes the representative signals from the sense circuits to determine the location of the touch(es). This information is inputted to the processing module 42 for processing as an input. For example, a touch represents a selection of a button on screen, a scroll function, a zoom in-out function, etc.

Figure 4:
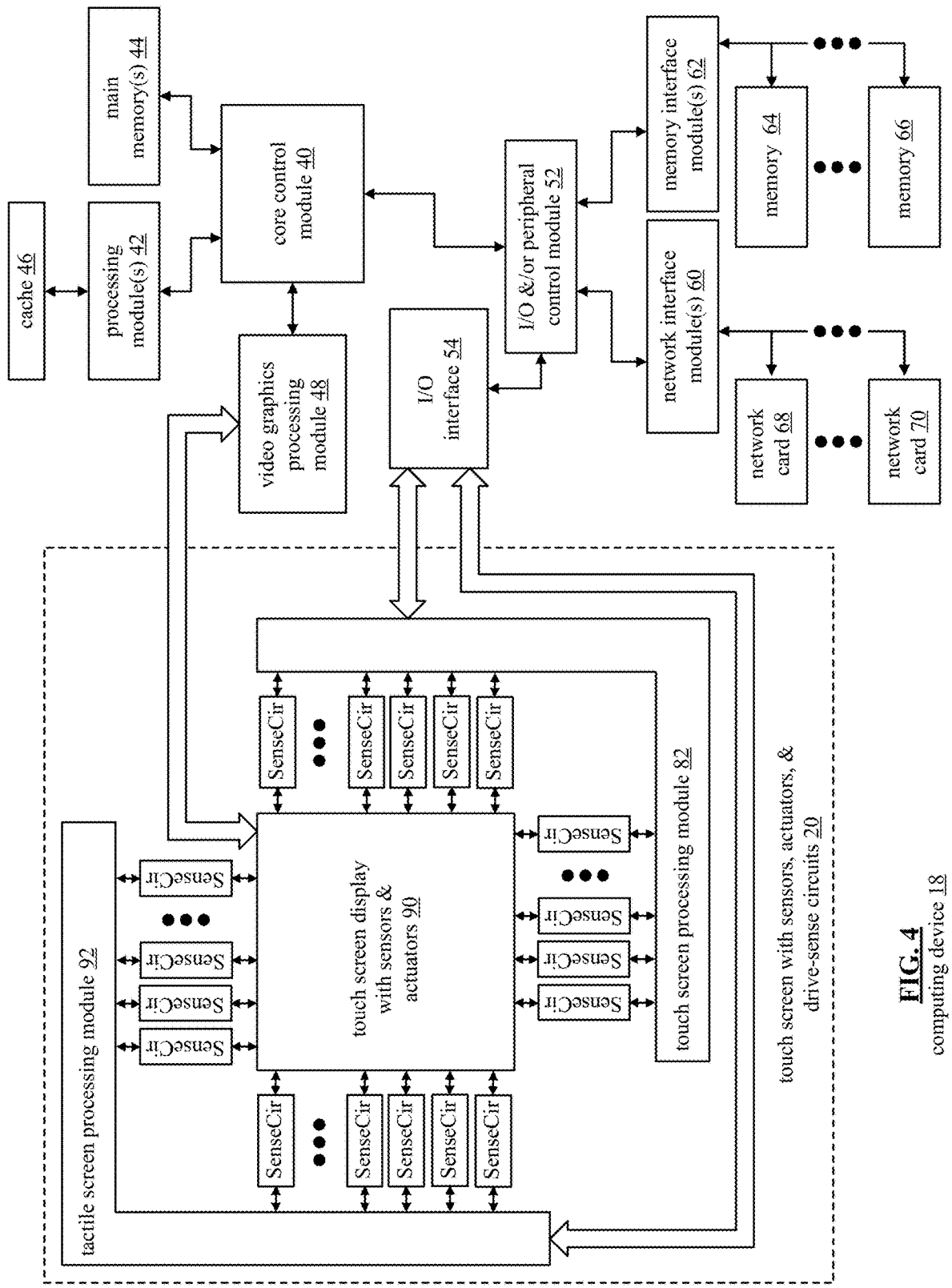
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and or touch screen display with sensors and actuators 90, a plurality of sensors 30, a plurality of actuators 32, a plurality of sense circuits, a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate sense circuits via the tactile screen processing module 92, which may be a stand-alone processing module or integrated into processing module 42. The sense circuits convert the tactile data into drive-actuate signals and provide them to the appropriate actuators to create the desired tactile feel on the screen 20.

FIG. 5A is a schematic plot diagram of a computing subsystem 25 that includes a sensed data processing module 65, a plurality of communication modules 61A-x, a plurality of processing modules 42A-x, a plurality of sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A-x reside.

A sense circuit 28 (or multiple sense circuits), a processing module (e.g., 41A), and a communication module (e.g., 61A) are within a common computing device. Each grouping of a sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding sense circuit 28. The processing module 42 A may generate the control signal, receive it from the sensed data processing module 65, or receive an indication from the sensed data processing module 65 to generate the control signal. The control signal enables the sense circuit 28 to provide one or more signals to its corresponding sensor. The signal can be a combined drive-sense signal, a combined sink-sense signal, separate drive and sense signals, or separate sink and sense signals. For the combined drive-sense and sink-sense signals, a single signal applied to one sensor node is used to both cause and sense the changes in the electrical characteristic of the sensor. When separate drive and sense signals, or separate sink and sense signals, are used a first signal, which is the drive or sink signal, is applied at one node of the load, and used to produce the change in the electrical characteristic, which is sensed by a second signal, the sense signal at a second node of the load. The control signal may further include a reference signal having one or more frequency components to facilitate creation of the drive signal and/or interpreting a sensed signal received from the sensor.

Based on the control signal, the sense circuit 28 provides the drive or sink signal to its corresponding sensor (e.g., 1) on a drive/sink & sense line in embodiments employing a combined drive/sink-sense configuration. Separate drive/sink lines and sense lines are used for embodiments using separate drive/sink-sense configurations. While receiving the drive/sink signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The sense circuit 28 detects the effect on the drive (or sink) signal, for example via combined or separate drive (or sink) and sense lines and processes the effect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding sense circuit 28. The actuation control signal enables the sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a sense circuit provides a drive/sink signal to the actuator and a sense signal provides the same drive/sink signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation, and another subsystem monitors the city's sewage treatment plants.

In various embodiments, regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions. Embodiments using separate drive/sink and sense lines can be advantageous for driving lower impedance sensors, motors, actuators, or the like, by allowing lower-power comparator circuits to be used in the sensing circuits. Combined and/or separate drive/sink-sense circuits are, however, not limited to implementations that achieve the above listed advantages, because the enumerated lists of advantages are not exhaustive, but are merely provided as examples.

Figure 5B:
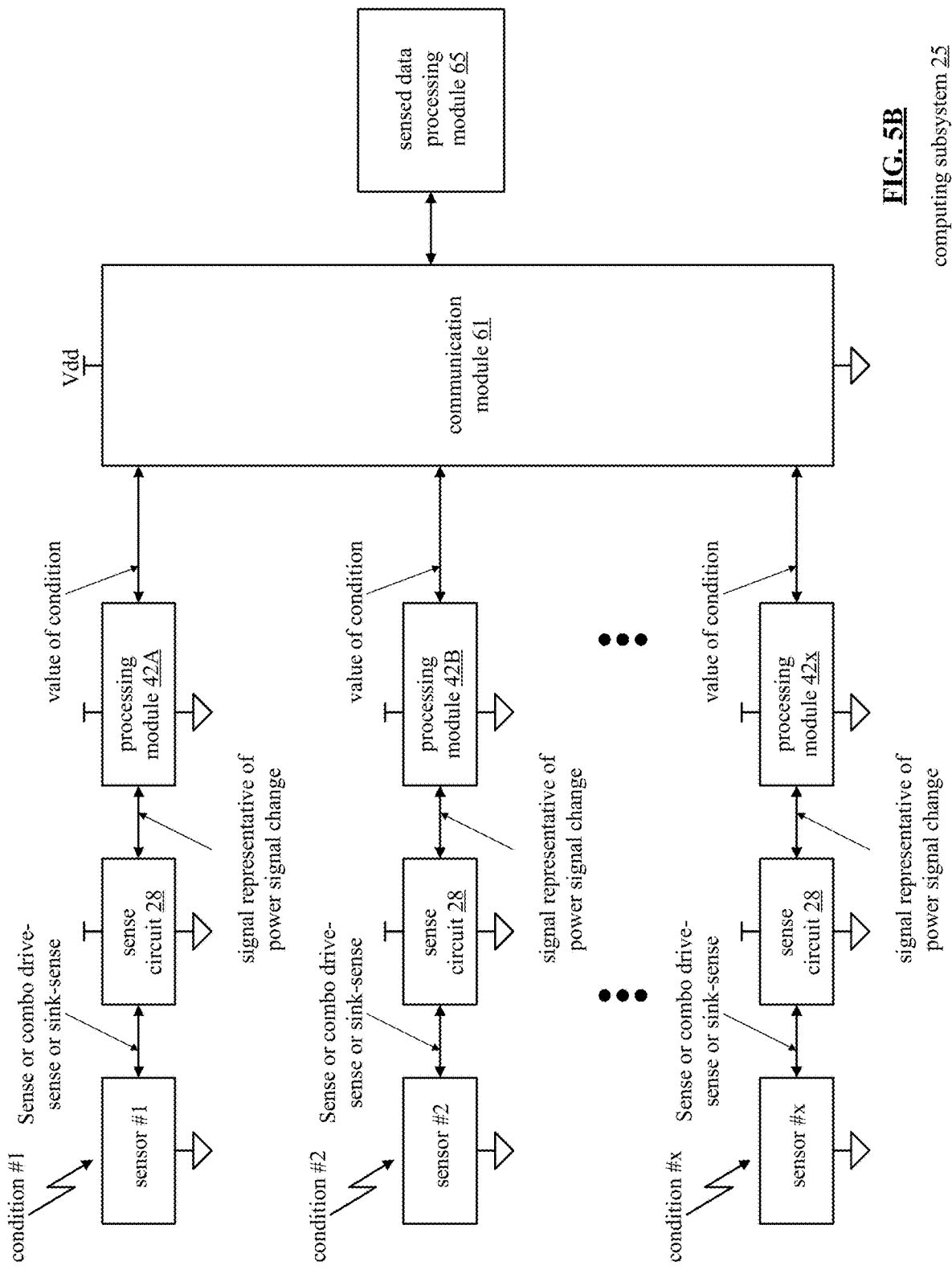
FIG. 5B is a schematic block diagram of another embodiment of a computing subsystem in accordance with the present invention.

FIG. 5B is a schematic block diagram of another embodiment of a computing subsystem 25 that includes a sensed data processing module 65, a communication module 61, a plurality of processing modules 42A-x, a plurality of sense circuits 28, and a plurality of sensors 1-x, which may be sensors 30 of FIG. 1. The sensed data processing module 65 is one or more processing modules within one or more servers 22 and/or one or more processing modules in one or more computing devices that are different than the computing device, devices, in which processing modules 42A-x reside.

In an embodiment, the sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the sense circuits 28, and the sensors 1-x are as discussed with reference to FIG. 5A.

FIG. 5C is a schematic block diagram of another embodiment of a computing subsystem 25 that includes a sensed data processing module 65, a communication module 61, a processing module 42, a plurality of sense circuits 28, and a plurality of sensors 1-x, which may be sensors 30 of FIG. 1. The sensed data processing module 65 is one or more processing modules within one or more servers 22 and/or one or more processing modules in one or more computing devices that are different than the computing device in which the processing module 42 resides.

In an embodiment, the sense circuits 28, the processing module, and the communication module are within a common computing device. The functionality and operation of the sensed data processing module 65, the communication module 61, the processing module 42, the sense circuits 28, and the sensors 1-x are as discussed with reference to FIG. 5A.

FIG. 5D is a schematic block diagram of another embodiment of a computing subsystem 25 that includes a processing module 42, a reference signal circuit 100, a plurality of drive/sink-sense circuits 28d/s, and a plurality of sensors 30. In implementations employing a combined drive/sink and sense configuration, e.g., a configuration that senses variations in sensor characteristics using a single drive/sink signal, the drive/sink-sense circuits 28d/s provide a combined drive/sink and sense function. As illustrated by the dotted lines, embodiments of computing subsystem 25 that use separate sense and drive/sink signals can include a separate drive/sink signal circuit 109 that provides a drive or sink signal, to a first node of the sensors 30, while drive/sink-sense circuits 28d/s function to sense the changes in sensors 30 caused by the drive/sink signal provided by drive/sink signal circuit 109.

The processing module 42 includes a drive/sink-sense processing block 104, a drive/sink-sense control block 102, and a reference control block 106. Each block 102-107 of the processing module 42 may be implemented via separate modules of the processing module, may be a combination of software and hardware within the processing module, and/or may be field programmable modules within the processing module 42.

In an example of operation, the drive/sink-sense control block 104 generates one or more control signals to activate one or more of the drive/sink-sense circuits 28d/s. For example, the drive/sink-sense control block 102 generates a control signal that enables of the drive/sink-sense circuits 28d/s for a given period of time (e.g., 1 second, 1 minute, etc.). As another example, the drive/sink-sense control block 102 generates control signals to sequentially enable the drive/sink-sense circuits 28d/s. As yet another example, the drive/sink-sense control block 102 generates a series of control signals to periodically enable the drive/sink-sense circuits 28d/s (e.g., enabled once every second, every minute, every hour, etc.).

As illustrated by the dotted lines, processing module 42 may optionally include drive/sink signal control 107, for use with separate drive/sink signal circuit 109. In some such embodiments, drive/sink signal control 107 generates control signals that control one or more separate drive/sink signal circuits to generate the drive/sink signals applied to first nodes of sensors 30, while drive/sink-sense circuits 28d/s sense the changes in characteristics of sensors 30 at second nodes of those same sensors.

Continuing with the example of operation, the reference control block 106 generates a reference control signal that it provides to the reference signal circuit 100. The reference signal circuit 100 generates, in accordance with the control signal, one or more reference signals for the drive/sink-sense circuits 28d/s. For example, the control signal is an enable signal, which, in response, the reference signal circuit 100 generates a pre-programmed reference signal that it provides to the drive/sink-sense circuits 28d/s. In another example, the reference signal circuit 100 generates a unique reference signal for each of the drive/sink-sense circuits 28d/s. In yet another example, the reference signal circuit 100 generates a first unique reference signal for each of the drive/sink-sense circuits 28d/s in a first group and generates a second unique reference signal for each of the drive/sink-sense circuits 28d/s in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive/sink-sense circuits 28d/s. When a drive/sink-sense circuit 28d/s, or a separate drive/sink signal circuit, is enabled via a control signal from the drive/sink-sense control block 102, it provides a drive signal to its corresponding sensor 30. As a result of a physical condition, an electrical characteristic of the sensor is changed, which affects the drive signal. Based on the detected effect on the drive signal and the reference signal, the drive/sink-sense circuit 28*d/s* generates a signal representative of the effect on the drive signal.

The drive/sink-sense circuit 28*d/s* provides the signal representative of the effect on the drive signal to the drive/sink-sense processing block 104. The drive/sink-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
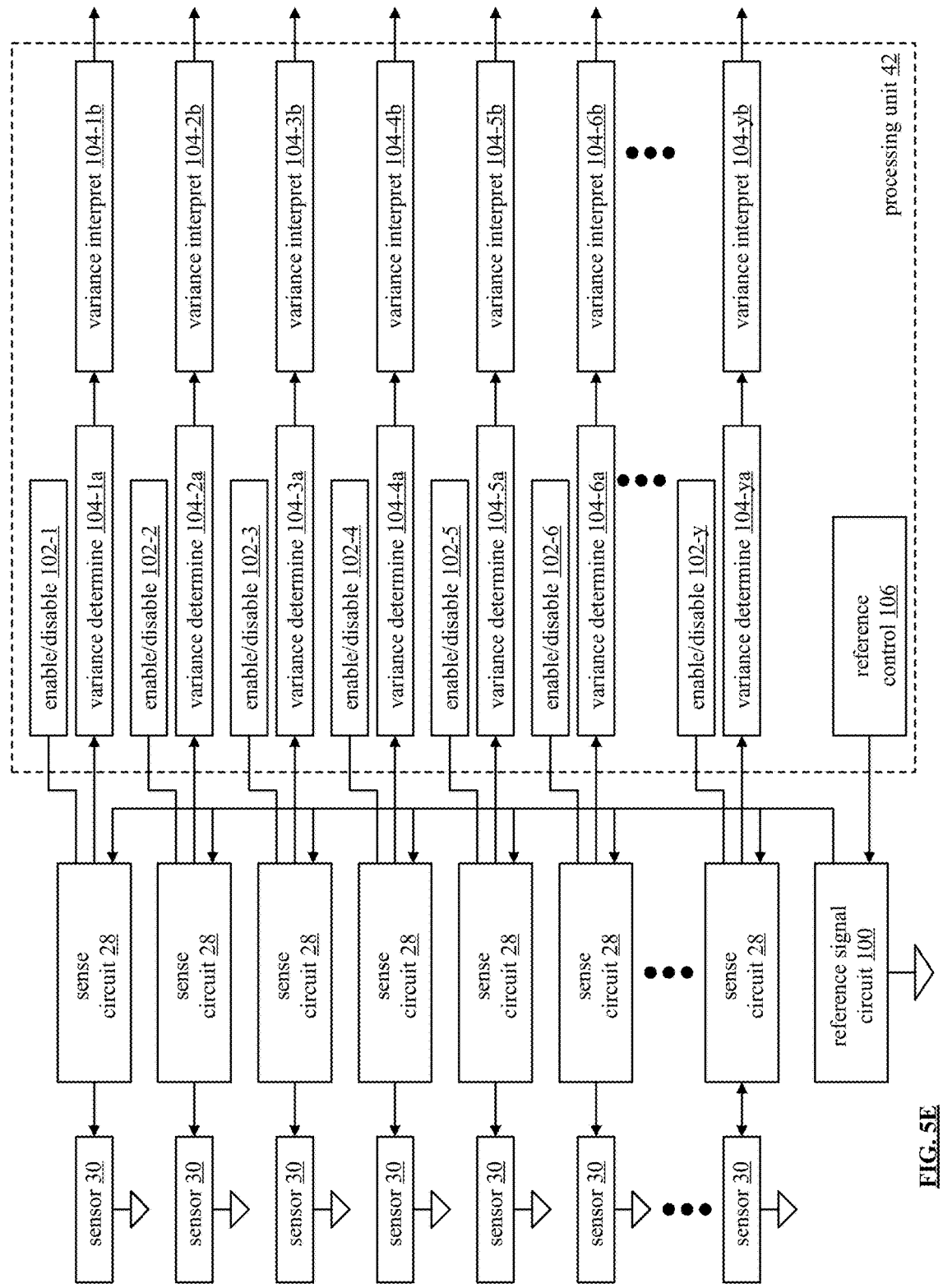
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of sense circuits 28, and a plurality of sensors 30. This embodiment is similar to the embodiment of FIG. 5D with the functionality of the drive/sink-sense processing block 104, a drive/sink-sense control block 102, and a reference control block 106 shown in greater detail. For instance, the drive/sink-sense control block 102 includes individual enable/disable blocks 102-1 through 102-*y*. An enable/disable block functions to enable or disable a corresponding sense circuit in a manner as discussed above with reference to FIG. 5D. A sense circuit can include implementations employing a combined drive-sense signal, a combined sink-sense signal, separate drive and sense signals, or separate sink and sense signals.

The drive/sink-sense processing block 104 includes variance determining modules 104-1*a* through *y* and variance interpreting modules 104-2*a* through *y*. For example, variance determining module 104-1*a* receives, from the corresponding sense circuit 28, a signal representative of a physical condition sensed by a sensor. The variance determining module 104-1*a* functions to determine a difference from the signal representing the sensed physical condition with a signal representing a known, or reference, physical condition. The variance interpreting module 104-1*b* interprets the difference to determine a specific value for the sensed physical condition.

As a specific example, the variance determining module 104-1*a* receives a digital signal of 1001 0110 (150 in decimal) that is representative of a sensed physical condition (e.g., temperature) sensed by a sensor from the corresponding sense circuit 28. With 8-bits, there are $2^8$ (256) possible signals representing the sensed physical condition. Assume that the units for temperature is Celsius and a digital value of 0100 0000 (64 in decimal) represents the known value for 25 degrees Celsius. The variance determining module 104-*b*1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-*b*1 then determines the sensed value based on the difference and the known value. In this example, the sensed value equals 25+86*(100/256)=25+33.6=58.6 degrees Celsius.

Figure 6B:
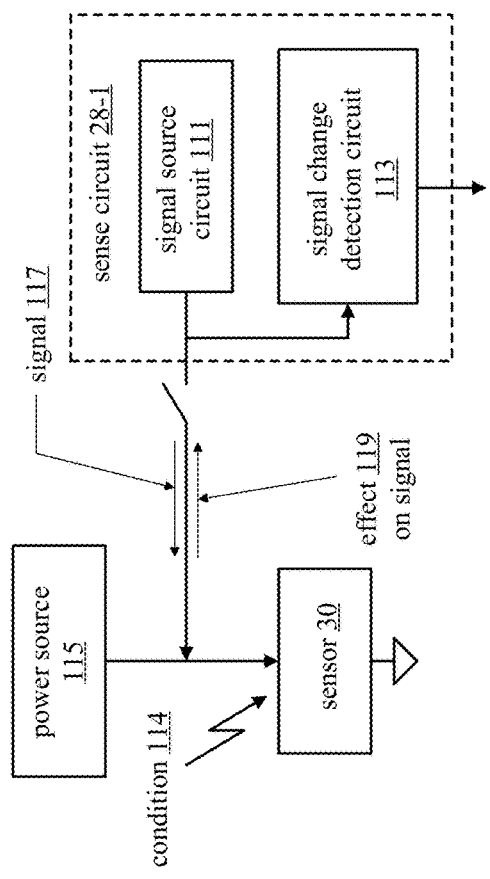
FIG. 6B is a schematic block diagram of another embodiment of a sense circuit implemented using a single line for both drive (or sink) and sense functions in accordance with the present invention.
Figure 6A:
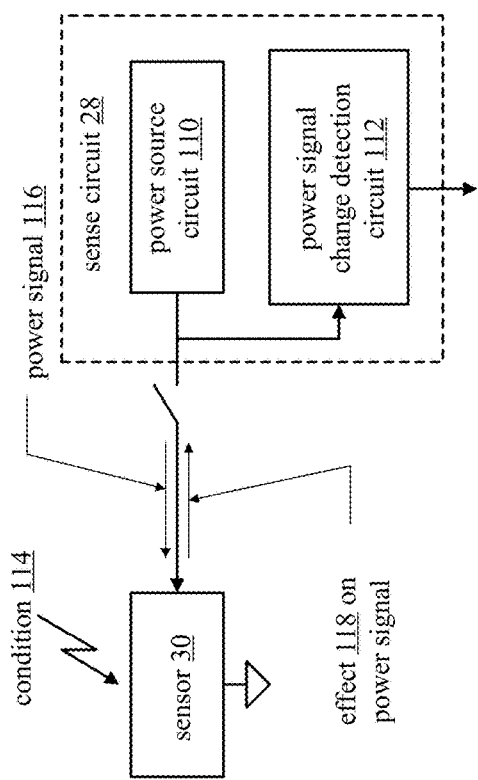
FIG. 6A is a schematic block diagram of an embodiment of a sense circuit implemented using a single line for both drive (or sink) and sense functions, in accordance with the present invention.

FIG. 6A is a schematic block diagram of a sense circuit 28 coupled to a sensor 30. The sense circuit 28 is implemented using a single line for both drive (or sink) and sense functions, and includes a power source circuit 110 and a power signal change detection circuit 112. The sensor 30 includes one or more transducers that have electrical characteristics (e.g., capacitance, inductance, impedance, current, voltage, etc.) that vary based on varying physical conditions (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component. The power signal 116 generated by power source circuit 110 can be implemented as a sink signal or as a drive signal.

When receiving the power signal 116, and when exposed to a condition 114, an electrical characteristic of the sensor affects the power signal 116. When the power signal change detection circuit 112 is enabled, it detects the effect 118 on the power signal 116 as a result of the electrical characteristic of the sensor. For example, the power signal is a 1.5 voltage signal, and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

Figure 7:
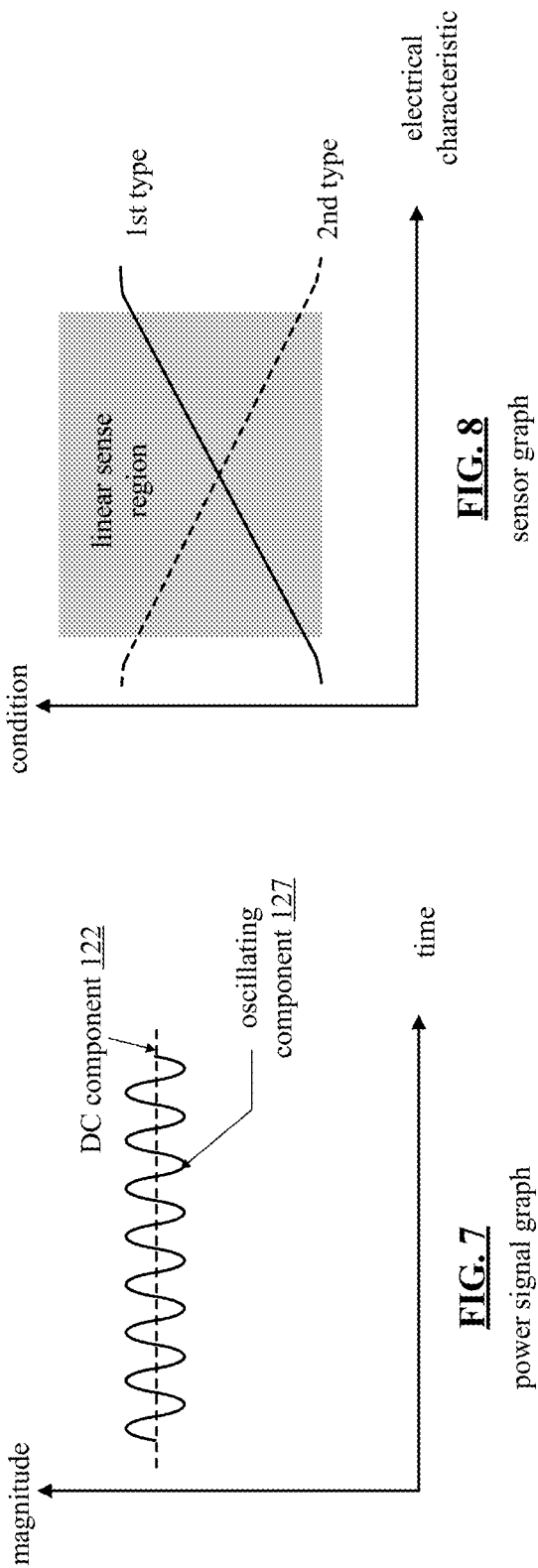
FIG. 7 is an example of a power signal graph in accordance with the present invention.

The power signal 116 includes a DC component 122 and/or an oscillating component 127 as shown in FIG. 7. The oscillating component 127 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power source circuit 110 varies frequency of the oscillating component 127 of the power signal 116 so that it can be tuned to the impedance of the sensor and/or to be off set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power source circuit 110 varies magnitude of the DC component 122 and/or the oscillating component 127 to improve resolution of sensing and/or to adjust power consumption of sensing. In addition, the power source circuit 110 generates the power signal 116 such that the magnitude of the oscillating component 127 is less than magnitude of the DC component 122.

FIG. 6B is a schematic block diagram of a sense circuit 28 coupled to a sensor 30. The sense circuit 28-1 is implemented using a single line for both drive (or sink) and sense functions, and includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a signal 117 that is voltage-based, a current supply circuit (e.g., a current source circuit, a current mirror circuit, etc.) to produce a signal 117 that is current-based, or a circuit that provides a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects the signal. When the signal change detection circuit 113 is enabled, it detects an effect 119 of the sensor 30 on the signal as a result of the electrical characteristic of the sensor.

Figure 6C:
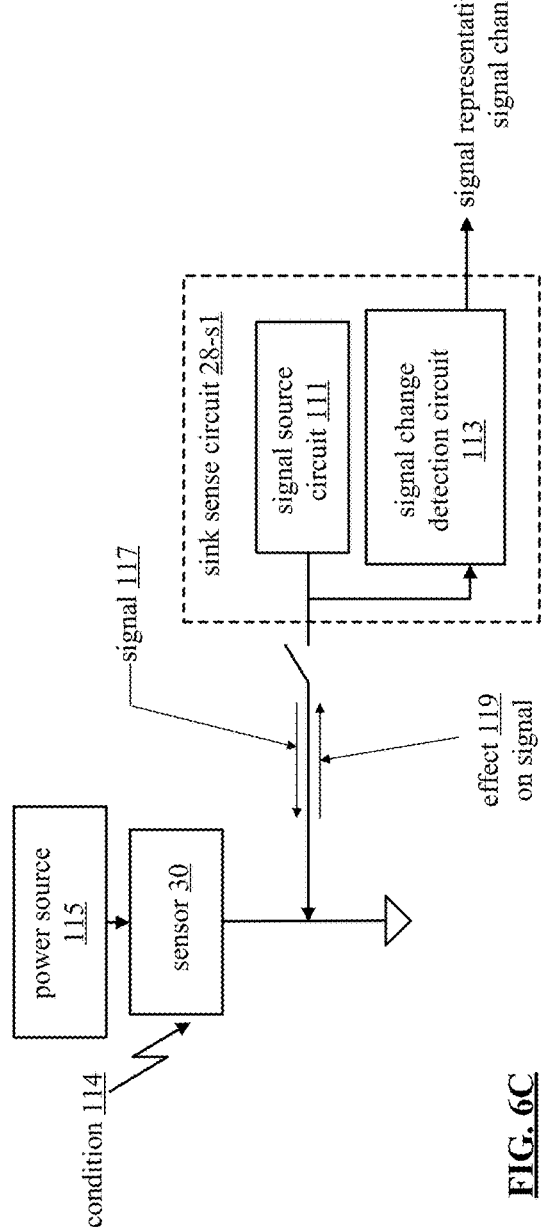
FIG. 6C is a schematic block diagram of another embodiment of a sense circuit implemented using a single line for sink and sense functions in accordance with the present invention.

FIG. 6C is a schematic block diagram of a sense circuit 28-$s1$ coupled to a sensor 30. The sense circuit 28-$s1$ is implemented using a single line for both sink and sense functions, and includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30. In this embodiment, the signal source is a sink signal source.

The signal source circuit 111 may be a voltage supply circuit (e.g., a battery, a linear regulator, an unregulated DC-to-DC converter, etc.) to produce a signal 117 that is voltage-based, a current supply circuit (e.g., a current source circuit, a current mirror circuit, etc.) to produce a signal 117 that is current-based, or a circuit that provides a desired power level to the sensor and substantially matches impedance of the sensor. The signal source circuit 111 can generate the signal 117 to include a DC (direct current) component and/or an oscillating component.

When receiving the combined signal (e.g., signal 117 and power from the power source) and when exposed to a condition 114, an electrical characteristic of the sensor affects the signal. When the signal change detection circuit 113 is enabled, it detects an effect 119 of the sensor 30 on the signal as a result of the electrical characteristic of the sensor.

Figure 8:
FIG. 8 is an example of a sensor graph in accordance with the present invention.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

Figure 9:
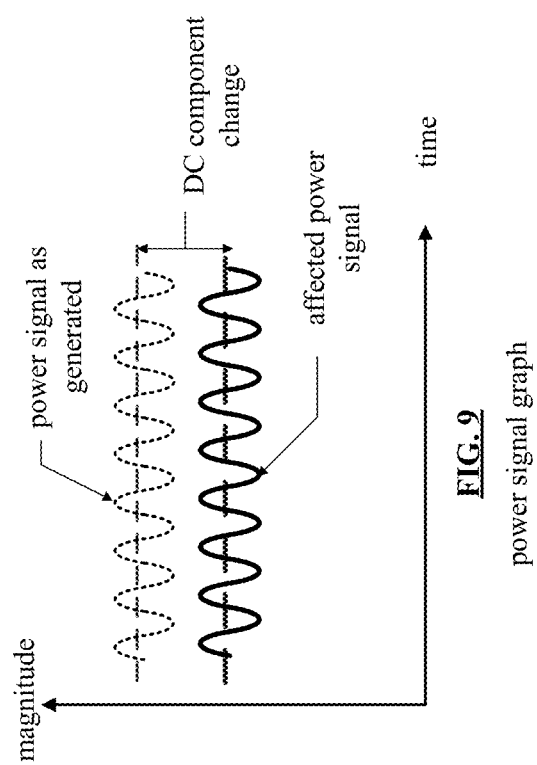
FIG. 9 is a schematic block diagram of another example of a power signal graph in accordance with the present invention.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
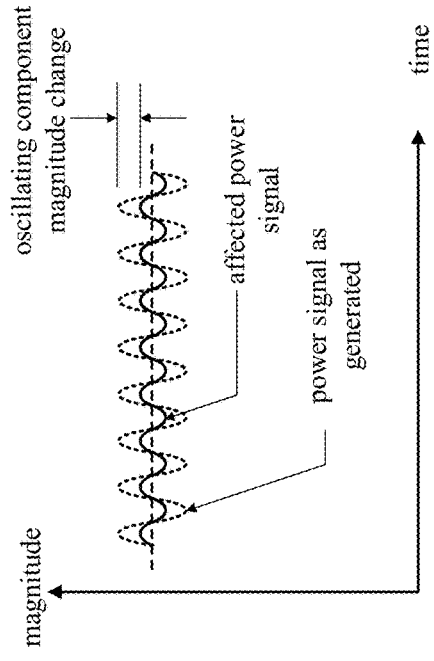
FIG. 10 is a schematic block diagram of another example of a power signal graph in accordance with the present invention.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11:
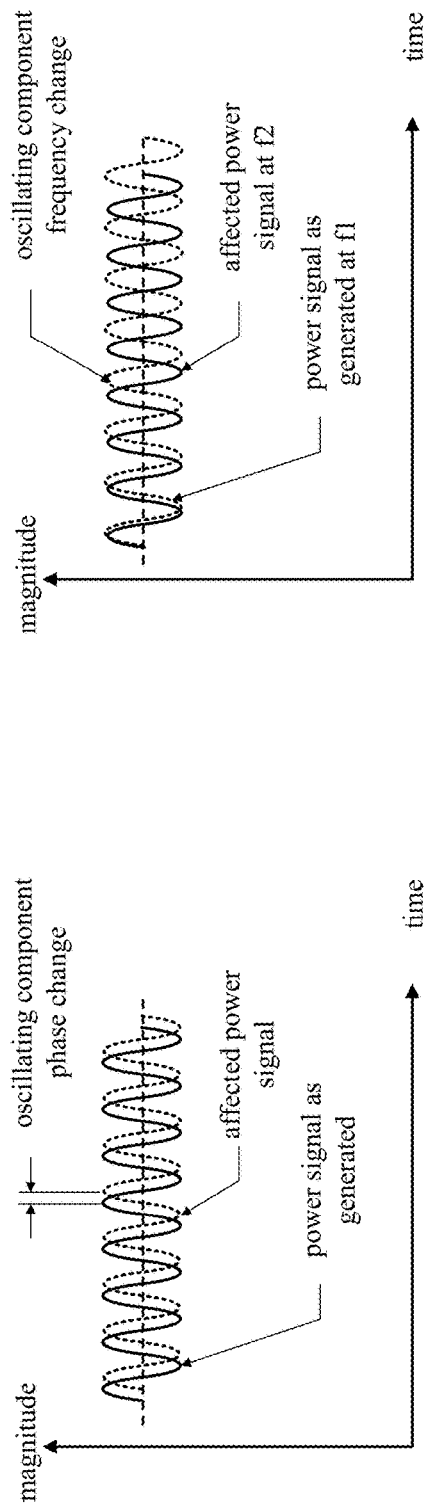
FIG. 11 is a schematic block diagram of another example of a power signal graph in accordance with the present invention.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

Figure 12:
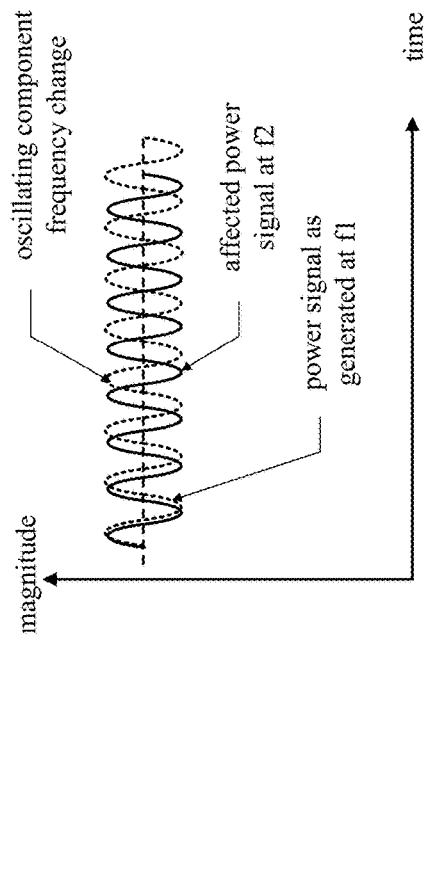
FIG. 12 is a schematic block diagram of another example of a power signal graph in accordance with the present invention.

FIG. 12 is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

Figure 13A:
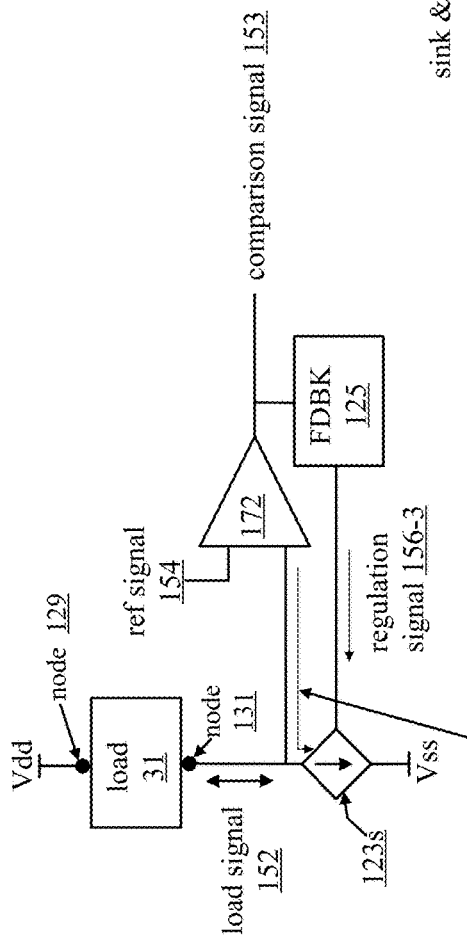
FIG. 13A is a schematic block diagram of a sink-sense circuit in accordance with various embodiments of the present invention.

Referring next to FIG. 13A a schematic block diagram of a sink-sense circuit 28-$s1$ will be discussed in accordance with various embodiments of the present invention. Sink-sense circuit 28-$s2$ includes a comparison circuit 172 having a reference input coupled to receive a reference signal 154, a sense input coupled to a load 31 and to a regulated sink-circuit 123$s$, and a comparison output coupled to regulated sink-circuit 123$s$ via a feedback circuit 125. Load 31 is coupled between a load voltage applied at drive node 129, shown as Vdd, and a sink voltage, shown as Vss, via the regulated sink-circuit 123s. The sink node 131 of load 31 is coupled to the sense input of the comparison circuit 172. The load voltage causes the load signal 152 to flow through the load, and the regulated sink-circuit 123s regulates an electrical characteristic of the load signal 152. Note that in the illustrated embodiment, the sink signal is applied at sink node 131, and sensing is performed at the same node to which the sink signal is applied.

The comparison circuit 172 compares the load signal 152 (having a regulated electrical characteristic) present at the sense input of comparison circuit 172, with the reference signal 154 present at its reference input. Comparison circuit 172 produces a comparison signal 153 at its output. The comparison signal 153 represents an effect 119 of load 31 on load signal 152 flowing through load 31. Feedback circuit 125 uses comparison signal 153 to generate regulation signal 156-3. In some embodiments, comparison signal 153 and regulation signal 156-3 are the same signal. In the illustrated embodiment, load signal 152 is referred to as a sink power signal, because sensing is performed at the sink node 131 of load 31 coupled to the sink source, which establishes a sink voltage (e.g., Vss).

Generally, a circuit that applies a sink signal to a sink node of a load and also senses changes in a power signal (e.g. a load signal), at the sink node of the load, is referred to herein as a sink-sense circuit, while a circuit that applies a drive signal to a drive node of a load and senses changes in a power signal (e.g. a load signal) at the drive node of the load is referred to as a drive-sense circuit. The term sink node refers to a node coupled, directly or indirectly, to sink voltage, such as Vss. The term drive node refers to a node coupled, directly or indirectly, to a drive or load voltage, such as Vdd. In various embodiments, regardless of the exact voltage values, Vdd is more positive than Vss. Thus, for example, Vdd can be +5 volts, and Vss can be 0 volts. Similarly, Vdd can be 0 volts, and Vss can be −5 volts.

The sink-sense circuit 28-s1 is a particular embodiment of sense circuits 28 and 28-1, as illustrated in FIGS. 6A-6C, and functions as described with reference to FIGS. 6-12, with sensing performed on the sink-side of load 31.

Figure 13B:
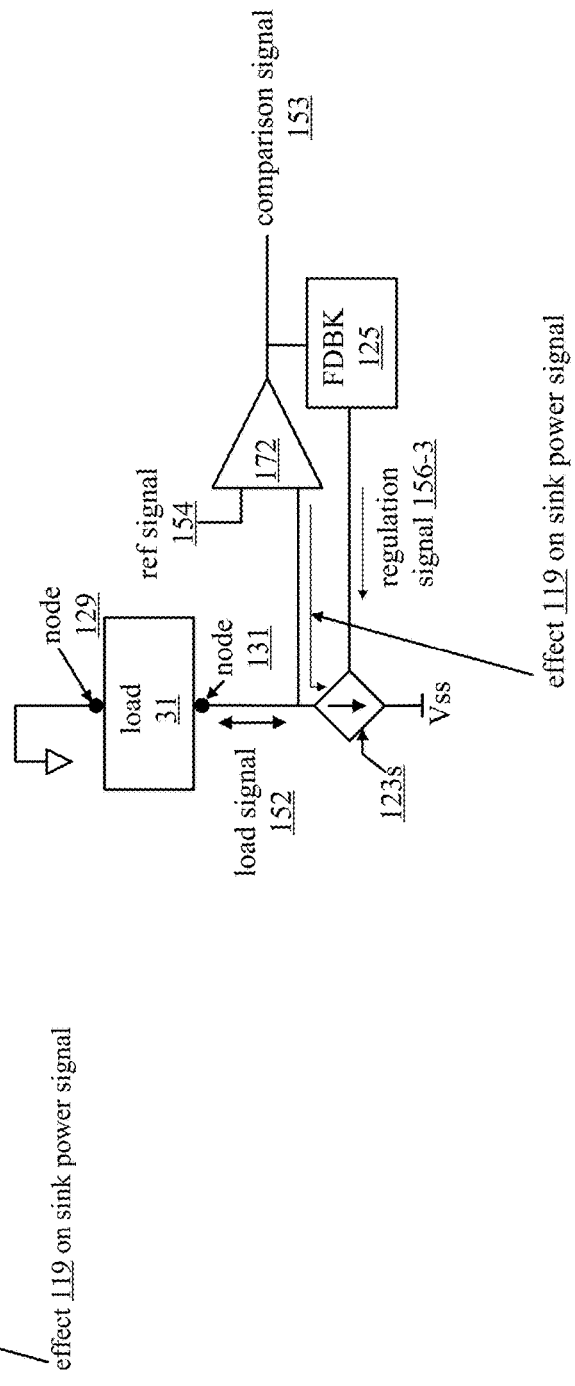
FIG. 13B is a schematic block diagram of another sink-sense circuit in accordance with various embodiments of the present invention.

FIG. 13B is a schematic block diagram of a sink-sense circuit 28-s2 will be discussed in accordance with various embodiments of the present invention. Sink-sense circuit 28-s2 includes a comparison circuit 172 having a reference input coupled to receive a reference signal 154, a sense input coupled to a load 31 and to a regulated sink-circuit 123s, and a comparison output coupled to regulated sink-circuit 123s via a feedback circuit 125. Load 31 is coupled between a load voltage applied at drive node 129, shown as ground, and a sink voltage, shown as Vss, via the regulated sink-circuit 123s. The sink node 131 of load 31 is coupled to the sense input of the comparison circuit 172. The load voltage applied at the drive node 129 causes the load signal 152 to flow through the load, and the regulated sink-circuit 123s regulates an electrical characteristic of the load signal 152. Note that in the illustrated embodiment, the sink signal is applied at sink node 131, and sensing is performed at the same node to which the sink signal is applied.

The comparison circuit 172 compares the load signal 152 (having a regulated electrical characteristic) present at the sense input of comparison circuit 172, with the reference signal 154 present at its reference input. Comparison circuit 172 produces a comparison signal 153 at its output. The comparison signal 153 represents an effect 119 of load 31 on load signal 152 flowing through load 31. Feedback circuit 125 uses comparison signal 153 to generate regulation signal 156-3. In some embodiments, comparison signal 153 and regulation signal 156-3 are the same signal. In the illustrated embodiment, load signal 152 is referred to as a sink power signal, because sensing is performed at the node of load 31 coupled to the sink source, which establishes a sink voltage (e.g., Vss). The sink-sense circuit 28-s2 is an alternate embodiment of sink-sense circuit 28-s1, and functions in the same way.

Referring next to FIG. 14 a method of using a sink power signal to sense changes in a load characteristic will be discussed in accordance with various embodiments of the present invention. The method illustrated in FIG. 14 can be implemented using, for example, sink-sense circuits 28-s1, 28-s2, or another suitable sink-sense circuit.

As illustrated by block 140, a drive voltage is applied to a load to produce a load signal that flows through the load to a regulated sink circuit coupled to a sink voltage. The load signal has a first electrical characteristic and a second electrical characteristic. The first and second electrical characteristics are selected from a group of electrical characteristics that include in various embodiments, voltage, current, frequency, impedance, and phase, or waveform shape. One of those electrical characteristics (the regulated characteristic) is regulated based on the other of the electrical characteristics (the controlled characteristic). Changes in a load electrical characteristic, for example capacitance, inductance, resistance, or impedance, result in a variation in the controlled characteristic of the load signal.

As illustrated by block 142, the load signal is applied to a sense input of a comparison circuit to establish a sense value of the controlled characteristic. As illustrated by block 144, a reference signal is applied to the reference input of a comparison circuit to establish a reference value of the controlled characteristic. As shown by block 146, the comparison circuit uses the sense value of the controlled characteristic and the reference value of the controlled characteristic to generate a comparison signal indicating a difference between the sense and reference values of the controlled electrical characteristic.

As illustrated by block 148, the comparison signal is used is used by a feedback circuit to generate a regulation signal, which is used by regulated sink circuit 123s to regulate the regulated characteristic of the load signal. As used herein, the term regulated power signal, regulated load signal, regulated sink signal, and regulated drive signal each refer to a signal having a regulated electrical characteristic. As illustrated by block 150, changes in the load characteristics are determined the comparison signal is used to sense changes in a load characteristic.

Consider the following example. A reference voltage is applied to the reference input of a comparison circuit has a known frequency, a known peak to peak voltage, and a known DC offset. The sense input of the comparison circuit, e.g., an op amp, will attempt to maintain its sense input at the same value as the reference voltage, thereby applying a sink voltage signal at the sink node of load 31. The output of the comparison circuit will vary as the voltage of the load signal (coupled to the sense node) deviates from the voltage at the reference node. The current of the load signal is regulated (based on the comparison signal output by the comparison circuit) to maintain a constant value. Because the current is regulated based on changes in voltage, any changes in the output voltage can be attributed to changes in the load's impedance.

Different sink-sense signals with different regulated and controlled characteristics can be used to sense different load characteristics. In various embodiments: a regulated current controlled by a controlled voltage can be used to sense changes in a load impedance; a regulated voltage, controlled by a controlled current, can be used to sense changes in a load impedance; a regulated current controlled by an impedance can be used to sense changes in load voltage; a regulated voltage controlled by an impedance can be used to sense changes in a load current; a regulated impedance controlled by a voltage can be used to sense changes in load current; a regulated impedance controlled by a current can be used to sense changes in load voltage.

Figure 15:
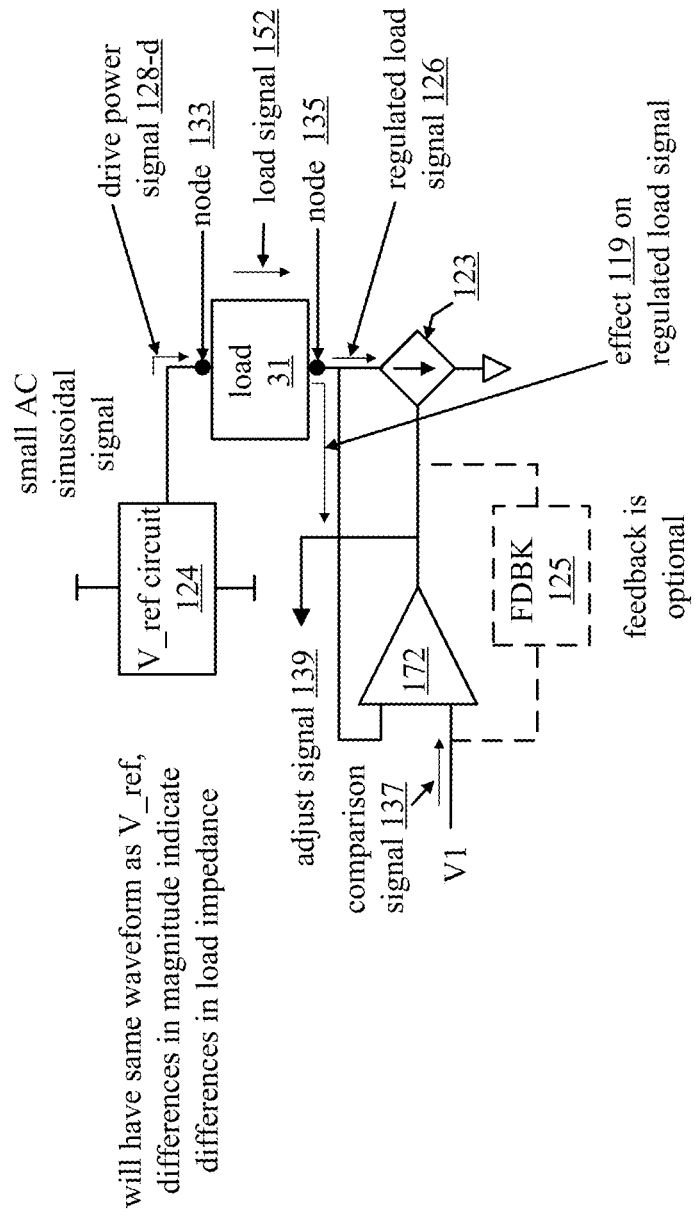
FIG. 15 is a schematic block diagram of a drive-sense circuit that applies a drive power signal at one node of a load, and senses changes in the load characteristic(s) at a different node of the load, in accordance with various embodiments of the present invention.

Referring next to FIG. 15 illustrates a drive-sense circuit 28-$d3$ that applies a drive power signal at one node of a load, and senses changes in the load characteristic(s) at a different node of the load, will be discussed in accordance with various embodiments of the present invention. Drive-sense circuit 28-$d3$ includes a comparison circuit 172 having a comparison input coupled to receive a comparison signal 137, a sense input coupled to both a sense node, which is also the sink node 135 of load 31, and to a load signal input of regulation circuit 123. Comparison circuit 172 also includes a comparison output coupled to a control input of regulation circuit 123 to provide an adjust signal 139, where the adjust signal 139 is used to control regulation circuit 123 to regulate an electrical characteristic of load signal 152 to produce regulated load signal 126. Optionally, the comparison output of the comparison circuit 172 is also coupled to the comparison input of comparison circuit 172 via feedback circuit 125.

Reference circuit 124 generates drive power signal 128-$d$, which is applied to drive node 133 of load 31 to generate a load signal 152, which flows through load 31. The regulation circuit 123 regulates load signal 152 to generate regulated load signal 126 by regulating a first characteristic of the load signal 152 based on a second characteristic of the load signal 152.

In one example, reference circuit 124 is a voltage reference circuit that generates a reference voltage signal having an oscillating component, and applies the reference voltage signal to drive node 133 of load 31, thereby causing load signal 152 to flow through load 31. Load signal 152 is regulated at sink node 135 of load 31 to generate regulated load signal 126. A first electrical characteristic (e.g., current) of the regulated load signal 126 is regulated based on a change in a second characteristic (e.g., voltage) of the regulated load signal 126. As the voltage of the regulated load signal, as measured at the sink node 135 of load 31 (also the sense node of comparison circuit 172), attempts to change in response to changes in the reference voltage, the comparison circuit 172 generates an adjust signal 139 representing the amount by which the current of the regulated load signal 126 needs to be adjusted to maintain the voltage at the sink node 135 at the same value as the comparison voltage applied to the comparison node (referred to elsewhere herein as a reference node) of comparison circuit 172. The adjust signal 139 is applied to the regulation circuit 123, which changes the current to keep the voltage of the regulated load signal 126 from changing. This adjust signal 139 can be used to determine a characteristic of the load (e.g., impedance), because the adjust signal 139 will have the same waveform as the drive power signal 128-$d$, but with a different amplitude. The difference between the magnitude of the oscillating component (in this example voltage) of adjust signal 139 and the magnitude of the oscillating component (in this example voltage) of drive power signal 128-$d$, can be used to determine the impedance of load 31.

Optional feedback circuit 125 can be used to tune the response of drive-sense circuit 28-$d3$ so that adjust signal 139 is optimized for use with connected circuitry. For example, feedback circuit 125 can be used to adjust control adjust signal 139 to have particular amplitude values, frequency ranges, phase, or timing characteristics, and/or bias voltages to ensure operation within power dissipation limitations, to overcome trace or conductor losses, and/or to comply with shielding or interference requirements of connected circuitry. Feedback circuit 125 can also be used to provide signal shaping, delays, phase shifts, or the like, to facilitate comparison of characteristic (e.g., voltage) of adjust signal 139 to corresponding characteristics (e.g., voltage) of drive power signal 128-D. In some embodiments, although not specifically illustrated, the adjust signal 139 and the drive power signal can be used as inputs to a second comparator to determine the difference in magnitudes between the two signals.

Figure 16:
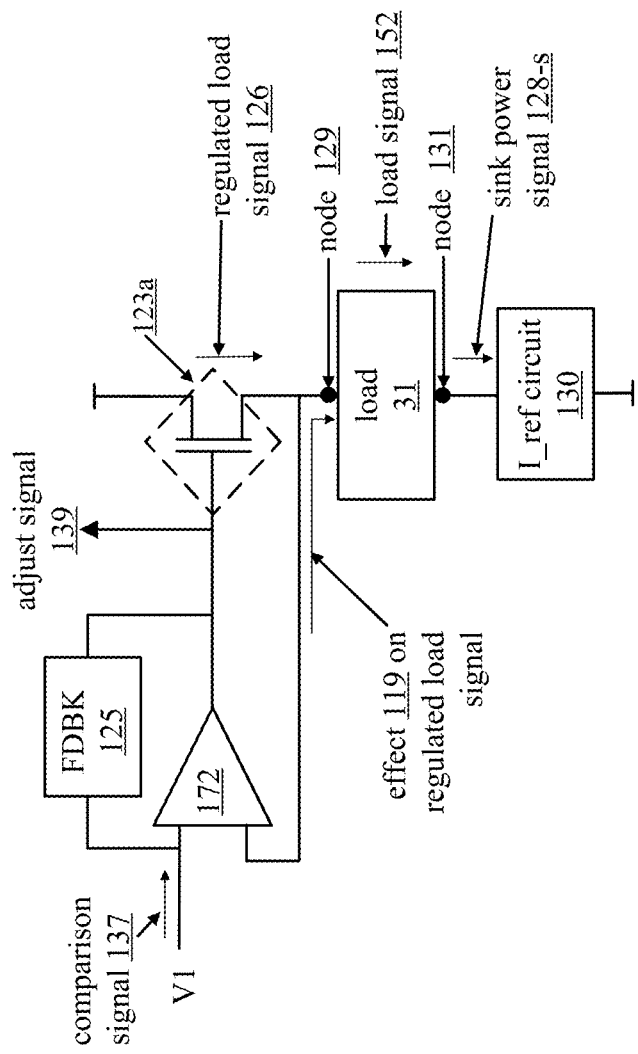
FIG. 16 is a schematic block diagram of a sink-sense circuit that applies a sink power signal at one node of a load, and senses changes in the load characteristic(s) at a different node of the load, in accordance with various embodiments of the present invention.

FIG. 16 illustrates a sink-sense circuit 28-$s3$ that applies a sink power signal at one node of a load, and senses changes in the load characteristic(s) at a different node of the load, in accordance with various embodiments of the present invention. Sink-sense circuit 28-$s3$ includes a comparison circuit 172 having a comparison input coupled to receive a comparison signal 137, and a sense input coupled to both a sense node 129 of load 31 and to a load signal input of regulation circuit 123$a$. Comparison circuit 172 also includes a comparison output coupled to a control input of regulation circuit 123$a$ to provide an adjust signal 139, where the adjust signal 139 is used to control regulation circuit 123$a$ to regulate an electrical characteristic of load signal 152 to produce regulated load signal 126. The comparison output of the comparison circuit 172 is also coupled to the comparison input of comparison circuit 172 via feedback circuit 125.

Reference circuit 130 generates sink power signal 128-$s$, which is applied to sink node 131 of load 31 to generate a load signal 152, which flows through load 31. The regulation circuit 123$a$ regulates load signal 152 to generate regulated load signal 126 by regulating a first characteristic of the load signal 152 based on a second characteristic of the load signal 152.

In one example, reference circuit 130 is a current reference circuit that generates a reference current signal having an oscillating component, and applies the reference current signal to sink node 131 of load 31, thereby causing load signal 152 to flow through load 31. Load signal 152 is regulated at drive node 129 of load 31 to generate regulated load signal 126. A first electrical characteristic (e.g., voltage) of the regulated load signal 126 is regulated based on a change in a second characteristic (e.g., current) of the regulated load signal 126. As the current of the regulated load signal, as measured at the drive node 129 of load 31 (also the sense node of comparison circuit 172), attempts to increase (decrease) in response to changes in the reference current, the voltage drop across load 31 also attempts to change, thereby attempting to change the voltage of load signal 152, In response, the comparison circuit 172 generates an adjust signal 139 representing the amount by which the voltage of the regulated load signal 126 needs to be adjusted to maintain the voltage at the drive node 129 at the same value as the comparison voltage applied to the comparison node (referred to elsewhere herein as a reference node) of comparison circuit 172. The adjust signal 139 is applied to the regulation circuit 123$a$, which changes the voltage at drive node 129 to keep the voltage of the regulated load signal 126 from changing. This adjust signal 139 can be used to determine a characteristic of the load (e.g., impedance), because the adjust signal 139 will have the same waveform as the sink power signal 128-s, but with a different amplitude. The difference between the magnitude of the oscillating component of adjust signal 139 and the magnitude of the oscillating component (in this example voltage) of drive power signal 128-d, can be used to determine the impedance of load 31.

Feedback circuit 125 can be used to tune the response of drive-sense circuit 28-d3 so that adjust signal 139 is optimized for use with connected circuitry. For example, feedback circuit 125 can be used to adjust control adjust signal 139 to have particular amplitude values, frequency ranges, phase, or timing characteristics, and/or bias voltages to ensure operation within power dissipation limitations, to overcome trace or conductor losses, and/or to comply with shielding or interference requirements of connected circuitry.

Figure 17:
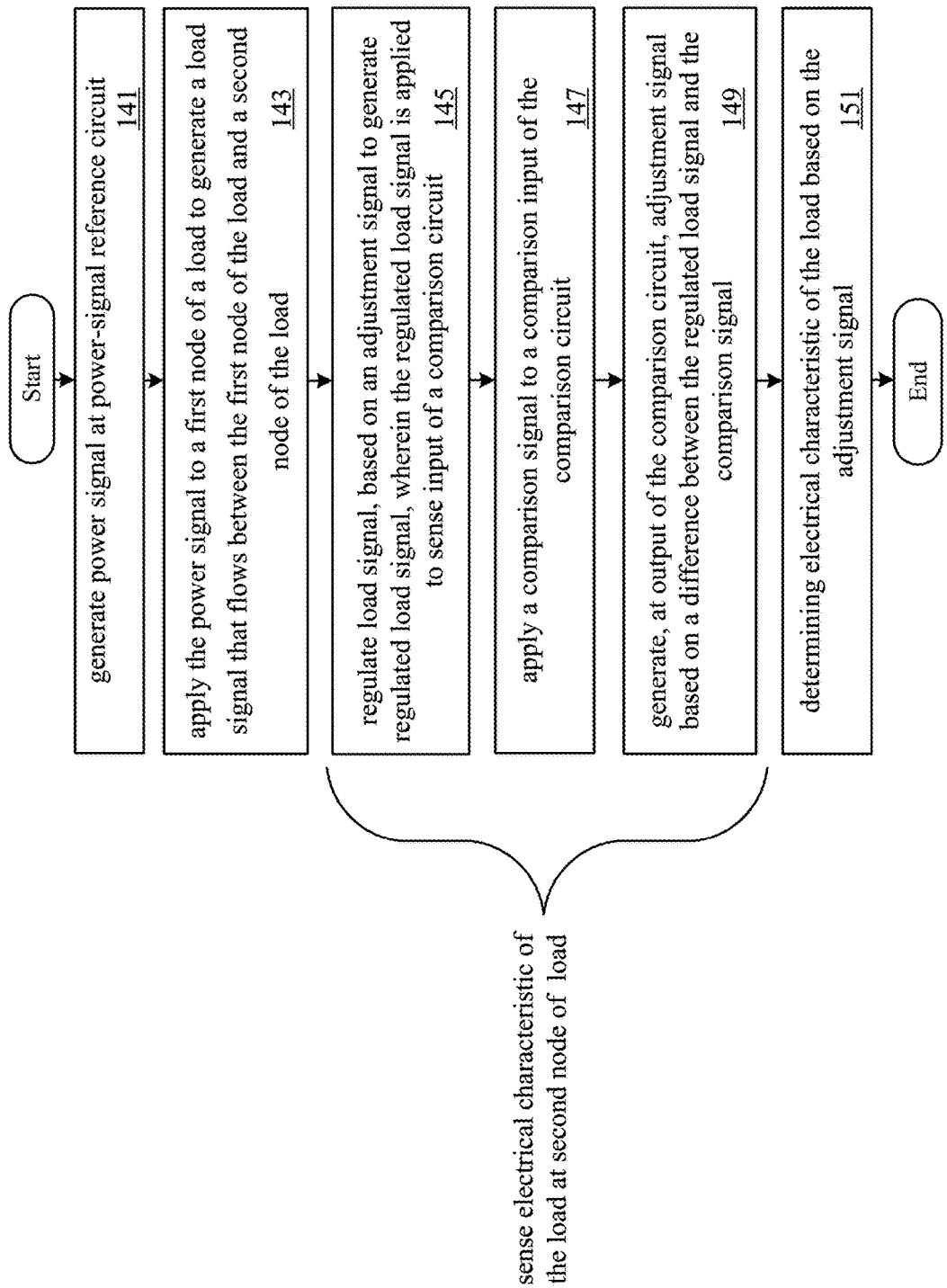
FIG. 17 is a flow chart illustrating a method of determining electrical characteristics of a load by applying a drive signal or a sink signal to one node of a load, and sensing changes in the electrical characteristics at another node of the load, in accordance with various embodiments of the present invention.

Referring next to FIG. 17 a method of determining electrical characteristics of a load by applying a drive signal or a sink signal to one node of a load, and sensing changes in the electrical characteristics at another node of the load, will be discussed in accordance with various embodiments of the present invention.

As illustrated by block 141, a power signal reference circuit generates a power signal. The power signal can include, but is not limited to, a current based power signal or a voltage-based power signal. As illustrated by block 143, the power signal is applied to a first node of a load to generate a load signal that lows between the first node of the load and a second node of the load. In one example, a voltage-based power signal is applied a drive node of a load. In another example, a voltage-based power signal is applied at a sink node of a load. In yet another embodiment, a current based power signal is applied at a drive node of a load. In yet another embodiment, a current based power signal can be applied at a sink node of a load. A power signal can include a DC component, an oscillating component, or both a DC and oscillating component. In at least one embodiment, the oscillating component is a sine wave, but in other embodiments the oscillating component can be implemented as a square wave, sawtooth wave, or the like.

As illustrated in blocks 145, 147, and 149, the electrical characteristic of the load can be sensed at a second node of the load, different from the first node. Thus, for example, if the power signal (e.g., current signal or voltage signal) is applied at the drive node of a load, the electrical characteristic of the load can be sensed at the sink node of the load. Conversely, if the power signal is applied at the sink node of the load, the changes in the load characteristic can be sensed at the drive node of the load.

As shown in block 145, the load signal is regulated based on an adjust signal to generate a regulated load signal. The regulated load signal is applied to a sense input of a comparison circuit. In various embodiments, if the power signal is applied to the drive node of the load, the sense input of the comparison circuit is coupled to the sink node of the load. Conversely, if the power signal is applied to the sink node of the load, the sense input of the comparison circuit is coupled to the drive node of the load. Regulating the load signal includes coupling the adjust signal to a control input of a regulation circuit, which uses the adjust signal to modify an electrical characteristic of the regulated load signal. A regulation circuit can include, for example, a controllable current source or a controllable voltage source that changes its output based on a value of the adjust signal.

As illustrated by block 147, a comparison signal is applied to a comparison input of a comparison circuit. The comparison input of the comparison circuit is sometimes referred to herein as a reference input. The comparison signal can, in some embodiments, be implemented as a voltage signal or a current signal.

As illustrated by block 149, the comparison circuit generates an adjust signal at its output. The adjust signal is generated based on a difference between the regulated load signal and the comparison signal, and indicates an effect of a load characteristic on a power signal. In various embodiments the adjust signal indicates the effect of the load characteristic on the power signal by indicating how much one characteristic of a regulated load signal must be adjusted to maintain another characteristic of the regulated load signal at a particular value. In one example, the adjust signal indicates how an electrical current is to be increased or decreased to maintain a voltage at a given level. In another example, the adjust signal indicates how much a voltage needs to be increased or decreased to maintain a current at a given level.

As illustrated by block 151, the electrical characteristic of the load is determined based on the adjust signal. Determining a load characteristic based on an adjust signal that indicates an effect of is discussed in more detail with reference to FIG. 6A.

Figure 18:
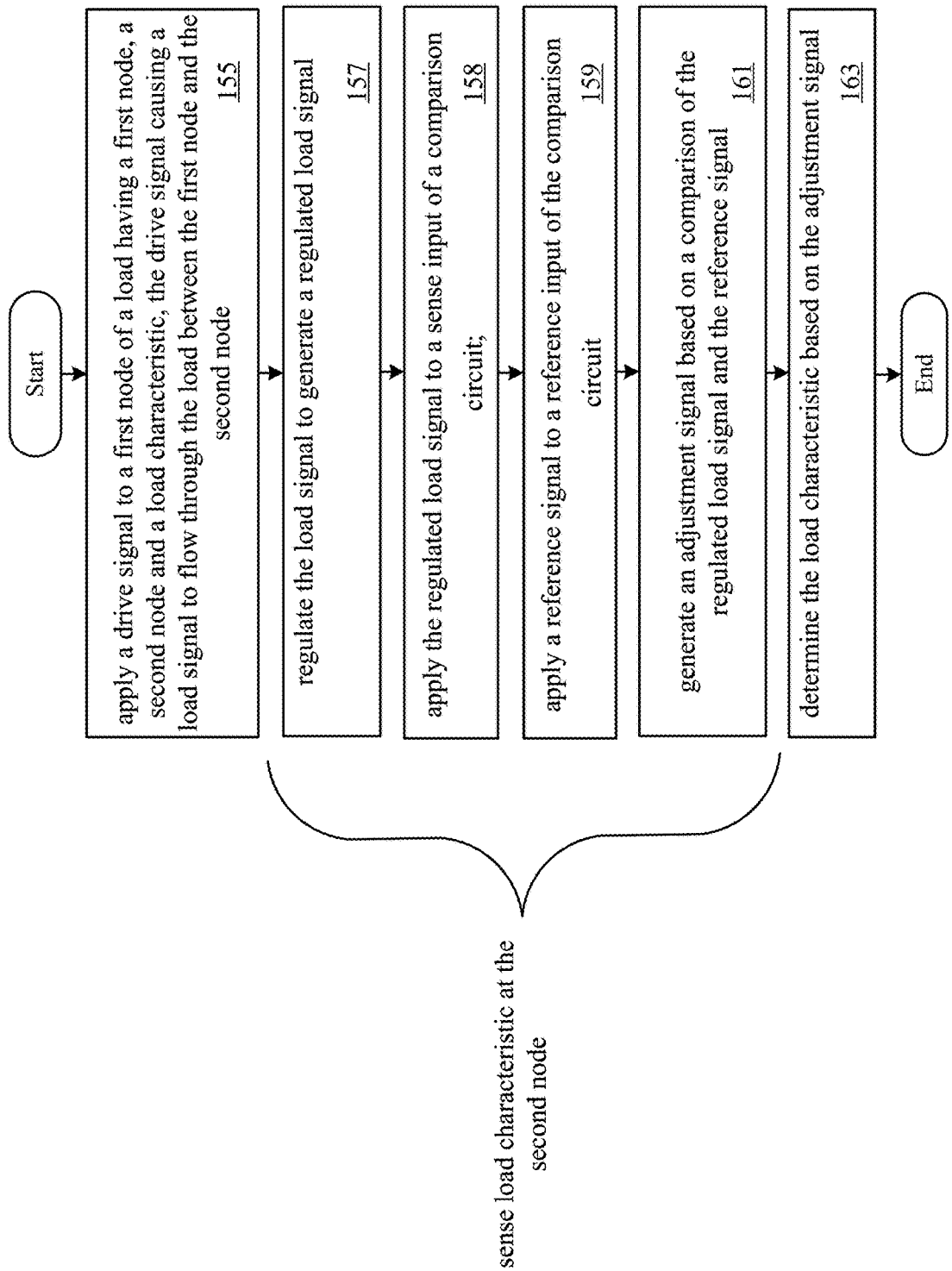
FIG. 18 is a flow chart illustrating a method of determining electrical characteristics of a load by applying a drive signal to one node of a load, and sensing changes in the electrical characteristics at another node of the load, in accordance with various embodiments of the present invention.

Referring next to FIG. 18 a method of determining electrical characteristics of a load by applying a drive signal to one node of a load, and sensing changes in the electrical characteristics of the load at another node of the load will be discussed in accordance with various embodiments of the present invention.

As illustrated by block 154, a drive signal is applied to a first node of a load having a first node, a second node, and a load characteristic. The drive signal causes a load signal to flow through the load, between the first node and the second node. The drive signal can be a current-based power signal, or a voltage-based power signal, applied to a drive node of the load.

As illustrated by block 157, the load signal is regulated to generate a regulated load signal. In at least one embodiment, the regulation is performed at the same node of the load at which changes in the load characteristic is sensed. As illustrated by block 158, the regulated load signal is applied to the sense input of a comparison circuit. As illustrated by block 159, a reference signal is applied to a reference input of the comparison circuit.

As illustrated by block 161, the comparison circuit generates an adjust signal based on a comparison of the regulated load signal and the reference signal. A characteristic of the load is determined based on the adjust signal, as shown by block 163.

Figure 19:
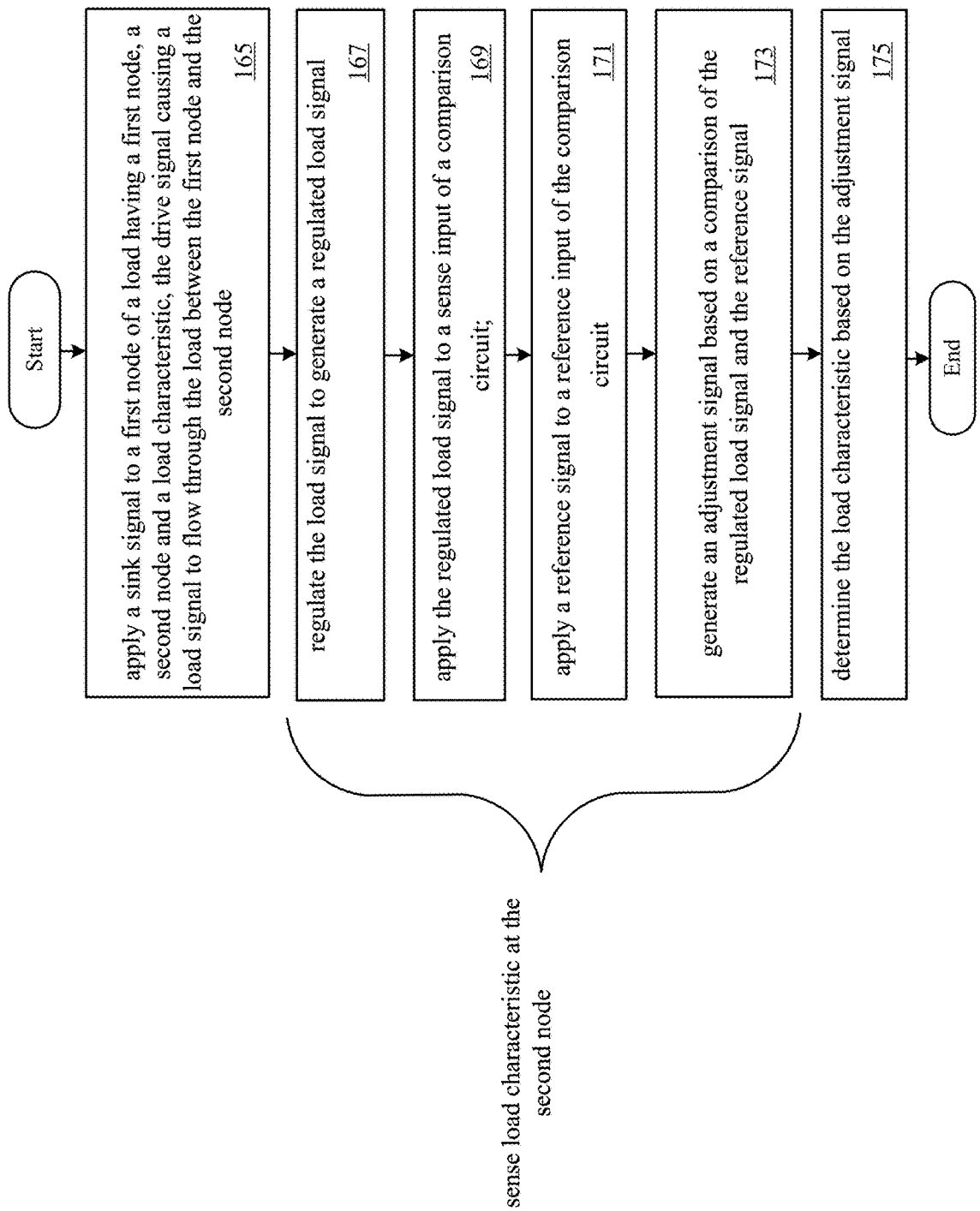
FIG. 19 is a flow chart illustrating a method of determining electrical characteristics of a load by applying a sink signal to one node of a load, and sensing changes in the electrical characteristics at another node of the load, in accordance with various embodiments of the present invention.

FIG. 19 a method of determining electrical characteristics of a load by applying a sink signal to one node of a load, and sensing changes in the electrical characteristics of the load at another node of the load, in accordance with various embodiments of the present invention.

As illustrated by block 165, a sink signal is applied to a first node of a load having a first node, a second node, and a load characteristic. The sink signal causes a load signal to flow through the load, between the first node and the second node. The sink signal can be a current-based power signal, or a voltage-based power signal, applied to a sink node of the load.

As illustrated by block 167, the load signal is regulated to generate a regulated load signal. In at least one embodiment, the regulation is performed at the that same node of the load at which changes in the load characteristic is sensed. As illustrated by block 169, the regulated load signal is applied to the sense input of a comparison circuit. As illustrated by block 171, a reference signal is applied to a reference input of the comparison circuit.

As illustrated by block 173, the comparison circuit generates an adjust signal based on a comparison of the regulated load signal and the reference signal. A characteristic of the load is determined based on the adjust signal, as shown by block 175.

In at least one embodiment, a method comprises: generating a power signal at a power-signal reference circuit; applying the power signal to a first node of a load to generate a load signal that flows between the first node of the load and a second node of the load; sensing an electrical characteristic of the load at a second node of a load, wherein the second node of the load is coupled to a sense input of a comparison circuit, wherein sensing the electrical characteristic of the load includes: regulating the load signal, based on an adjustment signal, to generate a regulated load signal, wherein the regulated load signal is applied to the sense input of a comparison circuit; applying a comparison signal to a comparison input of the comparison circuit; generating, at an output of the comparison circuit, an adjustment signal based on a difference between the regulated load signal and the comparison signal, wherein the adjustment signal indicates the electrical characteristic of the load; and determining electrical characteristic of the load based on the adjustment signal.

In other embodiments, a method comprises: applying a drive signal to a first node of a load having a first node, a second node and a load characteristic, the drive signal causing a load signal to flow through the load between the first node and the second node; sensing the load characteristic at the second node, wherein sensing the load characteristic includes: regulating the load signal to generate a regulated load signal; applying the regulated load signal to a sense input of a comparison circuit; applying a reference signal to a reference input of the comparison circuit;

generating an adjustment signal based on a comparison of the regulated load signal and the reference signal; and determining the load characteristic based on the adjustment signal.

Yet further embodiments include a method comprising: applying a sink signal to a first node of a load having a first node, a second node and a load characteristic, the sink signal causing a load signal to flow through the load between the first node and the second node; sensing the load characteristic at the second node, wherein sensing the load characteristic includes: regulating the load signal to generate a regulated load signal; applying the regulated load signal to a sense input of a comparison circuit; applying a reference signal to a reference input of the comparison circuit; generating an adjustment signal based on a comparison of the regulated load signal and the reference signal; and determining the load characteristic based on the adjustment signal.

In some embodiments, a load-sensing circuit used to implement one or more of the above methods includes: a load including a first node and a second node, and having a load characteristic; a reference circuit coupled to the load, and configured to provide a drive signal to the first node, the drive signal causing a load signal to flow through the load, and wherein the drive signal establishes a value of a first electrical characteristic of the load signal; a regulation circuit coupled to the second node, and configured to generate a regulated load signal by regulating a second electrical characteristic of the load signal; a comparison circuit configured to generate an adjustment signal based on a comparison of the regulated load signal and the reference signal, the comparison circuit including: a sense input coupled to the second node and configured to receive the regulated load signal; a reference input coupled to receive a reference signal; an output coupled to provide the adjustment signal to the regulation circuit, wherein the adjustment signal indicates the load characteristic.

Figure 20:
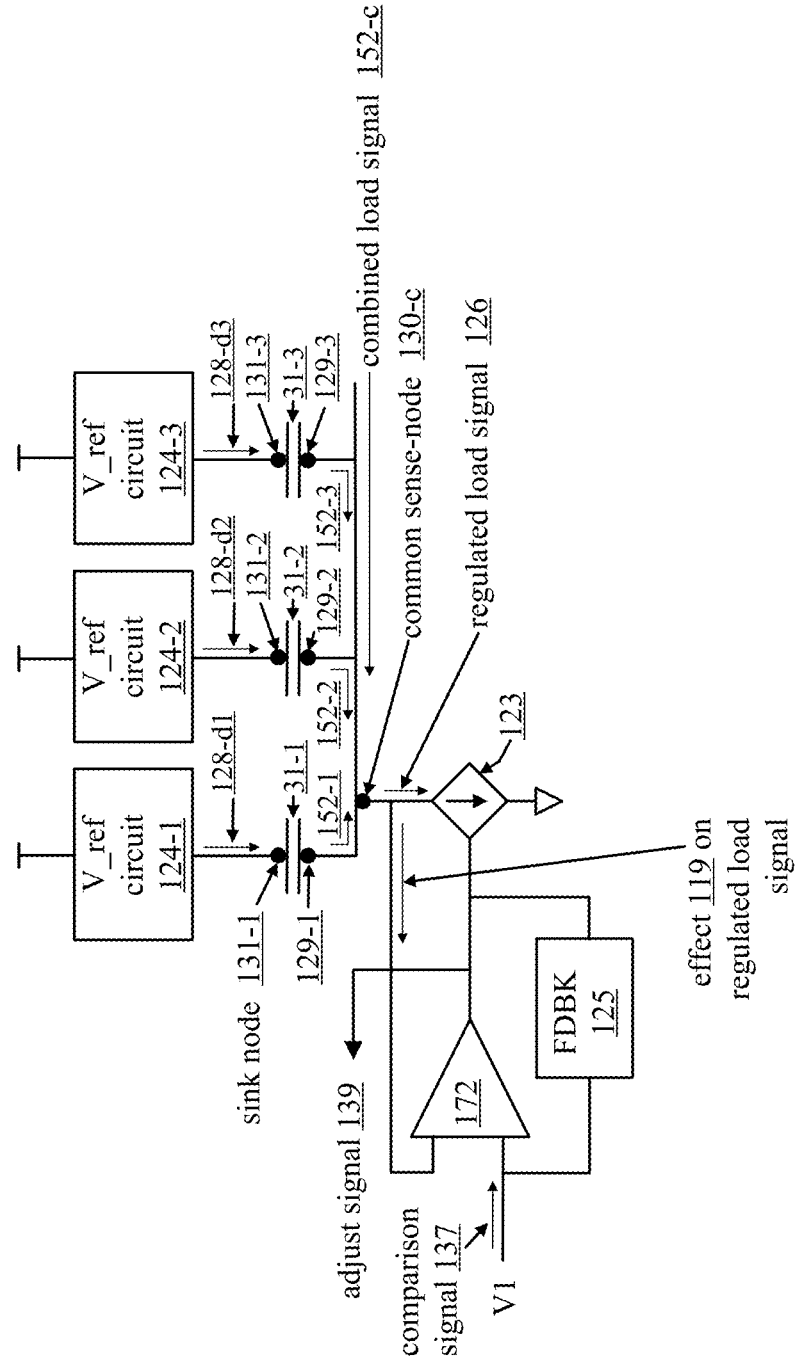
FIG. 20 is a schematic block diagram of a drive-sense circuit employing a common sense-node and multiple separate drive signals, in accordance with various embodiments of the present invention.

Referring next to FIG. 20 a drive-sense circuit 28-$d4$ employing a common sense-node and multiple separate drive signals will be discussed in accordance with various embodiments of the present invention. As used herein, unless otherwise required by context, the term "common" means "mutual" or "shared"—not "ordinary" or "commonplace." Thus, a "common sense-node" refers to a "shared node at which something is sensed." Similarly, a "common sense-signal" refers to a "shared signal that is sensed."

Drive-sense circuit 28-$d4$ includes a comparison circuit 172 having a comparison input coupled to receive a comparison signal 137, a sense input coupled to both a common sense-node 129-$c$ and to a load signal input of regulation circuit 123. Comparison circuit 172 also includes a comparison output coupled to a control input of regulation circuit 123 to provide an adjust signal 139, where the adjust signal 139 is used to control regulation circuit 123 to regulate an electrical characteristic of a combined load signal 152-$c$ to produce regulated load signal 126. Optionally, the comparison output of the comparison circuit 172 is also coupled to the comparison input of comparison circuit 172 via feedback circuit 125.

Reference circuits 124-1, 124-2, and 124-3 generate corresponding drive power signals 128-$d1$, 128-$d2$, and 128-$d3$, which are each applied to their respective capacitive loads 31-1, 31-2, and 31-3. In particular, drive power signal 128-$d1$ is applied to node 131-1 of load 31-1, drive power signal 128-$d2$ is applied to node 131-2 of load 31-2, and drive power signal 128-$d3$ is applied to node 131-3 of load 31-3. Although loads 31-1, 31-2, and 31-3 are illustrated as capacitors, they are not limited to capacitive loads, but can be other types of loads as disclosed herein.

The drive power signals 128-$d1$, 128-$d2$, and 128-$d3$ cause load signals 152-1, 152-2, and 152-3 to flow through corresponding loads 31-1, 31-2, and 31-3. In particular, load signal 152-1 flows between node 131-1 and node 129-1, load signal 152-2 flows between node 131-2 and node 129-2, and load signal 152-3 flows between node 131-3 and node 129-3. Nodes 129-1, 129-2, and 129-3 are connected to each other, and form a common sense-node 129-$c$. Thus, components from each of load signals 152-1, 151-2, and 151-3 form a combined load signal 152-$c$ at sense-node 129-$c$.

The regulation circuit 123 regulates the combined load signal 152-$c$ to generate regulated load signal 126 by regulating a first characteristic of the combined load signal 152-$c$ based on a second characteristic of the combined load signal 152-$c$.

In one example, reference circuits 124-1, 124-2, and 124-3 are voltage reference circuits that generate reference voltage signals having different oscillating components. For example, reference circuit 124-1 generates a voltage signal including an oscillating component having a first frequency, reference circuit 124-2 generates a voltage signal including an oscillating component having a second frequency, and reference circuit 124-3 generates a voltage signal including an oscillating component having a third frequency. Electrical characteristics of loads 31-1, 31-2, and 31-3 affect load signals 152-1, 152-2, and 152-3, so that the combined load signal includes affected frequency components. In a simple example, each load may attenuate a magnitude of its corresponding voltage signal, so that the magnitudes of the different oscillating components included in the combined load signal 152-*c* are attenuated based on electrical characteristics of the individual loads 31-1, 31-2, and 31-3. The combined load signal 152-*c* is regulated at common sense-node 130-*c* to generate regulated load signal 126. Continuing with the above example, regulated load signal 126 will include the attenuated oscillating components associated with the individual loads 31-1, 31-2, and 31-3. Consequently, the regulated load signal 126 will also include the attenuated oscillating components associated with the individual loads. The attenuated oscillating components represent the effect 119 of the individual loads on the regulated load signal 126.

A first electrical characteristic (e.g., current) of the regulated load signal 126 is regulated based on a change in a second characteristic (e.g., voltage) of the regulated load signal 126. As the voltage of the regulated load signal attempts to change in response to changes in the voltage of the drive power signal, the comparison circuit 172 generates an adjust signal 139 representing the amount by which the current of the regulated load signal 126 needs to be adjusted to maintain the voltage of the regulated load signal 126 (present at a sense node of the comparison circuit 172) at the same value as the comparison voltage (present at a comparison node of comparison circuit 172).

Adjust signal 139 is applied to regulation circuit 123, which changes the current of regulated load signal 126 to a value needed to maintain the voltage of the regulated load signal 126 constant. In addition to being used to regulate the current in this example, adjust signal 139 can also be used to determine a characteristic of the load (e.g., impedance), because the oscillating components of adjust signal 139 will have the same waveform as the oscillating components of drive power signals 128-*d*1, 128-*d*2, and 128-*d*3, but with different amplitudes. The differences between the magnitudes of the individual oscillating components (in this example voltage) of adjust signal 139 and the magnitudes of the oscillating components (in this example voltage) of the drive power signals 128-*d*1, 128-*d*2, and 128-*d*3, can be used to determine the impedance of the individual loads 31-1, 31-2, and 31-3.

Figure 21:
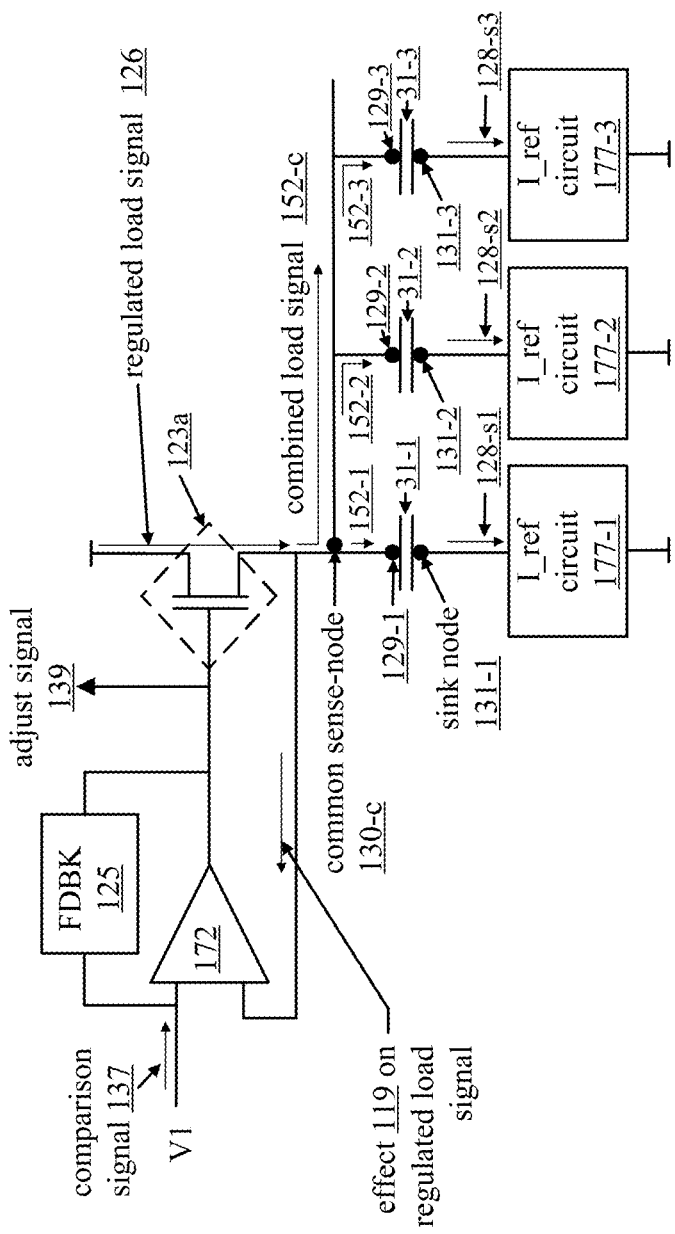
FIG. 21 is a schematic block diagram of a sink-sense circuit employing a common sense-node and multiple separate sink signals, in accordance with various embodiments of the present invention.

Referring next to FIG. 21 a sink-sense circuit 28-*s*4 employing a common sense-node and multiple separate sink signals will be discussed in accordance with various embodiments of the present invention.

Sink-sense circuit 28-*s*4 includes a comparison circuit 172 having a comparison input coupled to receive a comparison signal 137, a sense input coupled to both a common sense-node 129-*c* and to a load signal input of regulation circuit 123. Comparison circuit 172 also includes a comparison output coupled to a control input of regulation circuit 123 to provide an adjust signal 139, where the adjust signal 139 is used to control regulation circuit 123 to regulate an electrical characteristic of combined load signal 152-*c* to produce regulated load signal 126. Optionally, the comparison output of the comparison circuit 172 is also coupled to the comparison input of comparison circuit 172 via feedback circuit 125.

Reference circuits 177-1, 177-2, and 177-3 generate corresponding sink power signals 128-*s*1, 128-*s*2, and 128-*s*3, which are each applied to their respective capacitive loads 31-1, 31-2, and 31-3. In particular, sink power signal 128-*s*1 is applied to node 131-1 of load 31-1, sink power signal 128-*s*2 is applied to node 131-2 of load 31-2, and sink power signal 128-*s*3 is applied to node 131-3 of load 31-3. Although loads 31-1, 31-2, and 31-3 are illustrated as capacitors, they are not limited to capacitive loads, but can be other types of loads as disclosed herein.

The sink power signals 128-*s*1, 128-*s*2, and 128-*s*3 cause load signals 152-1, 152-2, and 152-3 to flow through corresponding loads 31-1, 31-2, and 31-3. In particular, load signal 152-1 flows between node 131-1 and node 129-1, load signal 152-2 flows between node 131-2 and node 129-2, and load signal 152-3 flows between node 131-3 and node 129-3. Nodes 129-1, 129-2, and 129-3 are connected to each other, and form a common sense-node 129-*c*. Thus, components from each of load signals 152-1, 151-2, and 151-3 form a combined load signal 152-*c* at sense-node 129-*c*.

The regulation circuit 123 regulates the combined load signal 152-*c* to generate regulated load signal 126 by regulating a first characteristic of the combined load signal 152-*c* based on a second characteristic of the combined load signal 152-*c*.

In one example, reference circuits 177-1, 177-2, and 177-3 are current reference circuits that generate reference current signals having different oscillating components. For example, reference circuit 177-1 generates a current signal including an oscillating component having a first frequency, reference circuit 177-2 generates a current signal including an oscillating component having a second frequency, and reference circuit 177-3 generates a voltage signal including an oscillating component having a third frequency. Electrical characteristics of loads 31-1, 31-2, and 31-3 affect load signals 152-1, 152-2, and 152-3, so that the combined load signal includes affected frequency components. In a simple example, each load may attenuate a magnitude of its corresponding current signal, so that the magnitudes of the different oscillating components included in the combined load signal 152-*c* are attenuated based on electrical characteristics of the individual loads 31-1, 31-2, and 31-3. The combined load signal 152-*c* is regulated at common sense-node 130-*c* to generate regulated load signal 126. Continuing with the above example, regulated load signal 126 will include the attenuated oscillating components associated with the individual loads 31-1, 31-2, and 31-3. Consequently, the regulated load signal 126 will also include the attenuated oscillating components associated with the individual loads. The attenuated oscillating components represent the effect 119 of the individual loads on the regulated load signal 126.

A first electrical characteristic (e.g., voltage) of the regulated load signal 126 is regulated based on a change in a second characteristic (e.g., current) of the regulated load signal 126. As the current of the regulated load signal attempts to change in response to changes in the current of the sink power signal, the comparison circuit 172 generates an adjust signal 139 representing the amount by which the voltage of the regulated load signal 126 needs to be adjusted to maintain the current of the regulated load signal 126 at a constant value.

Adjust signal 139 is applied to regulation circuit 123, which changes the voltage of regulated load signal 126 to a value needed to maintain the current of the regulated load signal 126 constant. In addition to being used to regulate the current in this example, adjust signal 139 can also be used to determine a characteristic of the load (e.g., impedance), because the oscillating components of adjust signal 139 will have the same waveform as the oscillating components of sink power signals 128-*d*1, 128-*d*2, and 128-*d*3, but with different amplitudes. The differences between the magnitudes of the individual oscillating components (in this example current) of adjust signal 139 and the magnitudes of the oscillating components (in this example current) of the sink power signals 128-*d*1, 128-*d*2, and 128-*d*3, can be used to determine the impedance of the individual loads 31-1, 31-2, and 31-3.

Figure 22:
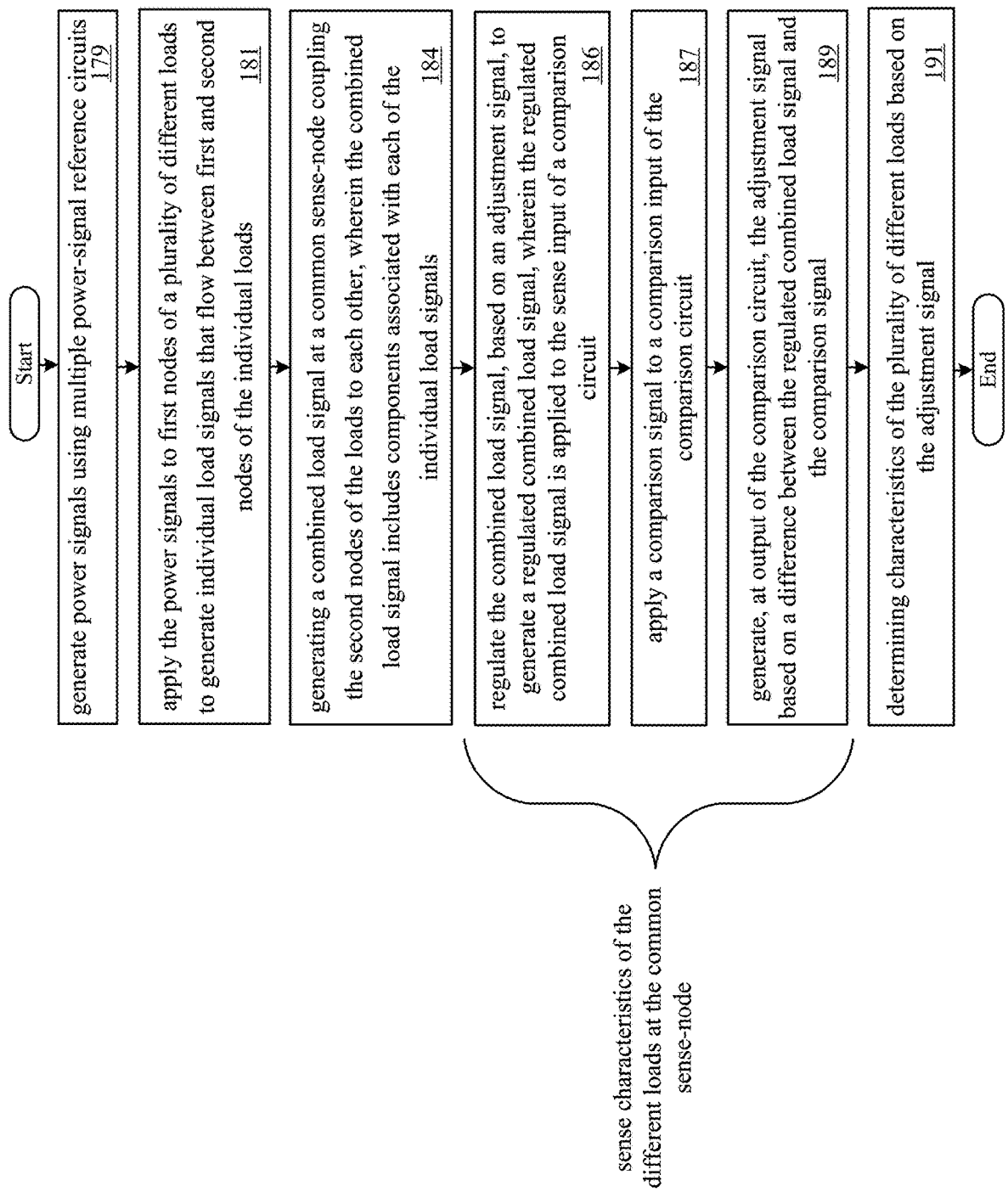
FIG. 22 is a flow diagram illustrating a method of determining electrical characteristics of multiple nodes using a drive-sense circuit, or a sink-sense circuit, employing multiple separate power signals and a common sense-node, in accordance with various embodiments of the present invention.

Referring next to FIG. 22, a method of determining electrical characteristics of multiple nodes using a drive-sense circuit, or a sink-sense circuit, employing multiple separate power signals and a common sense-node will be discussed in accordance with various embodiments of the present invention.

As illustrated by block 179, power signals, e.g., drive power signals or sink power signals, are generated using multiple different power-signal reference circuits. The power signals include, but are not limited to, voltage-based power signals or current-based power signals including oscillating components. One or more of the oscillating components included in the different power signals can have different frequencies. For example, if 4 different power signals are generated, two of the power signals can include components that oscillate at a first frequency, one of the power signals includes a component that oscillates at a second frequency, and the remaining power signal can include a component that oscillates at a third frequency. In some embodiments, the frequency may be 0, which corresponds to a DC/non-oscillating component.

In some embodiments a single power signal can include multiple different oscillating components oscillating at different frequencies. In yet other embodiment each of the power signals includes a single oscillating component, and each of the oscillating components oscillates at different frequencies. In other implementations, the oscillating components of each power signal oscillate at a common frequency. The oscillating components can have different waveforms, including but not limited to sinusoidal waveforms, triangular waveforms, square waveforms, or the like. Furthermore, the waveforms can be modulated waveforms.

As illustrated by block 181, the power signals are applied to first nodes of a plurality of different loads to generate individual load signals that flow between first and second nodes of the individual loads. In separate sink and sense implementations, the power signal is a sink power signal, and the first nodes are sink-nodes (e.g., nodes coupling the loads to a power sink). In separate drive and sense implementations the power signal is a drive power signal, and the first nodes are drive-nodes, (e.g., nodes coupling the loads to a power source).

As illustrated by block 184, a combined load signal is generated at a common sense-node that couples the second nodes of each of the loads together. The combined load signal includes components associated with each of the individual load signals, but with each of those components reflecting an effect of each load's characteristic(s).

The second nodes are nodes at which changes in the load signal are sensed. In separate sink and sense implementations, the sense nodes correspond to drive-nodes (e.g., nodes coupling the loads to a power source), while the first nodes correspond to sink-nodes (e.g., nodes coupling the loads to a power sink). In separate drive and sense implementations the second nodes correspond to sink-nodes, and the first nodes correspond to sink-nodes. Thus, in a separate sink and sense configuration, the common sense-node couples the second nodes of the loads to a power sink, while in a separate drive and sense configuration the common sense node couples the second nodes of the loads to a power source.

As illustrated by block 186, the combined load signal is regulated, based on an adjustment signal, to generate a regulated combined load signal. The regulated combined load signal is applied to a sense input of a comparison circuit. As illustrated by block 187, a comparison signal is applied to a comparison input of the comparison circuit, As illustrated by block 189, the comparison circuit generates the adjustment signal, which is used to regulate the combined load signal, based on a difference between the regulated combined load signal and the comparison signal. For example, when the comparison signal provides a comparison voltage, the voltage of the regulated combined load signal is compared to the comparison voltage, and the difference between the two is used to generate the adjustment signal.

The adjustment signal includes oscillating components associated with each of the different oscillating components of the regulated combined load signal. For example, if the regulated combined load signal includes a first oscillating component with a frequency at 1 kHz, a second oscillating component with a frequency of 2 kHz, and a third oscillating component with a frequency of 3 kHz, then the adjustment signal will have oscillating components corresponding to the three oscillating components of the regulated combined load signal. The amplitudes of each of the oscillating components reflect the effects of load characteristics associated with each of the individual loads.

As illustrated by block 191, characteristics of the plurality of different loads are determined based on the adjustment signal. For example, the 1 kHz, oscillating component, the 2 kHz oscillating component, and the 3 kHz oscillating component may each have different amplitudes. The amplitudes of the different oscillating components can be linked to particular load(s) (e.g., based on the frequency of the oscillating component of the power signal applied to particular loads), and the effect of each load on its corresponding oscillating component can be determined based on the amplitude of a particular oscillating component. In at least one embodiment, each of the oscillating components has the same waveform as the oscillating component of a corresponding power signal, but a different amplitude, where that amplitude is a function of an electrical characteristic of a load at a particular frequency.

In some implementations, a combined load characteristic representing a combination of the individual load characteristics of each of the loads can also be of interest, and can also be calculated based on the adjustment signal.

At least one embodiment includes a sensing circuit comprising: a plurality of loads including: first nodes coupled to a plurality of reference circuits and second nodes; second nodes coupled together to form a common sense-node; the plurality of reference circuits configured to apply power signals to the first nodes of the plurality of different loads to generate individual load signals that flow through the plurality of different loads, and wherein the individual load signals combine at the common sense-node to form a combined load signal; a regulation circuit coupled to the common sense-node, and configured to generate a regulated load signal by regulating the combined load signal; a comparison circuit configured to generate an adjustment signal based on a comparison of the regulated load signal and the reference signal, the comparison circuit including: a sense input coupled to the common sense-node and configured to receive the regulated load signal; a reference input coupled to receive a reference signal; and an output configured to generate an adjustment signal based on a difference between the regulated load signal and the comparison signal.

At least another embodiment includes: A method comprising: generating power signals using a plurality of power-signal reference circuits; applying the power signals to first nodes of a plurality of different loads, wherein: the plurality of different loads include first nodes and second nodes; the power signals generate individual load signals that flow between the first nodes and the second nodes of the plurality of different loads; and wherein the second nodes of the plurality of different loads are coupled to a common sense-node; generating a combined load signal at the common sense-node, wherein the combined load signal includes components associated with each of the individual load signals; sensing characteristics of the plurality of different loads at the common sense-node, wherein sensing the characteristic of the plurality of different loads includes: regulating the combined load signal, based on an adjustment signal, to generate a regulated combined load signal, wherein the regulated combined load signal is applied to the sense input of a comparison circuit; applying a comparison signal to a comparison input of the comparison circuit; generating, at an output of the comparison circuit, the adjustment signal based on a difference between the regulated load signal and the comparison signal; and determining the characteristics of the plurality of different loads based on the adjustment signal.

Figure 23:
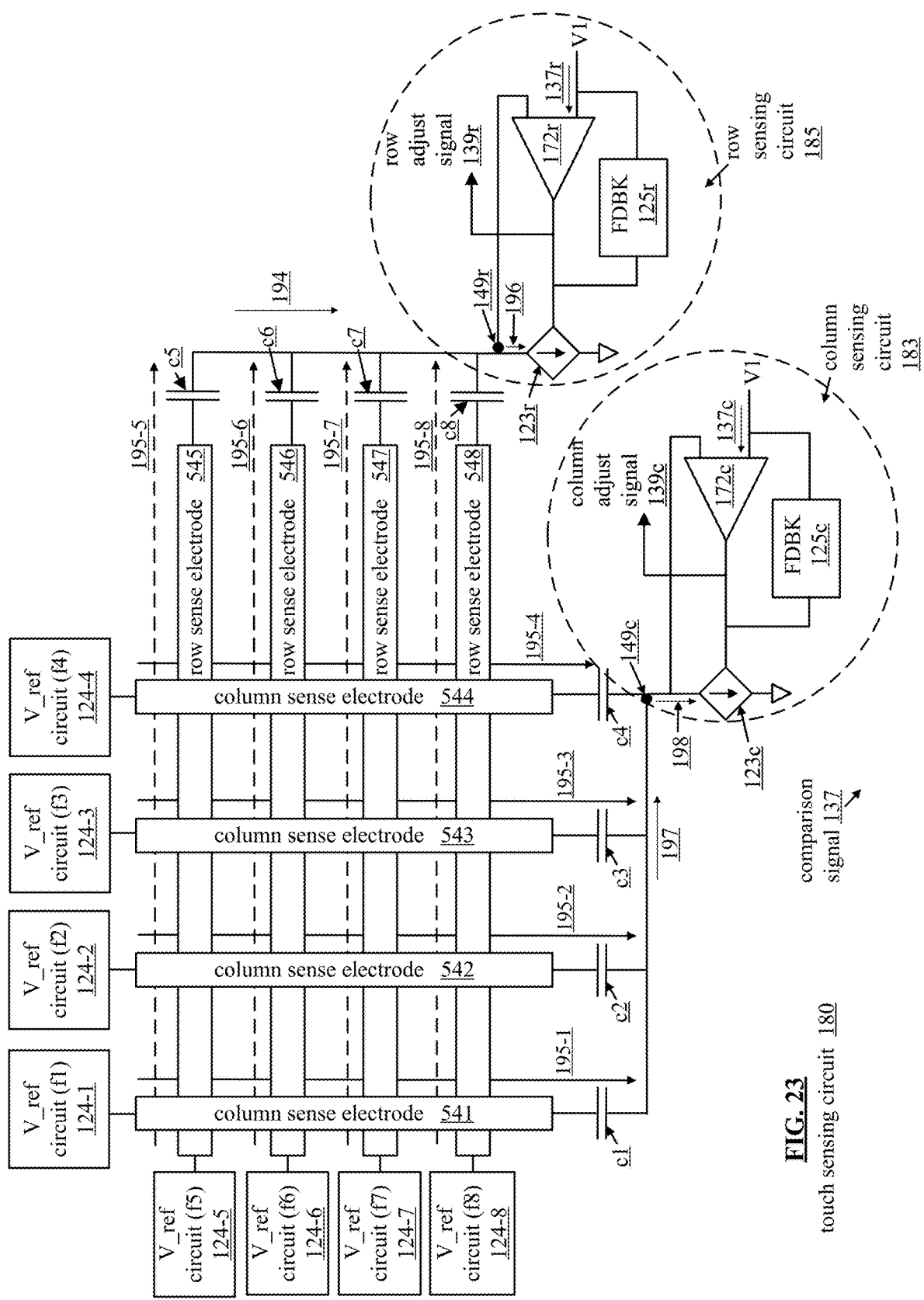
FIG. 23 is a schematic block diagram of a touch sensing circuit including a first common node for sensing changes in electrical characteristics of multiple row electrodes, and a second common node for sensing changes in electrical characteristics of multiple column electrodes, in accordance with various embodiments of the present invention.

Referring next to FIG. 23, a touch sensing circuit 180 including a first common node for sensing changes in electrical characteristics of multiple row electrodes, and a second common node for sensing changes in electrical characteristics of multiple column electrodes will be discussed in accordance with various embodiments of the present invention. In at least one embodiment, touch sensing circuit 180 is part of a touch screen display or touch sensitive panel, such as touch screen display 80 as shown and described with reference to FIG. 3, or touch screen display with sensors and actuators 90, as shown and discussed with reference to FIG. 4.

The touch sensing circuit 180 includes a column sensing circuit 183 and a row sensing circuit 185. The column sensing circuit 183 includes a column comparison circuit 172c having a comparison input coupled to receive a column comparison signal 137c, a sense input coupled to a common column-sense-node 149c and to a load signal input of column regulation circuit 123c. Column comparison circuit 172c also includes a comparison output coupled to a control input of column regulation circuit 123c to provide a column adjust signal 139c, where the column adjust signal 139c is used to control column regulation circuit 123c to regulate an electrical characteristic of a combined column load signal 197 to produce regulated column load signal 198. Optionally, the comparison output of the column comparison circuit 172c is also coupled to the comparison input of column comparison circuit 172c via feedback circuit 125c.

The common column-sense-node 149c of column sensing circuit 183 is coupled to sense nodes of each of the column sense electrodes 541, 542, 543, and 544. Drive nodes of the column sense electrodes 541, 542, 543, and 544 are coupled to corresponding reference circuits 124-1, 124-2, 124-3, and 124-4. Capacitors c1, c2, c3, and c4 represent the self-capacitance of column sense electrodes 541, 542, 543, and 544. Each of the column sense electrodes 541, 542, 543, and 544 and corresponding capacitors c1, c2, c3, and c4 are particular implementations of loads 31 illustrated in FIG. 20.

The row sensing circuit 185 includes a row comparison circuit 172r having a comparison input coupled to receive a row comparison signal 137r, a sense input coupled to a common row-sense-node 149r and to a load signal input of row regulation circuit 123r. Row comparison circuit 172r also includes a comparison output coupled to a control input of row regulation circuit 123r to provide a row adjust signal 139r, where the row adjust signal 139r is used to control row regulation circuit 123r to regulate an electrical characteristic of a combined row load signal 194 to produce regulated row load signal 196. Optionally, the comparison output of the row comparison circuit 172r is also coupled to the comparison input of row comparison circuit 172r via feedback circuit 125c.

The common row-sense-node 149r of row sensing circuit 185 is coupled to sense nodes of each of the row sense electrodes 545, 546, 547, and 548. Drive nodes of the row sense electrodes 545, 546, 547, and 548 are coupled to corresponding reference circuits 124-5, 124-6, 124-7, and 124-8. Capacitors c5, c6, c7, and c8 represent the self-capacitance of row sense electrodes 545, 546, 547, and 548. Each of the row sense electrodes 545, 546, 547, and 548 and corresponding capacitors c5, c6, c7, and c8 are particular implementations of loads 31 illustrated in FIG. 20.

In the illustrated embodiment, column sensing circuit 183 and row sensing circuit 185 each employ separate drive and sense configurations. When considered in independently of each other, column sensing circuit 183 and row sensing circuit 185 each function as described previously with reference to FIGS. 20 and 22 when implemented using separate drive and sense configurations, and as described previously with reference to FIGS. 21 and 22 when implemented using separate sink and sense configurations.

When considered together, as part of a touch sensing circuit 180, column sensing circuit 183 and row sensing circuit 185 provide additional, interrelated functionality. For example, the arrangement of column sense electrodes 541, 542, 543, 544 and row sense electrodes 545, 546, 547, 548 in an overlapping pattern establishes a mutual capacitance between particular row and column electrodes at overlapping intersections, allowing capacitive coupling of oscillating components of drive power signals applied to other electrodes into the load signal of any particular electrode.

For example, the load signal 195-1 flowing through column sense electrode 541 will include oscillating components generated by reference circuit 124-1, which is directly coupled to column sense electrode 541, and oscillating components generated by reference circuits 124-5, 124-6, 124-7, 124-8, which are capacitively coupled to column sense electrode 541 from row sense electrodes 545, 546, 547, 548. Each of these five oscillating components will be present in load signal 195-1, and combined column load signal 197. The oscillating components included in combined column load signal 197 will also be present in regulated column load signal 198, and will therefore be reflected in column adjust signal 139c. Due to coupling via mutual capacitance, oscillating components generated by each of the reference circuits 124-5, 124-6, 124-7, 124-8 will be included in load signals 195-2, 195-3, and 195-4, in addition to the oscillating components provided by directly coupled reference circuits 124-2, 124-3, and 124-4. In a similar manner, load signals 195-5, 195-6, 195-7, and 195-8, which flow through row sense electrodes 545, 546, 547, 548 will each include oscillating components generated by reference circuits 124-1, 124-2, 124-3, 124-4, in addition to the oscillating components provided by directly coupled reference circuits 124-5, 124-2, 124-3, and 124-4

In embodiments where the reference circuits coupled to row electrodes and reference circuits coupled to column electrodes include oscillating components having different frequencies, the column adjust signal, which represents the effect of load characteristics on a load signal, can be used to determine changes in the mutual and self-capacitances associated with one or more sense electrodes. The changes in the mutual and self-capacitances can be used in touch sensitive displays included in smart phones, tablets, e-readers, laptops, desktops, and computer displays, to determine a portion of the touch screen with which a user is interacting.

Figure 24:
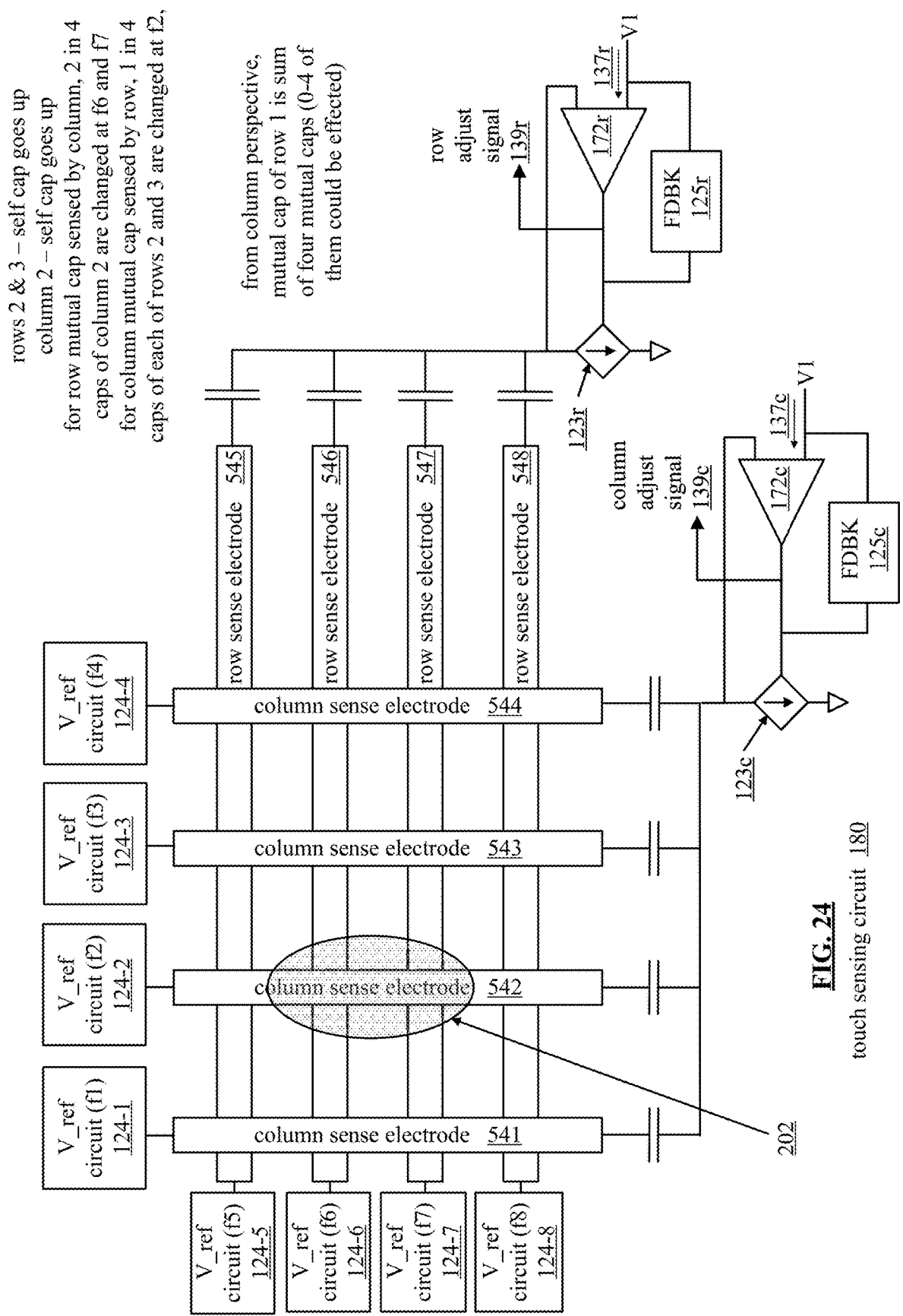
FIG. 24 is a schematic block diagram illustrating touch detection using the touch sensing circuit of FIG. 23, in accordance with various embodiments of the present invention.

Referring next to FIG. 24, touch detection using the touch sensing circuit 180 of FIG. 23 will be discussed in accordance with various embodiments of the present invention. The general functionality of touch sensing circuit 180 has been previously discussed with reference to FIG. 23. More specifics regarding the use of touch sensing circuit 180 for touch sensing are discussed below.

The following discussion assumes a touch area 202. Touch area 202 illustrates an area of a touch screen affected by a capacitance of an object in proximity to the touch screen. The object can be, for example, a human finger, a stylus, or some other object. In some use cases the object provides a capacitive path to ground, so the object provides what is referred to herein as a "grounded touch." In grounded touch cases, the self-capacitance of an electrode in touch are 202 will increase, and the mutual capacitance between electrodes in touch area 202 decreases. In cases where the object's touch does not provide a capacitive path to ground, the object provides what is referred to herein as an "ungrounded touch." In an ungrounded touch case, the self-capacitance of electrodes in touch area 202 does not change, and mutual capacitances decreases.

In a specific example of operation in a grounded touch case. Touch area 202 represents an area of capacitive coupling caused by a person's finger. The capacitive coupling in touch area 202 affects column sense electrode 542, and row sense electrodes 546 and 547. Note that two mutual capacitance nodes are formed by the electrodes within touch area 202. A first node is formed between sense electrode 542 and sense electrode 546, and a second node is formed between sense electrode 542 and sense electrode 547.

The touch illustrated in FIG. 24 causes the self-capacitances of column sense electrode 542 and row sense electrodes 546 and 547 to increase. The increases in self capacitance of these three electrodes is represented in corresponding adjust signals. In at least one embodiment, a change in magnitude of an oscillating component corresponding to the oscillating component generated by reference signal 124-1 is present in column adjust signal 139c, and indicates changes in the self-capacitance of column sense electrode 542. Similarly, row adjust signal 139r includes oscillating components corresponding to oscillating components generated by reference signals 124-6 and 124-7. The oscillating component corresponding to reference signal 124-6 indicates changes in the self-capacitance of row sense electrode 546, and the oscillating component corresponding to reference signal 124-7 indicates changes in the self-capacitance of row sense electrode 546.

In addition to the oscillating component corresponding to the oscillating component generated by reference signal 124-1, column adjust signal 139c includes oscillating components associated with row sense electrodes 546 and 547 through mutual capacitive coupling present at the first and second node. Thus, column adjust signal 139c includes oscillating components of the signals passing through row sense electrodes 546 and 547. As a result, column adjust signal 139c includes at least three oscillating components: 1) a first oscillating component indicating changes in self-capacitance of column sense electrode 542; 2) a second oscillating component indicating changes in the mutual capacitance between column sense electrode 542 and row sense electrode 546; and 3) a third oscillating component indicating changes in the mutual capacitance between column sense electrode 542 and row sense electrode 547. In various different operating scenarios, column adjust signal 139c can include components from any or all of the reference circuits. Components from reference circuits 124-5 through 124-8 included in column adjust signal 139c will be interpreted as mutual capacitance contributions. The above assumes that the magnitude of the oscillating components contributed by mutual capacitances between column sense electrode 542 and row sense electrodes 545 and 548 are zero, or negligible, although functionality is not diminished if those components are non-negligible.

Similarly, row adjust signal 139r includes at least four oscillating components: 1) a first oscillating component indicating changes in self-capacitance of row sense electrode 546; 2) a second oscillating component indicating changes in self-capacitance of row sense electrode 546; 3) a third oscillating component indicating changes in the mutual capacitance between row sense electrode 546 and column sense electrode 542; and 4) a fourth oscillating component indicating changes in the mutual capacitance between row sense electrode 547 and column sense electrode 542. The above assumes that the magnitude of the oscillating components contributed by mutual capacitances between the row sense electrodes 545 and 548 and other column sense electrodes 541, 543, and 544 are zero, or otherwise negligible, although functionality is not diminished if those components are non-negligible. In various different operating scenarios, row adjust signal 139r can include components from any or all of the reference circuits. Components from reference circuits 124-1 through 124-4 included in row adjust signal 139r will be interpreted as mutual capacitance contributions.

The various components included in the row adjust signal 139r and the column adjust signal 139c are filtered, and sent to filter and processing circuitry, where the oscillating components are separated and analyzed to identify capacitance changes. The touch location can be identified based on various combinations of mutual and self-capacitance. For example, touch area 202 will produce a change in the self-capacitance of column sense electrode 542, but not column sense electrodes 541, 543, and 544. Thus, any mutual capacitance contributions from reference circuits 124-5, 124-6, 124-7, and 124-8 will be interpreted as coming from column sense electrode 542. Thus, from the perspective of the column adjust signal 139c, the self-capacitance can be used to determine a horizontal location component, while the mutual capacitances can be used to determine vertical location components.

Continuing with the above example, touch area 202 will produce a change in the self-capacitance of row sense electrodes 546 and 547, but not row sense electrodes 545 and 548. Thus, any mutual capacitance contributions from reference circuits 124-1, 124-2, 124-3, and 124-4 will be interpreted as coming from both row sense electrodes 546 and 547. Thus, from the perspective of the row adjust signal 139r, the self-capacitance can be used to determine vertical location components, while the mutual capacitances can be used to determine horizontal location components.

When information from the row and column adjust signals are combined, the touch location can be determined to an even greater level of confidence or granularity. However, in various implementations a touch location can be determined using the row adjust signal individually, the column adjust signal individually, or both the row and column adjust signals.

Figure 25:
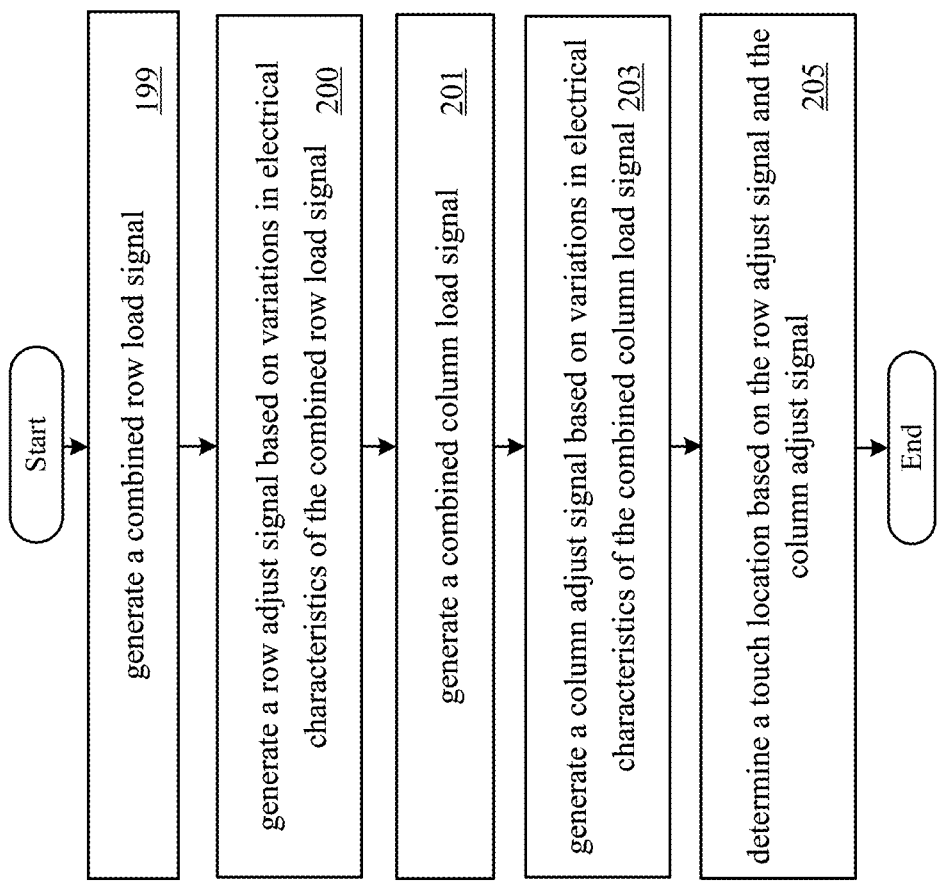
FIG. 25 is a flow diagram illustrating a method of determining a touch location based on a combined row load signal and a combined column load signal, in accordance with various embodiments of the present invention.

Referring next to FIG. 25, a method of determining a touch location based on combined row load signals and combined column load signals will be discussed in accordance with various embodiments of the present disclosure. Various implementations of the illustrated method can be performed using embodiments of the circuitry illustrated in FIGS. 20, 21, 23, and 24.

As illustrated by block 199, a combined row load signal is generated. The combined row load signal includes components from load signals flowing through each of the row electrodes. These components reflect the effects that each of the row electrodes has on a power signal applied to first nodes of each of the row electrodes. The components can include, for example, oscillating components having various different frequencies. For example, a power signal applied to a first node of a first row electrode causes a first row load signal to flow through the first row electrode. The first row electrode has a characteristic that affects an electrical characteristic of the first row load signal, and the effect of the first row electrode on the first row load signal can be sensed at a second node of the first row electrode. In a particular example, an impedance (electrical characteristic) of the first row electrode reduces the amplitude (electrical characteristic) of an oscillating component of a row load signal as the signal flows between the first and second node of the first row electrode. Variations in an electrical characteristic of the row electrode, for example changes in capacitance caused by a touch, cause variations in the effect of the row electrode on its load signal. These variations can, but need not be, frequency sensitive, so that the same change in capacitance will have greater or lesser effect depending on the frequency components of the load signal flowing through the row electrode.

A similar process occurs for each of the row electrodes, whose second nodes are coupled together to form a common sense-node. When each of the row electrodes is associated with a different frequency oscillation, a combined row load signal includes multiple different oscillating components, each with potentially different amplitudes based on the effect of the row electrodes on their corresponding row load signals. In at least some embodiments, each of the row load signals includes oscillating components associated with both self-capacitance and mutual capacitances associated with a particular row electrode.

As illustrated by block 200, a row adjust signal is generated based on variations in electrical characteristics of the combined row load signal. The row adjust signal includes oscillating components used to regulate a second electrical characteristic of each of the combined row load signals to attempt to maintain the first electrical characteristic at a constant value. For example, a voltage of the combined row load signal (first electrical characteristic) can be used to regulate the current (second electrical characteristic) of the combined row load signal. The amount by which the current needs to be adjusted to maintain the voltage at a particular value indicates variations in the voltage of the combined row load signal. In this example, the voltage of the combined row load signal is a function of the voltages of each of the oscillating components.

As illustrated by block 201 a combined column load signal is generated as discussed above, except using column electrodes. As illustrated by block 203 a column adjust signal is generated based on variations in electrical characteristics of the combined column row signal.

As illustrated by block 205, a touch location is determined based on the row adjust signal and the column adjust signal. In various implementations, identifying the touch location includes, but is not limited to filtering the row and column adjust signals, matching frequency components to particular electrodes, determining variations in the electrical characteristics (e.g. self-capacitance and mutual capacitance) of each row and column electrode based on the filtered row/column adjust signals, and determining a touch location based on a magnitude of the variations in the electrical characteristics of particular row/column electrodes.

Various implementations of a touch-sensitive panel include: a first plurality of reference circuits coupled through a plurality of touch-sensitive row electrodes to a first common sensing node, wherein the plurality of touch-sensitive row electrodes are associated with capacitance values; the first plurality of reference circuits configured to drive the plurality of touch-sensitive row electrodes to generate a row signal at the first common sensing node, wherein a value of a first electrical characteristic of the row signal varies in response to changes in the capacitance values of the plurality of touch-sensitive row electrodes, and a first sensing circuit coupled to the first common sensing node.

The first sensing circuit is configured to generate a row adjust signal based on variances in the value of the first electrical characteristic, and includes: a first regulation circuit coupled to the first common sensing node, and configured to generate a regulated row signal by regulating a second electrical characteristic of the row signal; a comparison circuit including: a first reference input configured to receive a first reference signal establishing a first reference value of the second electrical characteristic; a first sense input coupled to the first common sensing node and configured to receive the regulated row signal; a first output coupled to the first regulation circuit and configured to output the row adjust signal; a second plurality of reference circuits coupled through a plurality of touch-sensitive column electrodes to a second common sensing node, wherein the plurality of touch-sensitive column electrodes are associated with capacitance values; the second plurality of reference circuits configured to drive the plurality of touch-sensitive column electrodes to generate a column signal at the second common sensing node, wherein a value of the first electrical characteristic of the column signal varies in response to changes in the capacitance values of the plurality of touch-sensitive column electrodes; and a second sensing circuit coupled to the second common sensing node, the second sensing circuit configured to generate a column adjust signal based on variances in the value of the first electrical characteristic.

The second sensing circuit includes: a second regulation circuit coupled to the second common sensing node, and is configured to generate a regulated column signal by regulating a second electrical characteristic of the column signal; a comparison circuit including: a second reference input configured to receive a second reference signal establishing a second reference value of the second electrical characteristic; a second sense input coupled to the second common sensing node and configured to receive the regulated column signal; and a second output coupled to the second regulation circuit and configured to output the column adjust signal.

In some embodiments, a touch sensitive panel comprises: a plurality of row electrodes and a plurality of column electrodes arranged in an overlapping pattern, wherein capacitances of the plurality of row electrodes and the plurality of column electrodes change in response to touches, and wherein: the plurality of row electrodes are driven by a first plurality of voltage reference circuits coupled to first portions of the plurality of row electrodes, and changes in capacitances of the row electrodes are sensed at a first common sense-node coupling second portions of the plurality of electrodes; and the plurality of column electrodes are driven by a second plurality of voltage reference circuits coupled to first portions of the plurality of column electrodes, and changes in capacitances of the plurality of column electrodes are sensed at a first common sense-node coupling second portions of the plurality of electrodes.

A method according to at least one embodiment includes: generating a combined row signal by applying first individual power signals to first nodes of a plurality of row electrodes, wherein first individual power signals flow between the first nodes of the plurality of row electrodes and second nodes of the plurality of row electrodes, and wherein the second nodes of the plurality of row electrodes are coupled to a common row sense node; generating a row adjust signal based on variations in electrical characteristics of the combined row signal, wherein the row adjust signal indicates changes in the electrical characteristic of the plurality of different row electrodes; generating a combined column signal by applying second individual power signals to first nodes of a plurality of column electrodes, wherein second individual power signals flow between the first nodes of the plurality of column electrodes and second nodes of the plurality of column electrodes, and wherein the second nodes of the plurality of column electrodes are coupled to a common row sense node; generating a column adjust signal based on variations in electrical characteristics of the combined column signal, wherein the column adjust signal indicates changes in the electrical characteristics of the plurality of different column electrodes; and determining a touch location based on the row adjust signal and the column adjust signal.

In at least one embodiment, the method includes generating the row adjust signal by comparing a value of a first electrical characteristic of the combined row signal to a reference value; and regulating a second electrical characteristic of the combined row signal based on the row adjust signal. In a particular example, the first individual power signals include different oscillating components; and the row adjust signal includes oscillating components associated with each of the first individual power signals. The row adjust signal is filtered to isolate a particular oscillating component; and change in the capacitance of a particular row electrode is determined based on an amplitude and a frequency of the particular oscillating component.

A combined row signal includes first frequency components associated with the plurality of row electrodes, wherein the first frequency components relate to self-capacitances of the plurality of row electrodes; and second frequency components associated with the plurality of column electrodes, wherein the first frequency components relate to mutual capacitances between the plurality of row electrodes and the plurality of column electrodes. The combined row signal and the combined column signal, based on an adjustment signal, to generate a regulated combined load signal. Regulated combined load signals, whether column or row, are applied to the sense input of a comparison circuit, and used to generate a column (row) adjustment signal based on a difference between the regulated load signal and the comparison signal. The characteristics of the plurality of different loads can be determined based on the adjustment signal.

Another embodiment of a method comprises: generating a row adjust signal including first frequency components and second frequency components, wherein the first frequency components included in the row adjust signal are associated with self-capacitances of row electrodes and the second frequency components included in the row adjust signal are associated with mutual capacitances between the row electrodes and column electrodes; generating a column adjust signal including the first frequency components and the second frequency components, wherein the second frequency components included in the column adjust signal are associated with self-capacitances of the column electrodes and the first frequency components included in the column adjust signal are associated with mutual capacitances between the column electrodes and the row electrodes; determining self-capacitances and mutual capacitances attributable to particular row electrodes and column electrodes based on the first frequency components and the second frequency components; and determining a location of a touch based on the self-capacitances and mutual capacitances based on the self-capacitances attributable to the particular row electrodes and column electrodes. The self-capacitances and mutual capacitances attributable to particular row and column electrodes can include filtering the column and row adjust signals, as discussed in greater detail below.

Figure 26:
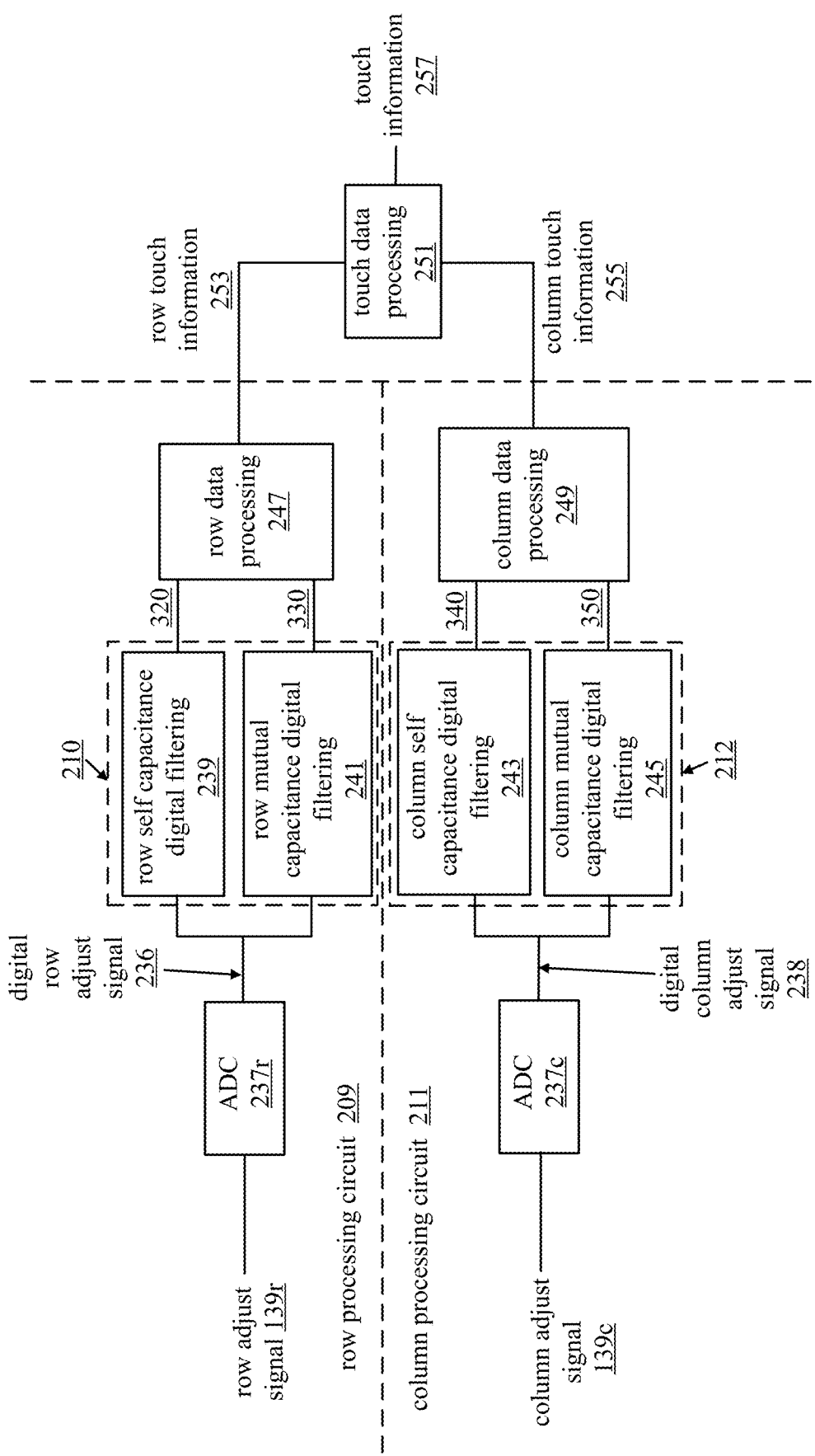
FIG. 26 is a schematic block diagram illustrating an adjust signal processing circuit, in accordance with various embodiments of the present invention.

Referring next to FIG. 26, an adjust signal processing circuit 207 will be discussed in accordance with various embodiments of the present invention. Adjust signal processing circuit 207 includes row filter circuit 209 and column filter circuit 211, and touch data processing module 251. Row filter circuit 209 includes row analog-to-digital-converter (ADC) 237r, row mutual capacitance digital filtering module 241, column self-capacitance digital filtering module 243 and row data processing module 247. Column filter circuit 211 includes column analog-to-digital-converter (ADC) 237c, row self-capacitance digital filtering module 239, column mutual capacitance digital filtering module 245, and column data processing module 249.

Row ADC 237r and column ADC 237c can be implemented as a flash ADC, a successive approximation ADC, a ramp-compare ADC, a Wilkinson ADC, an integrating ADC, a delta encoded ADC, and/or a sigma-delta ADC.

The digital filtering modules, e.g. row mutual capacitance digital filtering module 241, column self-capacitance digital filtering module 243 row self-capacitance digital filtering module 239, and column mutual capacitance digital filtering module 245 can be implemented using various types of digital filters including, but not limited to, cascaded integrated comb (CIC) filters, finite impulse response (FIR) filters, infinite impulse response (IIR) filters, Butterworth filters, Chebyshev filters, elliptic filters, etc., multiple drive-sense circuits (DSCs) 28. Any or all of the digital filters can be implemented with adjustable response characteristics that can be varied to allow processing of signals in series or parallel, or using filter circuitry having response characteristics dedicated to particular frequencies.

In at least one embodiment, the digital filtering modules implement bandpass filters that pass substantially unattenuated signals in a bandpass region (e.g., tens of Hertz to hundreds of thousands of Hertz, or more) centered about frequency f1, and attenuates signals outside of the bandpass region. As such, the digital filtering modules pass the portion of the digital adjustment signals that correspond to self-capacitance of a particular electrode, or to mutual capacitances of that particular electrode with other electrodes.

Row data processing module 247 and column data processing module 249 can be implemented as separate processing modules, or as portions of a single processing module, programmed to convert filtered capacitance data into actual capacitance value, a relative capacitance values (e.g., in a range of 0-100), or a difference capacitance value (e.g., the difference between a default capacitance value and a sensed capacitance value). As another example, row data processing module 247 and column data processing module 249 can be implemented as look-up tables.

For example, an individual instance of filtered capacitance data is associated with a particular frequency, where other frequencies have been removed or attenuated by filtering. Row data processing module 247 or column data processing module 249 use the frequency of the filtered capacitance data to identify one or more electrodes associated with that particular frequency. In at least one embodiment, the processing data modules can differentiate between self-capacitance signals and mutual capacitance signals based on the data lines from which the signals are received. For example, if a processing data module receives data on a line coupled to a self-capacitance filtering module, the processing data module knows that the filtered data represents self-capacitance data. Similarly, if a processing data module receives data on a line coupled to a mutual capacitance filtering module, the processing data module knows that the filtered data represents mutual capacitance data.

The processing data module can use a lookup table to determine which frequencies are associated with which electrodes, and use the frequency of the filtered capacitance data, along with the information in the lookup table, to identify which electrode (in the case of self-capacitance), or which combination of electrodes (in the case of mutual capacitance) is associated with the filtered capacitance data.

The amplitude of the filtered capacitance data indicates a capacitance value of the electrode(s) associated with the filtered capacitance data, either as an actual value, or as a change in value, depending on the implementation. Where the filtered capacitance data indicates an actual value, a change in value can be determined by comparing an actual value, determined from the filtered capacitance data, to a "base" or "expected" capacitance value of the electrode obtained from a lookup table.

In an example of operation, row analog-to-digital-converter (ADC) 237r receives row adjust signal 139r, and digitizes row adjust signal 139r to generate digital row adjust signal 236. Row adjust signal 139 r includes oscillating components contributed by multiple row electrodes, and oscillating components contributed by any particular electrode can include frequency components associated with both self-capacitance and mutual capacitances. Digital row adjust signal 236 includes the same oscillating components included in row adjust signal 139r.

Digital row adjust signal 236 is coupled to both row self-capacitance digital filtering module 239, and row mutual capacitance digital filtering module 241. Row self-capacitance digital filtering module 239 filters frequencies associated with row electrodes, and row mutual capacitance digital filtering module 241 filters frequencies associated with column electrodes. These frequencies associated with column electrodes are capacitively coupled to the row electrodes through mutual capacitance, and therefore when frequency components associated with columns appear in the digital row adjust signal 236, those frequencies can be attributed to mutual capacitance between a particular row electrode and a particular column electrode.

Row self-capacitance digital filtering module 239 generates filtered row self-capacitance data 320, and row mutual capacitance digital filtering module 241 generates filtered row mutual capacitance data 330. Filtered row self-capacitance data 320 and filtered row mutual capacitance data 330 are provided to row data processing module 247, which uses that data to generate row touch information 253. Row touch information 253 includes capacitance information associated with each of the row electrodes that contribute oscillating components, including oscillating components associated with mutual capacitances between the row electrodes and the column electrodes.

Consider the touch example illustrated in FIG. 24, and assume that reference circuit 124-1 generates a signal having a frequency f1, reference circuit 124-2 generates a signal having a frequency f2, reference circuit 124-3 generates a signal having a frequency f3, reference circuit 124-4 generates a signal having a frequency f4, reference circuit 124-5 generates a signal having a frequency f5, reference circuit 124-6 generates a signal having a frequency f6, reference circuit 124-7 generates a signal having a frequency f7, reference circuit 124-8 generates a signal having a frequency f8. The self-capacitances of row sense electrodes 546 and 547 are affected by a capacitive touch in touch area 202. A change in self-capacitance associated with row sense electrode 546 will cause a change in the oscillating component having frequency f6, and a change in the self-capacitance of row sense electrode 547 will cause a change in the oscillating component having frequency f7. The changes in the oscillating components having frequencies f6 and f7 will be included in row adjust signal 139r, and in digital row adjust signal 236. Row self-capacitance digital filtering module 239 will filter digital row adjust signal 236 to isolate the oscillating components associated with each of the two frequencies f6 and f7, and digital data indicating self-capacitances (e.g., signal amplitudes) associated with each of those two frequencies will be included in the filtered row self-capacitance data 320.

Continuing with the previous example, the row adjust signal 139r will also include oscillating components having a frequency f2. The oscillating components f2 are contributed to row adjust signal 139r through mutual capacitance between row sense electrode 546 and column sense electrode 542, and through mutual capacitance between row sense electrode 547 and column sense electrode 542.

Changes in mutual capacitance associated with row sense electrodes 546 and 547 will, in this example, both result in a change in the oscillating component having frequency f2, which will be included in row adjust signal 139r and in digital row adjust signal 236. Row mutual capacitance digital filtering module 241 will filter digital row adjust signal 236 to isolate the oscillating components associated with frequency f2, and digital data indicating mutual capacitances (e.g., signal amplitudes) associated with frequency f2 will be included in the filtered row mutual capacitance data 330.

Row data processing module 247 uses filtered row self-capacitance data 320 and filtered row mutual capacitance data 330 to link, or otherwise associate signal values associated with frequencies f6, f7, and f2 with the self and/or mutual capacitances of row sense electrodes 546 and 547. More specifically, signal values having a frequency f6 will be attributed to the self-capacitance of row sense electrode 546, signal values associated with frequency f7 will be attributed to the self-capacitance of row sense electrode 546, and signal values associated with frequency f2 will be attributed to the mutual capacitance of both row sense electrodes 546 and 547. Note that in at least some embodiments, signal values attributable to row sense electrodes 546 and 547 are not distinguishable based only on row adjust signal 139r, but information needed to distinguish between the f2 frequency component contributed by row sense electrode 546 and row sense electrodes 547 can be obtained from column adjust signal 139c.

The output of row data processing module 247 is row touch information 253. In various embodiments, row touch information 253 includes, but is not limited to, one or more of capacitance information (e.g., self-capacitance, mutual capacitance, change in capacitance, location of the electrodes or nodes having a capacitance change, etc.), ratios, frequency information, amplitude information, phase shift information, frequency shift information, information linking locations of electrodes or nodes to touch screen locations, frequency association information (e.g., which electrodes and nodes are associated with which frequencies), or the like.

Still continuing with the previous example, the self-capacitance of column sense electrode 542 is affected by a capacitive touch in touch area 202. A change in self-capacitance associated with column sense electrode 542 will cause a change in the oscillating component having frequency f2. The changes in the oscillating component having frequency f2 will be included in column adjust signal 139*c*, and in digital column adjust signal 238. Column self-capacitance digital filtering module 243 will filter digital row adjust signal 236 to isolate the oscillating components associated with frequency f2, and digital data indicating self-capacitances (e.g., signal amplitudes) associated with frequency f2 will be included in the filtered column self-capacitance data 340.

The column adjust signal 139*c* will also include oscillating components having a frequencies f6 and f7. Frequency f6 is included in column adjust signal 139*c* through mutual capacitance between column sense electrode 542 and row sense electrode 546. Frequency f7 is included in column adjust signal 139*c* through mutual capacitance between column sense electrode 542 and row sense electrode 547.

Row mutual capacitance digital filtering module 241 will filter digital column adjust signal 238 to isolate the oscillating components associated with frequencies f6 and f7, and digital data indicating mutual capacitances (e.g., signal amplitudes) associated with frequencies f6 and f7 will be included in the filtered column mutual capacitance data 350.

Column data processing module 249 uses filtered column self-capacitance data 340 and filtered row mutual capacitance data 330 to link, or otherwise associate signal values associated with frequencies f6, f7, and f2 with the self and/or mutual capacitances of column sense electrode 542. More specifically, signal values having a frequency f2 will be attributed to the self-capacitance of column sense electrode 542, signal values associated with frequency f6 will be attributed to the mutual capacitance between column sense electrode 542 and row sense electrode 546, and signal values associated with frequency f7 will be attributed to the mutual capacitance between column sense electrode 542 and row sense electrode 547.

In at least one embodiment, the amplitude of the frequency components f6 and f7 vary depending on how close the touch is to the intersection, or node, defined by column sense electrode 542 and row sense electrodes 546 and 547, with greater changes in mutual capacitance occurring as the touch gets closer to the node. In the illustrated embodiment, the information about the magnitude of mutual capacitance changes included in the column adjust signal 139*c* can be used to augment mutual capacitance information included in the row adjust signal 139*r*. Thus, even though the amplitude of the f2 frequency component in the row adjust signal 139*r* may not be able to distinguish which row electrode contributed the f2 component, the amount of capacitive coupling indicated by differences in the mutual capacitances of the f6 and f7 components in the column adjust signal 139*c* can be used as an indication of how much capacitive coupling is occurring at a particular node, and that information can be used to form a ratio, which when applied to the f2 component present in the row adjust signal 139*r* can be used to determine how much of the f2 component was contributed by each of the row electrodes.

The output of column data processing module 249 is column touch information 255. In various embodiments, column touch information 255 includes, but is not limited to, one or more of capacitance information (e.g., self-capacitance, mutual capacitance, change in capacitance, location of the electrodes or nodes having a capacitance change, etc.), ratios, frequency information, amplitude information, phase shift information, frequency shift information, information linking locations of electrodes or nodes to touch screen locations, frequency association information (e.g., which electrodes and nodes are associated with which frequencies), or the like.

A touch data processing module 251 e.g., a touch screen processing module 82 (FIGS. 3, 4), a sensed data processing module 65 (FIGS. 5A, 5B, 5C), or a processing module/unit 42 (FIGS. 5D, 5E), receives row touch information 253 and column touch information 255, and outputs touch information 257. The touch information 257 can include, but is not limited to, information indicating a location of a touch, a duration of a touch, a movement of a touch (e.g., a swipe). In addition, touch information 257 can include, but is not limited to, information similar to that included in row touch information 253 and column touch information 255. In some embodiments, touch information can be an aggregate of row touch information 253 and column touch information 255, but at least one embodiment performs additional processing and correlation to produce more fully processed touch information.

Figure 27:
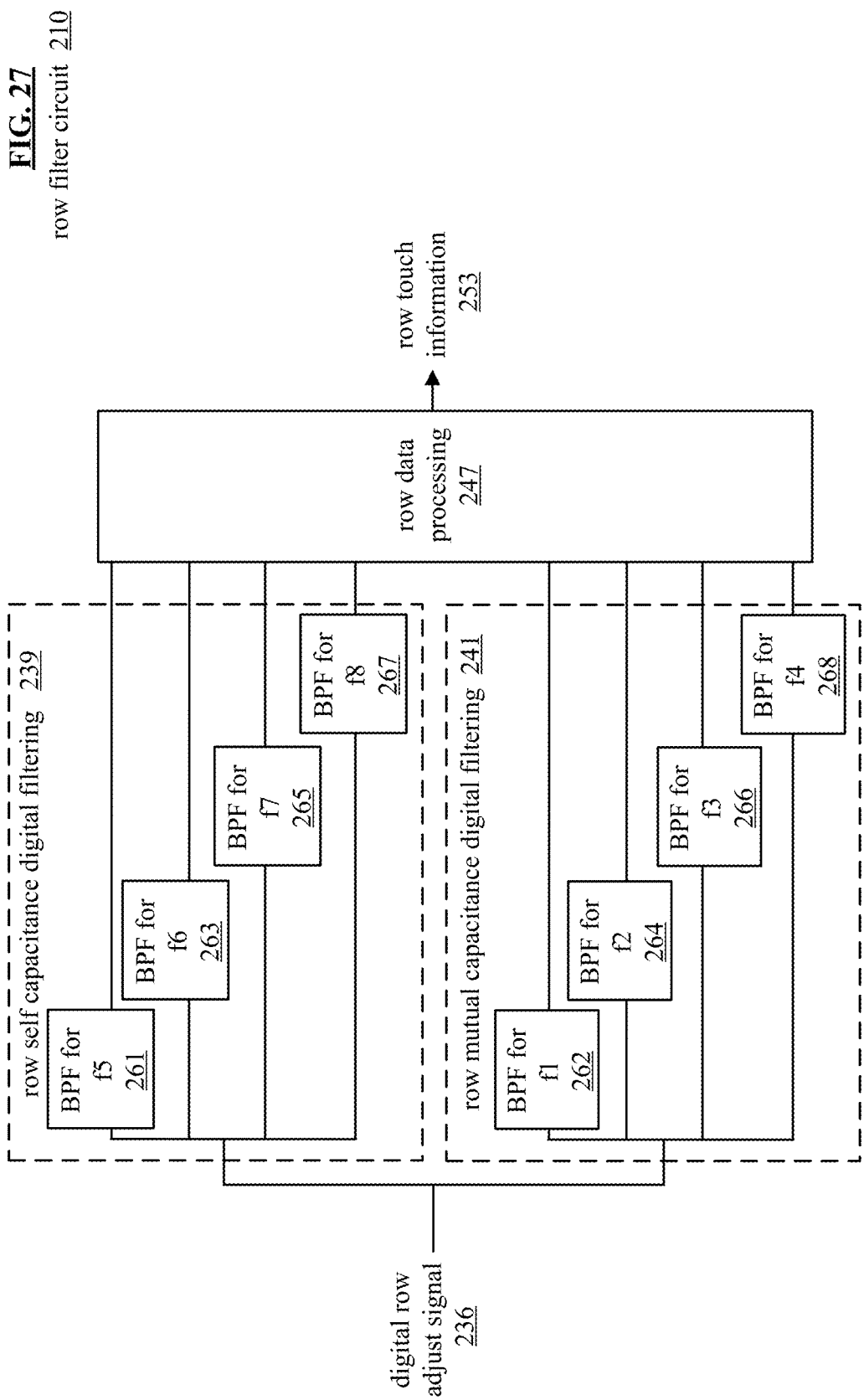
FIG. 27 is a schematic block diagram illustrating a row filter circuit, in accordance with various embodiments of the present invention.

Referring next to FIG. 27, a row filter circuit 210 will be discussed in accordance with various embodiments of the present invention. The row filter circuit 210 includes a row self-capacitance digital filtering module 239 and a row mutual capacitance digital filtering module 241, each of which includes an input coupled to receive a digital row adjust signal 236. Row self-capacitance digital filtering module 239 and row mutual capacitance digital filtering module 241 each include four outputs coupled to row data processing module 247. Each of the eight outputs corresponds to one of the eight reference circuits shown in FIG. 24. Because each of the reference circuits provides a power signal having an oscillating component of a particular frequency to a particular row or column electrode, self-capacitances attributable to individual row electrodes, and mutual capacitances attributable to nodes formed between combinations of row and column electrodes, can be isolated and extracted from the digital row adjust signal 236.

The following description uses touch sensing circuit 180 (FIG. 24) as an example, but implementations including more, or fewer column or row electrodes are contemplated. Furthermore, electrode arrangements other than a simple grid arrangement can also be used. In various embodiments, the signal output by each bandpass filter represents a filtered capacitance value. For example, a touch in touch area 202 changes the self-capacitance of row sense electrode 546. As discussed previously with respect to FIG. 24, that change in capacitance causes a change in an oscillating component of a power signal having frequency f6, and that change causes an oscillating component indicative of the change in capacitance to be included in row adjust signal 139*r*. The oscillating component indicative of the change in capacitance is also present in digital row adjust signal 236, as shown in FIG. 26. The oscillating component indicative of the change in capacitance is filtered by row self-capacitance digital filtering module 239, and more specifically by bandpass filter 263 Thus, filtered digital data is referred to as a "filtered capacitance value," because the filtered digital data indicates, for example, a capacitance or a change in capacitance.

Row self-capacitance digital filtering module 239 includes bandpass filter 261 tuned to the frequency f5 associated with row electrode 545, bandpass filter 263 tuned to the frequency f6 associated with row electrode 546, bandpass filter 265 tuned to the frequency f7 associated with row electrode 547, and bandpass filter 267 tuned to the frequency f8 associated with row electrode 548. The output of each of the bandpass filters 261, 263, 265, and 267 represents a self-capacitance associated with a particular row electrode, and is provided to row data processing module 247 for processing and analysis.

Row mutual capacitance digital filtering module 241 includes bandpass filter 262 tuned to the frequency f1 associated with column electrode 541, bandpass filter 264 tuned to the frequency f2 associated with column electrode 542, bandpass filter 266 tuned to the frequency f3 associated with column electrode 543, and bandpass filter 268 tuned to the frequency f4 associated with column electrode 544. The output of each of the bandpass filters 262, 264, 266, and 268 represents an aggregate mutual-capacitance associated with a single column electrode. For example, the output of bandpass filter 264, which is tuned to frequency f2, is associated with column sense electrode 542. But the output of bandpass filter 264 includes mutual capacitance signals attributable to includes mutual capacitance signals (if any) attributable to all of the column sense electrodes. In this particular embodiment, it includes mutual capacitance signals attributable to both row sense electrode 546 and row sense electrode 547, but the change in mutual capacitance is not apportioned individually to each of the row electrodes. Each of the outputs is provided to row data processing module 247 for processing and analysis.

The bandpass filters can be implemented as cascaded integrated comb (CIC) filters, finite impulse response (FIR) filters, infinite impulse response (IIR) filters, Butterworth filters, Chebyshev filters, elliptic filters, or the like. In various embodiments, the frequency response of one or more of the bandpass filters can be programmed to account for environmental variables, e.g., temperature fluctuations; electrode characteristics; signal frequencies, or the like.

In at least one embodiment, row data processing module 247 receives the outputs of each of the bandpass filter outputs, and converts the filtered capacitance data into actual capacitance value, a relative capacitance values (e.g., in a range of 0-100), or a difference capacitance value (e.g., the difference between a default capacitance value and a sensed capacitance value). In other embodiments, row data processing module 247 performs only minimal processing to aggregate the filter outputs associated with row self-capacitances and aggregate mutual capacitances, formats the information, and transmits the formatted information to another processing module for further processing. Even in embodiments in which more complete processing is performed, row data processing module 247 various embodiments formats the information for transmission to another processing module for additional processing.

Formatting the information can include, but is not limited to, generating data packets to transmit via a Universal Serial Bus (USB) communication link, a Transmission Control Protocol/Internet Protocol (TCP/IP) packets, organizing data into a predetermined order for serial transmission via a stream pipe, storing data in a queue, placing the data on multiple parallel data lines of a bus, or the like.

In various embodiments row data processing module 247 processes the outputs of the bandpass filters by converting the filtered capacitance values based on an amplitude of the oscillating components that pass through the respective bandpass filters, associating outputs of the individual bandpass filters with particular row or column electrodes, and generating additional data that specifying that association. The association can be made, in some cases, based on the line on which a filtered signal is received. For example, the output of bandpass filter 261 is received on a first line, the output of bandpass filter 263 is received on a second line, and so on. Those connections can be static, so that they do not change over time. Thus, row data processing module 247 knows that any a signal received on the first line coupled to bandpass filter 261 will always be associated with row sense electrode 545. Row data processing module can append, prepend, generate a packet, or otherwise associate data indicating that the data incoming to row data processing module 247 on the first line is associated with row sense electrode 545. A frequency associated with the filtered signal from bandpass filter 261 can be identified using the same technique, and frequency identification data can be associated with the data incoming to row data processing module 247 on the first line.

In some embodiments, associations can be established based on lookup tables associating particular frequencies with particular sense electrodes. The lookup tables can also include information associating values of one or more oscillating signal characteristics with capacitance values or changes in capacitance values. For example, an amplitude change (e.g., from 0.02 mV to 0.01 mV) of an oscillating component having a frequency of f8 can be associated with a specific change in capacitance (e.g., −0.01 pF).

Figure 28:
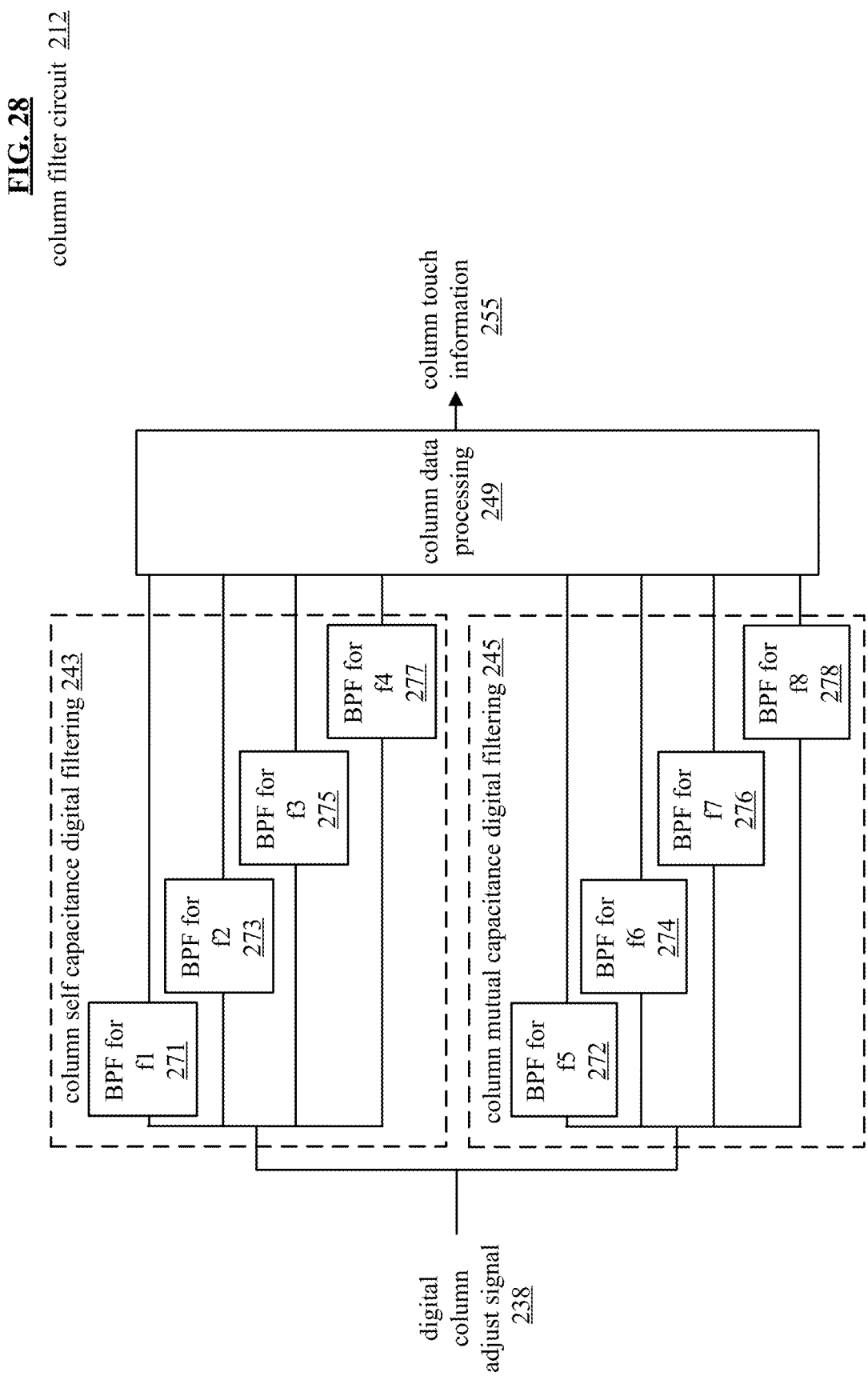
FIG. 28 is a schematic block diagram illustrating a column filter circuit, in accordance with various embodiments of the present invention.

Referring next to FIG. 28, a column filter circuit 212 will be discussed in accordance with various embodiments of the present invention. The column filter circuit 212 includes a column self-capacitance digital filtering module 243 and a column mutual capacitance digital filtering module 245, each of which includes an input coupled to receive a digital column adjust signal 238. Column self-capacitance digital filtering module 243 and column mutual capacitance digital filtering module 245 each include four outputs coupled to column data processing module 249. Each of the eight outputs corresponds to one of the eight reference circuits shown in FIG. 24. Because each of the reference circuits provides a power signal having an oscillating component of a particular frequency to a particular row or column electrode, self-capacitances attributable to individual row electrodes, and mutual capacitances attributable to nodes formed between combinations of row and column electrodes, can be isolated and extracted from the digital column adjust signal 238.

The following description is uses touch sensing circuit 180 (FIG. 24) as an example, but implementations including more, or fewer column or row electrodes are contemplated. Furthermore, electrode arrangements other than a simple grid arrangement can also be used. In various embodiments, the signal output by each bandpass filter represents a filtered capacitance value. For example, a touch in touch area 202 changes the self-capacitance of column sense electrode 542. As discussed previously with respect to FIG. 24, that change in capacitance causes a change in an oscillating component of a power signal having frequency f2, and that change causes an oscillating component indicative of the change in capacitance to be included in column adjust signal 139c. The oscillating component indicative of the change in capacitance is also present in digital column adjust signal 238, as shown in FIG. 26. The oscillating component indicative of the change in capacitance is filtered by column self-capacitance digital filtering module 243, and more specifically by bandpass filter 273 Thus, filtered digital data is referred to as a "filtered capacitance value," because the filtered digital data indicates, for example, a capacitance or a change in capacitance.

Column self-capacitance digital filtering module 243 includes bandpass filter 271 tuned to the frequency f1 associated with column electrode 541, bandpass filter 273 tuned to the frequency f2 associated with column electrode 542, bandpass filter 275 tuned to the frequency f3 associated with column electrode 543, and bandpass filter 277 tuned to the frequency f4 associated with column electrode 544. The output of each of the bandpass filters 271, 273, 275, and 277 represents a self-capacitance associated with a particular column electrode, and is provided to column data processing module 249 for processing and analysis.

Column mutual capacitance digital filtering module 245 includes bandpass filter 272 tuned to the frequency f5 associated with row electrode 545, bandpass filter 274 tuned to the frequency f6 associated with row electrode 546, bandpass filter 276 tuned to the frequency f7 associated with row electrode 547, and bandpass filter 278 tuned to the frequency f8 associated with row electrode 548. The output of each of the bandpass filters 272, 274, 276, and 278 represents an aggregate mutual capacitance associated with a single row electrode. For example, the output of bandpass filter 274, which is tuned to frequency f6, is associated with row sense electrode 542. But the output of bandpass filter 274 includes mutual capacitance signals (if any) attributable to all of the column sense electrodes. Thus, the change in mutual capacitance involving any particular row electrode is not apportioned individually to each of the column electrodes. Each of the outputs from the various bandpass filters is provided to column data processing module 249 for processing and analysis.

The bandpass filters can be implemented as cascaded integrated comb (CIC) filters, finite impulse response (FIR) filters, infinite impulse response (IIR) filters, Butterworth filters, Chebyshev filters, elliptic filters, or the like. In various embodiments, the frequency response of one or more of the bandpass filters can be programmed to account for environmental variables, e.g., temperature fluctuations; electrode characteristics; signal frequencies, or the like.

Column data processing module 249 operates in the same manner as row data processing module 247, discussed above with reference to FIG. 27.

Figure 29A:
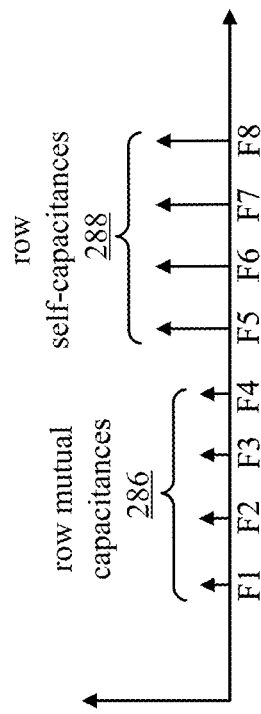
FIG. 29A is a diagram illustrating frequency amplitudes of oscillating components associated with self and mutual capacitances of row electrodes, in accordance with various embodiments of the present invention.

Referring next to FIG. 29A, a diagram illustrating frequency amplitudes of oscillating components associated with self and mutual capacitances of row electrodes will be discussed in accordance with various embodiments of the present invention. With reference to FIG. 27, note that the row self-capacitances 28 are associated with frequencies f5, f6, f7, and f8, and row mutual capacitances 286 are associated with frequencies f1, f2, f3, and f4.

Figure 29B:
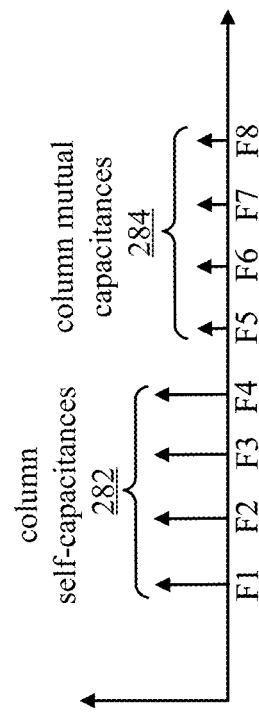
FIG. 29B is a diagram illustrating frequency amplitudes of oscillating components associated with self and mutual capacitances of column electrodes, in accordance with various embodiments of the present invention.

FIG. 29B, a diagram illustrating frequency amplitudes of oscillating components associated with self and mutual capacitances of column electrodes, in accordance with various embodiments of the present invention. With reference to FIG. 28, note that the column self-capacitances 28 are associated with frequencies f1, f2, f3, and f4, and column mutual capacitances 286 are associated with frequencies f5, f6, f7, and f8. Note that in the illustrated embodiments, the frequencies associated with self and mutual capacitances from the perspective of the column electrodes are reversed from the frequencies associated with self and mutual capacitances as viewed from the perspective of the row electrodes.

Referring next to FIG. 30, is a method of processing adjust signals to determine touch information will be discussed in accordance with various embodiments of the present invention. As illustrated by block 281 a row adjust signal is received, for example by a row data processing module 247. The row adjust signal having been generated by a row comparison circuit coupled to a plurality of row electrodes via a common row sense node. The row adjust signal includes oscillating components associated with row self-capacitances and row mutual capacitances.

The term "row self-capacitances" refers to self-capacitances associated with row electrodes included in a touch display. The term "row mutual capacitances" refers to mutual capacitances, from the perspective of the row electrodes, formed between row electrodes and column electrodes. In general, a mutual capacitance from the perspective of the row electrode will cause an oscillating component associated with a column electrode to be included in the row adjust signal. By contrast, the very same mutual capacitance from the perspective of the column electrode will cause an oscillating component associated with the row electrode to be included in the column adjust signal.

As illustrated by block 283, a column adjust signal is received, for example by a column data processing module 249. The column adjust signal having been generated by a column comparison circuit coupled to a plurality of column electrodes via a common column sense node. The column adjust signal includes oscillating components associated with column self-capacitances and column mutual capacitances. The term "column self-capacitances" refers to self-capacitances associated with column electrodes included in a touch display. The term "column mutual capacitances" refers to mutual capacitances, from the perspective of the column electrodes, formed between column electrodes and row electrodes.

As illustrated by block 285, the row adjust signal and the column adjust signal are filtered to identify changes in mutual capacitances and self-capacitances associated with specific row electrodes and column electrodes. In at least one embodiment, filtering the row and column adjust signals will yield sixteen separate signals associated with the row and column electrodes. For example, based on the example illustrated in FIG. 24, which includes 4 row electrodes and 4 column electrodes, filtering the row adjust signal yields eight different signals. Four of those signals correspond to row self-capacitances, and four correspond to mutual capacitances between the row electrodes in the aggregate and each individual column electrode. Filtering the column adjust signal also yields eight different signals: four corresponding to column self-capacitances, and four corresponding to mutual capacitances between the column electrodes in the aggregate and individual row electrodes.

Characteristics of the sixteen signals (eight from filtering the row adjust signal and eight from filtering the column adjust signal) correspond to capacitances associated with the self-capacitances and mutual capacitances of the eight electrodes. Referring briefly to FIGS. 29a and 29b, for a grounded touch, the self-capacitance of an electrode increases when a touch is present, but mutual capacitances associated with that electrode decrease. For ungrounded touch, the self-capacitance of an electrode stays the same, while mutual capacitances associated with that electrode decrease. Thus, the variation in signal amplitudes correspond to variations in self-capacitances and mutual capacitances.

As illustrated by block 287, touch information 257 is determined, for example, by touch data processing module 251 based on the changes in the mutual capacitances and the self-capacitances associated with particular row electrodes and column electrodes. For example, assuming a grounded touch in FIG. 24, the amplitude of frequency f2 present in the column adjust signal 139c will increase, while the amplitudes of frequencies f6 and f7 present in the column adjust signal 139c will decrease. The same grounded touch will cause the amplitude of frequency f2 present in the row adjust signal 139r to decrease, while the amplitudes of frequencies f6 and f7 present in the row adjust signal 139r will increase. These variations can be correlated with known row and column electrode positions within the touchscreen to determine the location of a touch.

Referring next to FIG. 31, a method of processing adjust signals by filtering different frequency components contributed by self and mutual capacitances of row and column electrodes will be discussed in accordance with various embodiments of the present invention.

As illustrated by block 289, a row adjust signal is digitized, for example by a row analog-to-digital converter 237r (FIG. 26). The row adjust signal includes first frequency components (e.g., row frequencies indicating self-capacitances), and second frequency components (e.g., column frequencies indicating mutual capacitances from the perspective of the row electrodes).

As illustrated by block 291, row data is generated, e.g., using row filter circuit 210 (FIG. 27), by filtering the digitized row adjust signal to extract individual first frequency components and individual second frequency components. In at least one embodiment, row data includes filtered row self-capacitance data 320 and filtered row mutual capacitance data 330. As illustrated by block 293, row touch information is generated, e.g., using row data processing module 247 (FIG. 27), based on the row data.

As illustrated by block 295, a column adjust signal is digitized, for example by a column analog-to-digital converter 237c (FIG. 26). The column adjust signal includes second frequency components (e.g., column frequencies indicating self-capacitances), and first frequency components (e.g., row frequencies indicating mutual capacitances from the perspective of the column electrodes).

As illustrated by block 297, column data is generated, e.g., using column filter circuit 212 (FIG. 28), by filtering the digitized column adjust signal to extract individual first frequency components and individual second frequency components. In at least one embodiment, column data includes filtered column self-capacitance data 340 and filtered column mutual capacitance data 350. As illustrated by block 299, column touch information is generated, e.g., using column data processing module 249 (FIG. 28), based on the column data.

As illustrated by block 301, touch information is generated, e.g., using touch data processing module 251 (FIG. 26), based on the row touch information and the column touch information. The touch information indicates a touch location identifying a location on a touch screen that is being touched.

In at least one embodiment, a method comprises receiving a row adjust signal generated by a row comparison circuit coupled to a plurality of row electrodes via a common row sense node, wherein the plurality of row electrodes are driven by a first plurality of reference circuits providing a first plurality of drive signals having first oscillating drive-components, and wherein a row sense signal is present at the common row sense node. The method also includes receiving a column adjust signal generated by a column comparison circuit coupled to a plurality of column electrodes via a common column sense node, wherein the plurality of column electrodes are driven by a second plurality of reference circuits providing a second plurality of drive signals having second oscillating drive-components, and wherein a column sense signal is present at the common column sense node. The plurality of row electrodes and a plurality of column electrodes are each associated with a self-capacitance, and are arranged in an overlapping pattern to establish mutual capacitances between overlapping row and column electrodes. Furthermore, both the row sense signal and the column sense signal include the first oscillating drive-components and the second oscillating drive components, the first oscillating drive-components represent row self-capacitances in the row sense signal and mutual capacitances in the column sense signal, and the second oscillating drive-components represent column self-capacitances in the column sense signal and mutual capacitances in the row sense signal. The method further includes generating row adjust signals based on the row sense signal, generating column adjust signals based on the column sense signal, filtering the row adjust signals and the column adjust signals to identify changes in mutual capacitances and self-capacitances associated with specific row electrodes and column electrodes, and determining touch information based on the changes in mutual capacitances and self-capacitances associated with specific row electrodes and column electrodes.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to."

As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably," indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c," with more or less elements than "a," "b," and "c." In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b," "a" and "c," "b" and "c," and/or "a," "b," and "c."

As may also be used herein, the terms "processing module," "processing circuit," "processor," "processing circuitry," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or may further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules, and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above-described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

One or more functions associated with the methods and/or processes described herein can be implemented as a large-scale system that is operable to receive, transmit and/or process data on a large-scale. As used herein, a large-scale refers to a large number of data, such as one or more kilobytes, megabytes, gigabytes, terabytes or more of data that are received, transmitted and/or processed. Such receiving, transmitting and/or processing of data cannot practically be performed by the human mind on a large-scale within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can require data to be manipulated in different ways within overlapping time spans. The human mind is not equipped to perform such different data manipulations independently, contemporaneously, in parallel, and/or on a coordinated basis within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can be implemented in a system that is operable to electronically receive digital data via a wired or wireless communication network and/or to electronically transmit digital data via a wired or wireless communication network. Such receiving and transmitting cannot practically be performed by the human mind because the human mind is not equipped to electronically transmit or receive digital data, let alone to transmit and receive digital data via a wired or wireless communication network.

One or more functions associated with the methods and/or processes described herein can be implemented in a system that is operable to electronically store digital data in a memory device. Such storage cannot practically be performed by the human mind because the human mind is not equipped to electronically store digital data.

One or more functions associated with the methods and/or processes described herein may operate to cause an action by a processing module directly in response to a triggering event—without any intervening human interaction between the triggering event and the action. Any such actions may be identified as being performed "automatically," "automatically based on" and/or "automatically in response to" such a triggering event. Furthermore, any such actions identified in such a fashion specifically preclude the operation of human activity with respect to these actions—even if the triggering event itself may be causally connected to a human activity of some kind.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A load-sensing circuit comprising:
 a load coupled to a load source having a load voltage that causes a load signal to flow through the load;
 a regulated sink circuit coupled to a sink source providing a sink voltage, wherein the regulated sink circuit is coupled in series with the load, and is configured to regulate, based on a regulation signal, a first electrical characteristic of the load signal;
 a comparison circuit including:
  a reference input configured to receive a reference signal that establishes a reference value of a second electrical characteristic, wherein the reference signal includes one or more oscillating components;
  a sense input coupled to the load and to the regulated sink circuit, wherein the regulated sink circuit regulates the first electrical characteristic of the load signal so that a sense value of the second electrical characteristic present at the sense input matches the reference value of the second electrical characteristic;
  a comparison output configured to generate a comparison signal indicating a difference between the sense value of the second electrical characteristic and the reference value of the second electrical characteristic;
 a feedback circuit coupled to the comparison output and to the regulated sink circuit, the feedback circuit configured to generate the regulation signal based on the comparison signal; and
 an analog to digital converter configured to convert the comparison signal into a digital signal.

2. The load-sensing circuit of claim 1, wherein:
the load voltage is more positive than the sink voltage.

3. The load-sensing circuit of claim 2, wherein:
the absolute value of the sink voltage is greater than the absolute value of the load voltage.

4. The load-sensing circuit of claim 1, wherein:
the reference signal includes a voltage reference; and
the regulated sink circuit includes a regulated current source that provides a varying current in response to differences between the voltage reference and a voltage present at the sense input.

5. The load-sensing circuit of claim 1, wherein:
the reference signal includes a current reference; and
the regulated sink circuit includes a regulated voltage source that provides a varying voltage in response to differences between the current reference and a current present at the sense input.

6. The load-sensing circuit of claim 1, further comprising:
a digital filter configured to filter the digital signal to generate sensed data.

7. The load-sensing circuit of claim 6, further comprising:
a processing module configured to determine the load characteristic based on the sensed data.

8. A method comprising:
applying a load voltage to a load to produce a load signal that flows through the load to a regulated sink circuit coupled to a sink voltage, wherein the load signal has a first electrical characteristic and a second electrical characteristic, and wherein the load has a load characteristic;
applying the load signal to a sense input of a comparison circuit, wherein the load signal establishes a sense value of the second electrical characteristic;
applying a reference signal to a reference input of the comparison circuit, wherein the reference signal includes one or more oscillating components and establishes a reference value of the second electrical characteristic;
generating a comparison signal indicating a difference between the sense value of the second electrical characteristic and the reference value of the second electrical characteristic;
regulating a value of the first electrical characteristic of the load signal using the regulated sink circuit to vary the value of the first electrical characteristic so that the sense value of the second electrical characteristic matches the reference value of the second electrical characteristic;
converting the comparison signal to a digital signal; and
sensing changes in the load characteristic based on the digital signal.

9. The method of claim 8, wherein:
the load voltage is more positive than the sink voltage.

10. The method of claim 9, wherein:
the absolute value of the sink voltage is greater than the absolute value of the load voltage.

11. The method of claim 8, wherein:
the first electrical characteristic is current, and the second electrical characteristic is voltage; and
the method further includes regulating a current of the load signal based on differences between a sense value of the voltage and a reference value of the voltage.

12. The method of claim 8, wherein:
the first electrical characteristic is voltage, and the second electrical characteristic is current; and:
the method further includes regulating a voltage of the load signal based on differences between a sense value of the current and a reference value of the current.

13. The method of claim 8, further comprising:
filtering the digital signal to generate sensed data.

14. The method of claim 13, further comprising:
determining the load characteristic based on the sensed data.

15. A load-sensing circuit comprising:
an external load connection configured to receive a load signal when coupled to an external load, the load signal generated by applying a drive signal having a load voltage to the external load, and wherein the load signal has a first electrical characteristic and a second electrical characteristic;
a comparison circuit including:
a sense input coupled to the external load connection, wherein the load signal establishes a sense value of the second electrical characteristic;
a reference input coupled to a reference signal circuit wherein the reference signal circuit establishes a reference value of the second electrical characteristic, the reference value including one or more oscillating components; and
a comparison output configured to generate a comparison signal indicating a difference between the sense value of the second electrical characteristic and the reference value of the second electrical characteristic;
a feedback circuit coupled to the comparison output, and configured to generate a regulation signal based on the comparison signal;
an analog to digital converter configured to convert the comparison signal to a digital comparison signal; and
a regulated sink circuit including;
an external sink output configured to be connected to a sink voltage;
a load signal input coupled to the external load connection and to the sense input of the comparison circuit; and
a regulation input configured to receive the regulation signal, wherein the regulated sink circuit is configured to regulate the first electrical characteristic of the load signal, based on the regulation signal, so that the sense value of the second electrical characteristic matches the reference value of the second electrical characteristic.

16. The load-sensing circuit of claim 15, wherein:
the reference value includes a voltage reference; and
the regulated sink circuit includes a regulated current source that provides a varying current in response to differences between the voltage reference and a voltage present at the sense input.

17. The load-sensing circuit of claim 15, wherein:
the reference value includes a current reference; and
the regulated sink circuit includes a regulated voltage source that provides a varying voltage in response to differences between the current reference and a current present at the sense input.

18. The load-sensing circuit of claim 15, further comprising:
a digital filter configured to filter the digital comparison signal to generate sensed data.

19. The load-sensing circuit of claim 18, further comprising:
- a processing module configured to determine a change in a characteristic of an external load coupled to the load-sensing circuit based on the sensed data.

20. The load-sensing circuit of claim 19, wherein the processing module is further configured to:
- determine one or more frequency characteristics of the external load coupled to the load-sensing circuit based on the sensed data.

* * * * *